United States Patent
Nakashima et al.

(10) Patent No.: US 9,142,783 B2
(45) Date of Patent: Sep. 22, 2015

(54) LIGHT EMITTING ELEMENT AND LIGHT EMITTING DEVICE

(75) Inventors: Harue Nakashima, Atsugi (JP); Sachiko Kawakami, Isehara (JP); Daisuke Kumaki, Tokamachi (JP); Satoshi Seo, Kawasaki (JP); Hisao Ikeda, Atsugi (JP); Junichiro Sakata, Atsugi (JP); Yuji Iwaki, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1599 days.

(21) Appl. No.: 10/584,308

(22) PCT Filed: Nov. 28, 2005

(86) PCT No.: PCT/JP2005/022240
§ 371 (c)(1),
(2), (4) Date: Jun. 23, 2006

(87) PCT Pub. No.: WO2006/059745
PCT Pub. Date: Jun. 8, 2006

(65) Prior Publication Data
US 2009/0058267 A1 Mar. 5, 2009

(30) Foreign Application Priority Data

Nov. 30, 2004 (JP) ................................ 2004-347518
Mar. 23, 2005 (JP) ................................ 2005-084566

(51) Int. Cl.
*H01J 1/63* (2006.01)
*H01L 51/00* (2006.01)
(Continued)

(52) U.S. Cl.
CPC .......... *H01L 51/0059* (2013.01); *H01L 51/006* (2013.01); *H01L 51/0061* (2013.01);
(Continued)

(58) Field of Classification Search
USPC .............. 428/690, 917, 411.1, 336; 313/502–509; 257/40, 88, 104, E51; 532/1; 540/1
See application file for complete search history.

(56) References Cited

U.S. PATENT DOCUMENTS 5,508,136 A   4/1996   Shirota et al.
5,989,737 A   11/1999  Xie et al.
(Continued)

FOREIGN PATENT DOCUMENTS

EP   0611148 A   8/1994
EP   0 855 848   7/1998
(Continued)

OTHER PUBLICATIONS

Machine English translation JP 1998-310574 A. Translated Feb. 12, 2009.*
(Continued)

*Primary Examiner* — Angela Ortiz
*Assistant Examiner* — J. L. Yang
(74) *Attorney, Agent, or Firm* — Eric J. Robinson; Robinson Intellectual Property Law Office, P.C.

(57) ABSTRACT

One object of the present invention is to provide a light emitting element that includes an organic compound and an inorganic compound and has low driving voltage. The light emitting element of the invention includes a plurality of layers between a pair of electrodes, wherein the plurality of layers includes a layer that contains a carbazole derivative represented by a general formula (1) and an inorganic compound exhibiting an electron accepting property with respect to the carbazole derivative. By utilizing this structure, electrons are transported between the carbazole derivative and the inorganic compound and carriers are internally generated, and hence, the driving voltage of the light emitting element can be reduced.

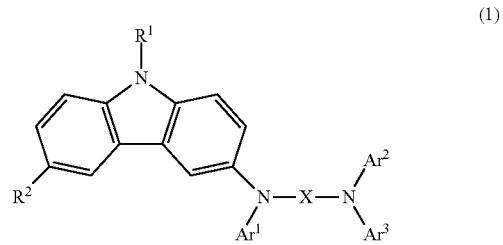

(1)

21 Claims, 33 Drawing Sheets

(51) Int. Cl.
*H01L 51/50* (2006.01)
*H01L 27/32* (2006.01)
*H01L 51/52* (2006.01)

(52) U.S. Cl.
CPC ........ *H01L51/0072* (2013.01); *H01L 51/5052* (2013.01); *H01L 27/3244* (2013.01); *H01L 51/0067* (2013.01); *H01L 51/0068* (2013.01); *H01L 51/0069* (2013.01); *H01L 51/5206* (2013.01); *H01L 2251/5315* (2013.01); *H01L 2251/5323* (2013.01)

(56) References Cited

U.S. PATENT DOCUMENTS

| | | | |
|---|---|---|---|
| 6,013,384 | A | 1/2000 | Kido et al. |
| 6,423,429 | B2 | 7/2002 | Kido et al. |
| 6,486,601 | B1 | 11/2002 | Sakai et al. |
| 6,541,129 | B1* | 4/2003 | Kawamura et al. ........... 428/690 |
| 6,589,673 | B1 | 7/2003 | Kido et al. |
| 6,602,619 | B2 | 8/2003 | Lin et al. |
| 7,158,161 | B2 | 1/2007 | Gyoutoku et al. |
| 7,431,997 | B2 | 10/2008 | Hwang et al. |
| 7,737,627 | B2 | 6/2010 | Hwang et al. |
| 7,901,791 | B2 | 3/2011 | Nakashima et al. |
| 8,021,764 | B2 | 9/2011 | Hwang et al. |
| 8,021,765 | B2 | 9/2011 | Hwang et al. |
| 2001/0022497 | A1* | 9/2001 | Aoki et al. ..................... 313/507 |
| 2003/0129448 | A1 | 7/2003 | Lin et al. |
| 2003/0143430 | A1 | 7/2003 | Kawamura et al. |
| 2003/0189401 | A1 | 10/2003 | Kido et al. |
| 2004/0185299 | A1* | 9/2004 | Ly .................................. 428/690 |
| 2004/0263069 | A1 | 12/2004 | Yamazaki et al. |
| 2005/0067951 | A1* | 3/2005 | Richter et al. ................. 313/504 |
| 2005/0084712 | A1 | 4/2005 | Kido et al. |
| 2005/0084713 | A1 | 4/2005 | Kido et al. |
| 2005/0098207 | A1* | 5/2005 | Matsumoto et al. ........... 136/263 |
| 2005/0106419 | A1 | 5/2005 | Endoh et al. |
| 2005/0170208 | A1 | 8/2005 | Yatsunami et al. |
| 2005/0221124 | A1 | 10/2005 | Hwang et al. |
| 2005/0225235 | A1 | 10/2005 | Kim et al. |
| 2006/0008740 | A1 | 1/2006 | Kido et al. |
| 2006/0073357 | A1 | 4/2006 | Brunner et al. |
| 2006/0082294 | A1 | 4/2006 | Kawamura et al. |
| 2006/0115680 | A1 | 6/2006 | Hwang et al. |
| 2007/0037011 | A1 | 2/2007 | Nakashima et al. |
| 2007/0231503 | A1 | 10/2007 | Hwang et al. |
| 2007/0249867 | A1 | 10/2007 | Nakashima et al. |
| 2008/0254318 | A1 | 10/2008 | Nakashima et al. |
| 2008/0284328 | A1 | 11/2008 | Nakashima et al. |
| 2011/0147730 | A1 | 6/2011 | Nakashima et al. |

FOREIGN PATENT DOCUMENTS

| | | | |
|---|---|---|---|
| EP | 0 948 063 | | 10/1999 |
| EP | 1029909 | A | 8/2000 |
| EP | 1 089 361 | | 4/2001 |
| EP | 1 351 558 | | 10/2003 |
| EP | 1 524 706 | | 4/2005 |
| EP | 1 530 245 | | 5/2005 |
| EP | 1661888 | A | 5/2006 |
| EP | 1862524 | A | 12/2007 |
| JP | 62-280850 | A | 12/1987 |
| JP | 63-027525 | A | 2/1988 |
| JP | 02-288092 | | 11/1990 |
| JP | 03-274695 | | 12/1991 |
| JP | 06-089040 | | 3/1994 |
| JP | 06-312979 | | 11/1994 |
| JP | 06-346049 | | 12/1994 |
| JP | 07-097355 | A | 4/1995 |
| JP | 09-063771 | | 3/1997 |
| JP | 09-301934 | A | 11/1997 |
| JP | 10-270172 | | 10/1998 |
| JP | 10310574 | A * | 10/1998 ..................... 209/88 |
| JP | 1998-310574 | A * | 11/1998 |
| JP | 11-251067 | | 9/1999 |
| JP | 11-288783 | | 10/1999 |
| JP | 11-307259 | | 11/1999 |
| JP | 11-307264 | | 11/1999 |
| JP | 2000-56491 | A * | 2/2000 |
| JP | 2000056491 | A * | 2/2000 .......................... 5/6 |
| JP | 2000-306669 | | 11/2000 |
| JP | 2000-309566 | A | 11/2000 |
| JP | 2001-102175 | | 4/2001 |
| JP | 3210481 | | 7/2001 |
| JP | 2002-037817 | | 2/2002 |
| JP | 2002-047271 | | 2/2002 |
| JP | 2002-124389 | | 4/2002 |
| JP | 2003-272860 | | 9/2003 |
| JP | 2004-018787 | | 1/2004 |
| JP | 2004-026732 | | 1/2004 |
| JP | 2004-091334 | A | 3/2004 |
| JP | 2004-323509 | | 11/2004 |
| JP | 2004-536134 | | 12/2004 |
| JP | 2005/026121 | | 1/2005 |
| JP | 2005/032618 | | 2/2005 |
| JP | 2005-154421 | | 6/2005 |
| JP | 2005-516059 | | 6/2005 |
| JP | 2005/251587 | | 9/2005 |
| JP | 2005-290000 | A | 10/2005 |
| JP | 2006-151979 | A | 6/2006 |
| JP | 2006-298895 | A | 11/2006 |
| JP | 2007-520470 | | 7/2007 |
| JP | 2004-026732 | | 1/2009 |
| WO | WO-03/008515 | | 1/2003 |
| WO | WO-03/064373 | | 8/2003 |
| WO | WO 2005/040117 | | 5/2005 |
| WO | WO-2005/090512 | | 9/2005 |
| WO | WO-2006/016684 | | 2/2006 |
| WO | WO-2006/033564 | | 3/2006 |
| WO | WO-2006/043647 | | 4/2006 |

OTHER PUBLICATIONS

Machine English translation JP 2000-56491 A. Translated Feb. 12, 2009.*
Nakada et al., Proceedings of the Lecture Meeting of the Union Allied with the Japan Society of Applied Physics, The 63rd Autumn Meeting, "Multi Photon Emission Organic EL Devices Using Charge-Transfer Complex as Charge Generation Layer," vol. 27a-ZL-12, pp. 1165, Sep. 24, 2002.
Zhang et al., Synthetic Metals, Carbazole-Based Hole-Transporting Materials for Electroluminescent Devices, vol. 137 , pp. 1111-1112, Jan. 1, 2003.
Grigalevicius, Synthetic Metals, 3,6(2,7), 9-Substituted Carbazoles as Electroactive Amorphous Materials for Optoelectronics, vol. 156, pp. 1-12, Jan. 1, 2006.
Search Report (Application No. PCT/JP2005/022240) dated Jan. 17, 2006.
Written Opinion (Application No. PCT/JP2005/022240) dated Jan. 17, 2006.
Tang et al., Appl. Phys. Lett. (Applied Physics Letters), Organic Electroluminescent Diodes, vol. 51, No. 12, pp. 913-915, Sep. 21, 1987.
Balionyte.A et al., "Potential hole-transport materials prepared by Ullmann coupling,", Environmental and chemical physics, 2002, vol. 24, No. 1, pp. 30-34.
Thomas.K et al., "Light-Emitting Carbazole Derivatives: Potential Electroluminescent Materials,", J. Am. Chem. Soc. (Journal of the American Chemical Society), 2001, vol. 123, No. 38, pp. 9404-9411.
Chen.T et al., "A new pyridylamine for blue light electroluminescent devices,", Tetrahedron Letters, 2001, vol, 42, pp. 7915-7917.
Hughes.G et al., "Electron-transporting materials for organic electroluminescent and electrophosphorescent devices,", Journal of Materials Chemistry, 2005, vol. 15, pp. 94-107, The Royal Society of Chemistry.
Thomas.K et al., "Green and Yellow Electroluminescent Dipolar Carbazole Derivatives: Features and Benefits of Electron-Withdrawing Segments,", Chem. Mater. (Chemistry of Materials), 2002, vol. 14, No. 9, pp. 3852-3859.

* cited by examiner

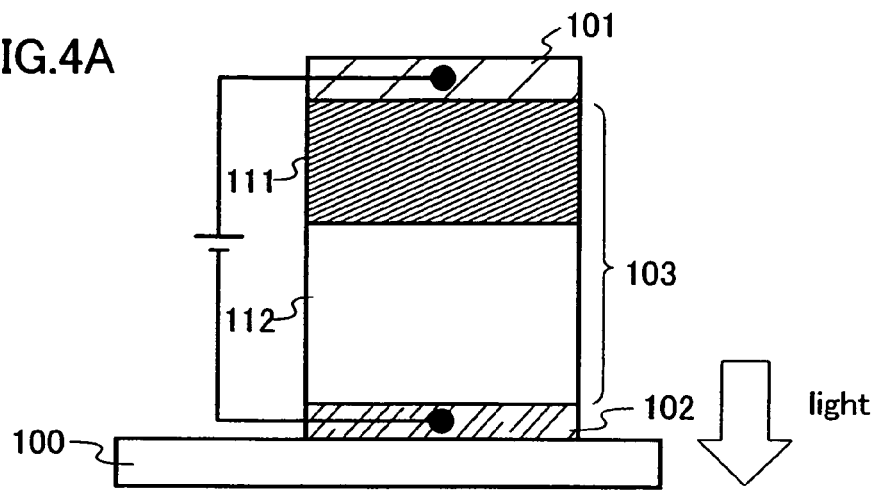
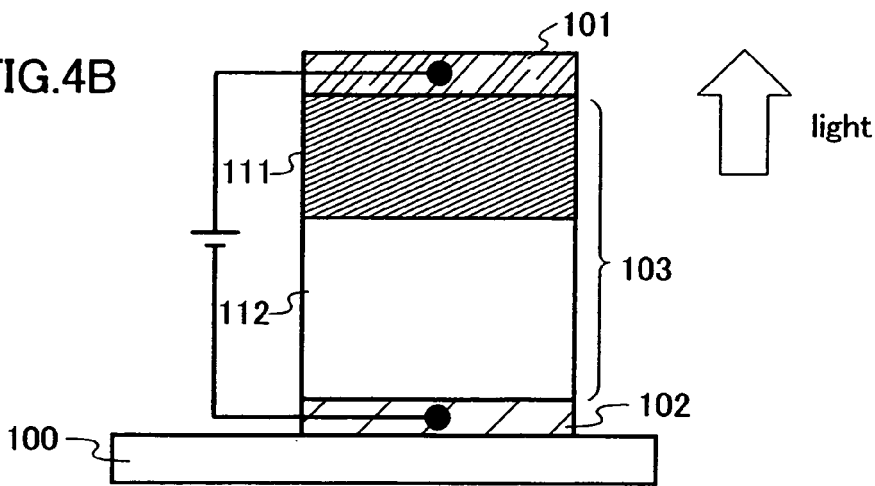
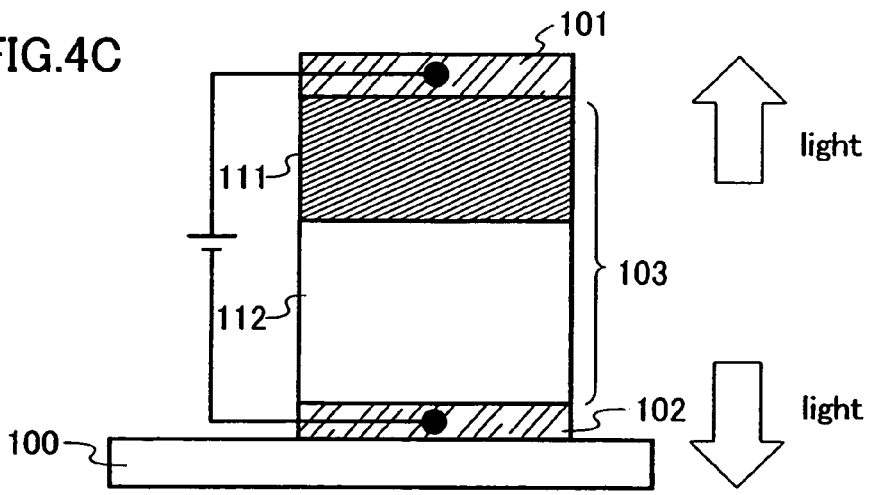

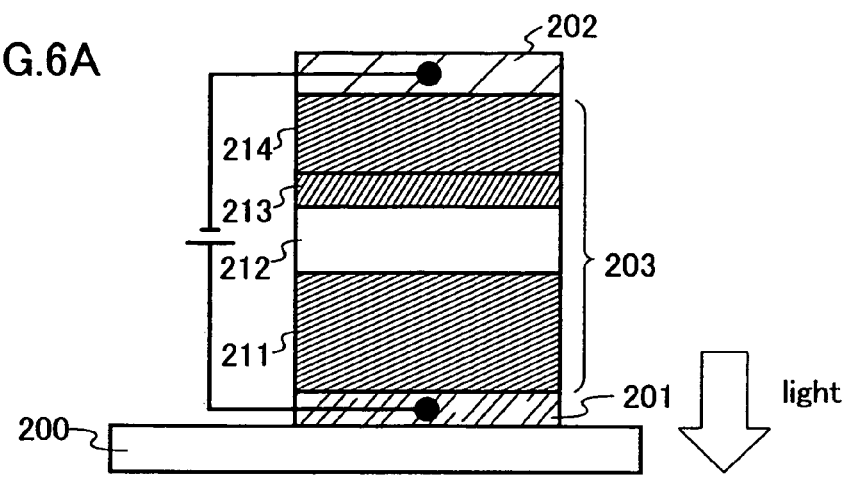
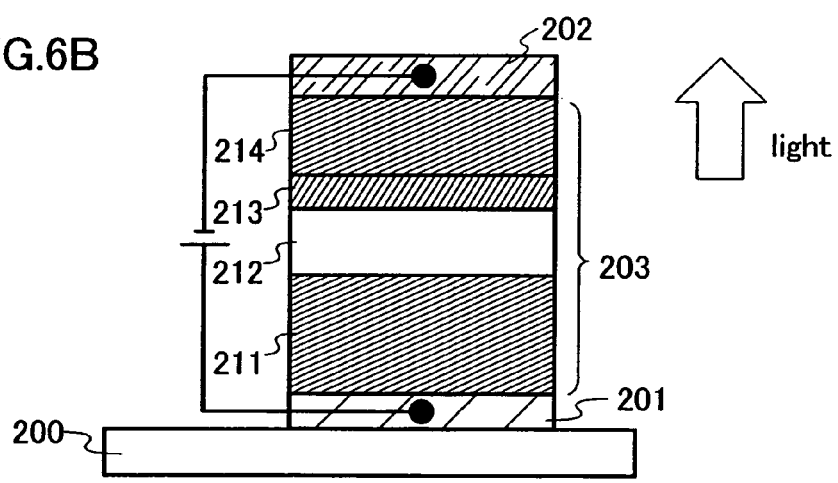
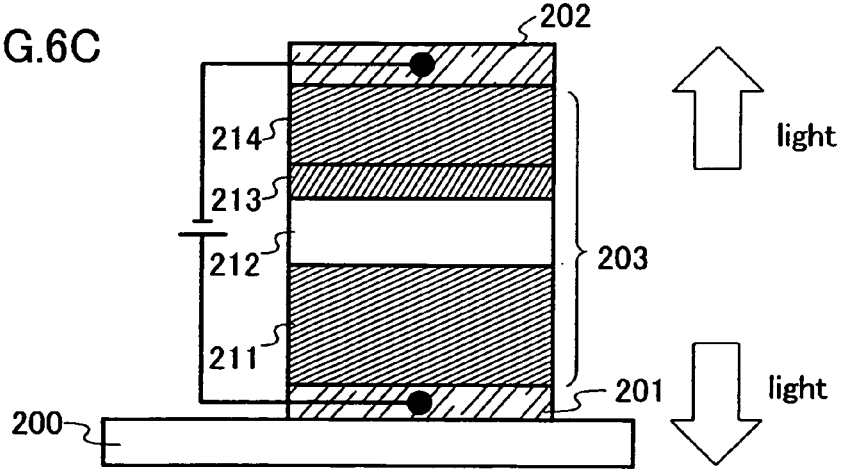

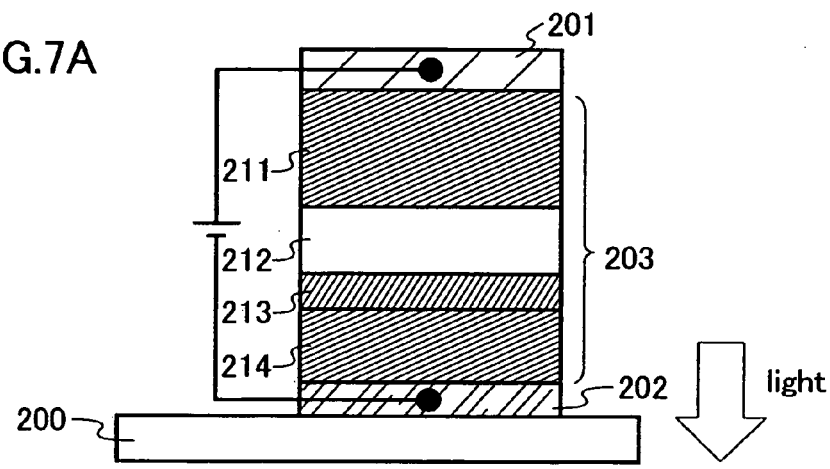
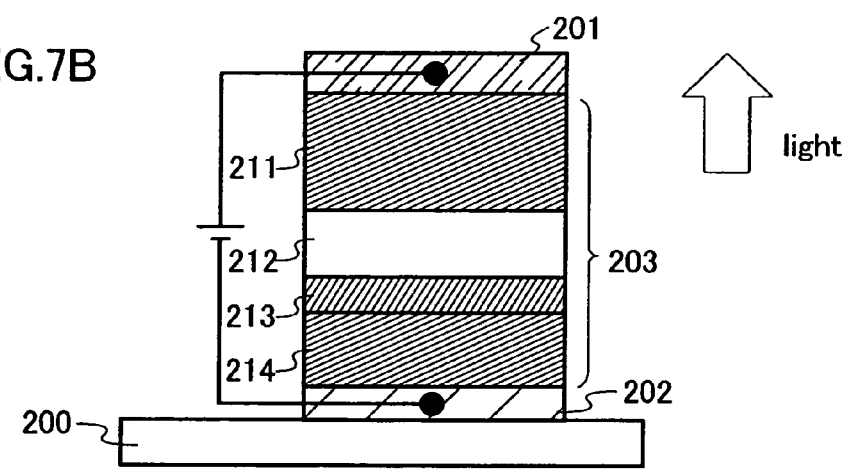
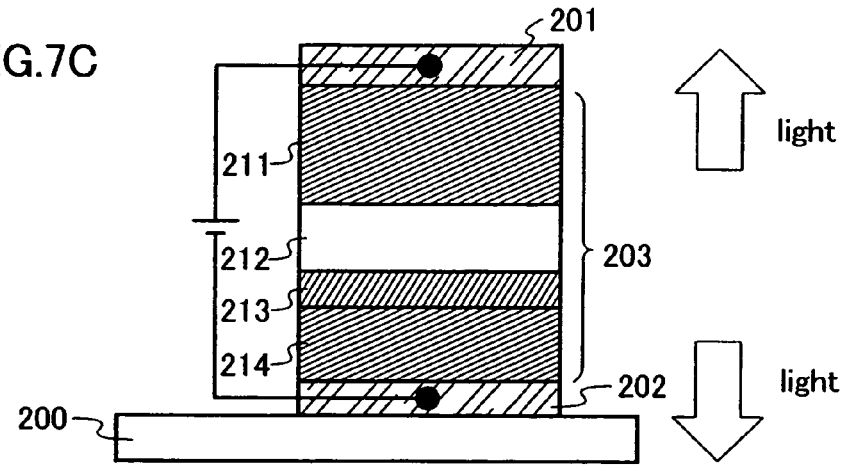

LIGHT EMITTING ELEMENT AND LIGHT EMITTING DEVICE

TECHNICAL FIELD

The present invention relates to a light emitting element having a pair of electrodes and a layer containing a light emitting substance that emits light by being applied with an electric field. Moreover, the invention relates to a light emitting device having the light emitting element.

BACKGROUND ART

A light emitting element formed using a light emitting material has characteristics such as being thin, lightweight, having high response speed and low voltage driving. Therefore, there are high expectations for its application in the next-generation flat panel displays. Moreover, it is said that a light emitting device in that light emitting elements are arranged in a matrix form has advantages of a wider viewing angle and better visibility than a conventional liquid crystal display device.

A basic structure of a light emitting element is a structure in which a layer containing an organic compound with a light emitting property (a light emitting layer) is interposed between a pair of electrodes. By applying voltage to this light emitting element, electrons and holes are respectively transported to the light emitting layer from the pair of electrodes so that a current flows through the light emitting element. Then, by recombining these carriers (i.e., the electrons and the holes), the organic compound with the light emitting property is excited. Upon returning to a ground state from the excited state, light is emitted.

As the excited state caused by an organic compound, there are a singlet excited state and a triplet excited state. Light emission generated in a singlet excited state is referred to as fluorescence and light emission generated in a triplet excited state is referred to as phosphorescence.

Such a light emitting element is generally formed to have a thickness of 1 µm or less, for example, 0.1 µm. This light emitting element has an great advantage of being thin and lightweight. Also, since the time it takes from the injection of carriers to light emission is about 1µ second or less, the light emitting element also has an advantage of having high response speed. In addition, sufficient light emission can be obtained by a direct-current voltage of only about several to several tens of volts, so the light emitting element requires relatively low power consumption. Because of these advantages, the light emitting element has been attracting attention as a next-generation flat panel display element.

Moreover, a light emitting element is formed to have a film form. Therefore, by forming a large-area light emitting element, light emission in a sheet form can be easily obtained. It is difficult to obtain this feature in the case of using a point light source typified by a filament lamp or an LED, or a line light source typified by a fluorescent lamp. Therefore, the light emitting element has a great utility value as a sheet light source that is applicable to a lighting and the like.

However, the light emitting element has problems of short-term durability and a poor heat resistance property. These problems hinder the development of the light emitting element. Typically, as disclosed in the non patent document 1, a light emitting element is generally formed by laminating a thin organic film using an organic compound. Therefore, it is thought that the short-term durability of the organic compound and the frailty of the thin organic film cause the above described problems.

On the other hand, there is an attempt to form a light emitting element by using a layer in which an organic compound and an inorganic compound are mixed, rather than a thin organic film. For example, the patent document 1 discloses a light emitting element using a light emitting layer in which fluorescent organic molecules are dispersed in metal oxide. Further, the patent document 2 discloses a light emitting element formed by laminating layers in which an organic compound (a compound with a hole transporting property, a compound with an electron transporting property, or a compound with a light emitting property) is dispersed in silica matrix via covalent bonds. In these documents, it is reported that the durability or the heat resistance property of the light emitting elements are improved.

In such light emitting elements disclosed in the patent document 1 and 2, however, the organic compound is simply dispersed in metal oxide which has an insulating property. Therefore, the light emitting elements disclosed in the patent document 1 and 2 have a problem in which it is more difficult for the current to flow through the light emitting element (i.e., the voltage required to feed a certain amount of current is increased, that is, the resistance is increased) as compared with a conventional light emitting element.

The luminance of light emission of these light emitting elements is increased in proportion to the density of current flowing through the light emitting elements, thereby causing a problem that the voltage for obtaining a certain amount of luminance (i.e., driving voltage) is increased. This results in an increase in driving voltage along with an increase in power consumption, even if long term durability and good heat resistance property are obtained by simply dispersing the organic compound in metal oxide.

To inhibit the short circuiting of a light emitting element due to a dust and the like, it is effective to increase the thickness of the light emitting element. However, when the thickness of a light emitting element disclosed in the patent document 1 or 2 is increased, the driving voltage is further increased. That is, increasing the thickness of a light emitting element having the conventional structure is practically difficult.

[Non Patent Document 1]: C. W. Tang et al., Applied Physics Letters, vol. 51, No. 12, pp. 913-915 (1987)

[Patent Document 1]: Japanese Patent Application Laid-Open No. Hei 2-288092

[Patent Document 2]: Japanese Patent Application Laid-Open No. 2000-306669

DISCLOSURE OF INVENTION

In view of the above mentioned problems, it is an object of the present invention to provide a light emitting element that contains an organic compound and an inorganic compound and has low driving voltage. It is another object of the invention to provide a light emitting element that can suppress the increase in driving voltage even when the thickness of a layer containing a light emitting substance is increased. It is another object of the invention to provide a light emitting device having such a light emitting element.

As a result of earnest examination, the present inventors found that the above mentioned problems can be solved by the application of a layer containing both an organic compound and an inorganic compound exhibiting an electron accepting property with respect to the organic compound, for a light emitting element.

That is, in an aspect of the present invention, a light emitting element has a plurality of layers between a pair of electrodes, wherein the plurality of layers include a layer that contains a carbazole derivative represented by a general formula (1) and an inorganic compound exhibiting an electron accepting property with respect to the carbazole derivative represented by the general formula (1).

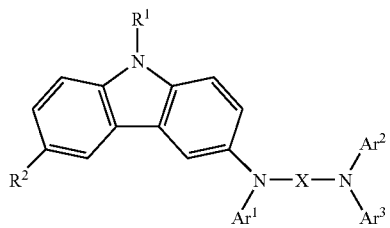

(1)

wherein $R^1$ represents any one of hydrogen, an alkyl group having 1 to 6 carbon atoms, an aryl group having 6 to 25 carbon atoms, a heteroaryl group having 5 to 9 carbon atoms, an arylalkyl group and an acyl group having 1 to 7 carbon atoms;

$R^2$ represents any one of hydrogen, an alkyl group having 1 to 6 carbon atoms and a substituent represented by a general formula (2);

$Ar^1$ to $Ar^6$ may be identical to or different from one another, and independently represent either an aryl group having 6 to 25 carbon atoms or a heteroaryl group having 5 to 9 carbon atoms; and X and Y may be identical to or different from each other, and independently represent either a bivalent aromatic hydrocarbon group having 6 to 25 carbon atoms or a bivalent heterocyclic ring group having 5 to 10 carbon atoms.

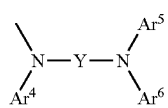

(2)

In the above structure, the inorganic compound is desirably a substance exhibiting an electron accepting property with respect to the carbazole derivative represented by the general formula (1). Concretely, the inorganic compound is oxide of transition metal, in particular, one or more kinds of titanium oxide, vanadium oxide, molybdenum oxide, tungsten oxide, rhenium oxide, ruthenium oxide, chromium oxide, zirconium oxide, hafnium oxide, tantalum oxide and silver oxide.

In another aspect of the present invention, a light emitting element has a plurality of layers between a pair of electrodes, wherein among the plurality of layers, a layer being in contact with one of the electrodes contains a carbazole derivative represented by a general formula (1) and an inorganic compound exhibiting an electron accepting property with respect to the carbazole derivative represented by the general formula (1).

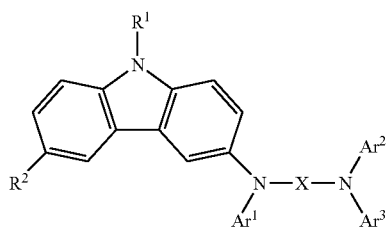

(1)

wherein $R^1$ represents any one of hydrogen, an alkyl group having 1 to 6 carbon atoms, an aryl group having 6 to 25 carbon atoms, a heteroaryl group having 5 to 9 carbon atoms, an arylalkyl group and an acyl group having 1 to 7 carbon atoms;

$R^2$ represents any one of hydrogen, an alkyl group having 1 to 6 carbon atoms and a substituent represented by a general formula (2);

$Ar^1$ to $Ar^6$ may be identical to or different from one another, and independently represent either an aryl group having 6 to 25 carbon atoms or a heteroaryl group having 5 to 9 carbon atoms; and X and Y may be identical to or different from each other, and independently represent either a bivalent aromatic hydrocarbon group having 6 to 25 carbon atoms or a bivalent heterocyclic ring group having 5 to 10 carbon atoms.

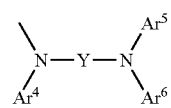

(2)

In the above structure, the inorganic compound is desirably a substance exhibiting an electron accepting property with respect to the carbazole derivative represented by the general formula (1). Concretely, the inorganic compound is oxide of transition metal, in particular, one or more kinds of titanium oxide, vanadium oxide, molybdenum oxide, tungsten oxide, rhenium oxide, ruthenium oxide, chromium oxide, zirconium oxide, hafnium oxide, tantalum oxide and silver oxide.

Also, in the above mentioned general formula (1), $R^1$ is preferably any one of a methyl group, an ethyl group, a tert-butyl group, a phenyl group, a 4-biphenyl group and a 1-naphthyl group.

In the above mentioned general formula (1), $R^2$ is preferably either hydrogen or a tert-butyl group. Alternatively, $R^2$ preferably has the structure of the general formula (2) in which $Ar^1$, $Ar^2$, $Ar^3$ and X have the same substituents as $Ar^4$, $Ar^5$, $Ar^6$ and Y, respectively.

Further, a carbazole derivative represented by a general formula (3) shown below is preferably used among the carbazole derivative represented by the general formula (1).

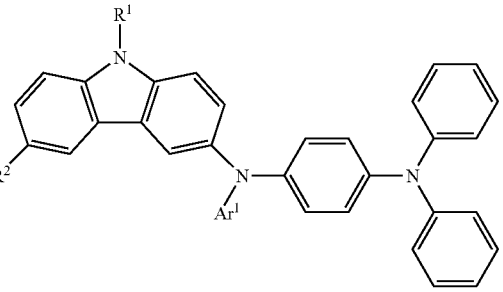

(3)

wherein $R^1$ represents any one of hydrogen, an alkyl group having 1 to 6 carbon atoms, an aryl group having 6 to 25 carbon atoms, a heteroaryl group having 5 to 9 carbon atoms, an arylalkyl group and an acyl group having 1 to 7 carbon atoms;

$R^2$ represents any of hydrogen, an alkyl group having 1 to 6 carbon atoms and a substituent represented by a general formula (4); and $Ar^1$ and $Ar^2$ may be identical to or different from each other, and independently represent either an aryl group having 6 to 25 carbon atoms or a heteroaryl group having 5 to 9 carbon atoms.

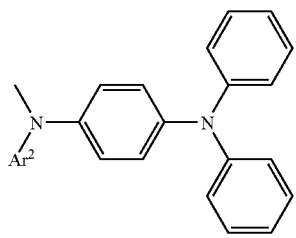
(4)

In the general formula (3), $R^1$ is preferably any one of a methyl group, an ethyl group, a tert-butyl group, a phenyl group, a 4-biphenyl group and a 1-naphthyl group.

Further, in the general formula (3), $R^2$ is preferably either hydrogen or a tert-butyl group. Alternatively, $R^2$ preferably has the structure of the general formula (4) in which $Ar^1$ and $Ar^2$ have the same substituent.

More preferably, a carbazole derivative represented by a general formula (5) is used.

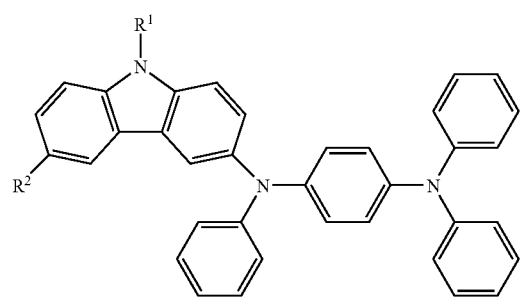
(5)

wherein $R^1$ represents any one of hydrogen, an alkyl group having 1 to 6 carbon atoms, an aryl group having 6 to 25 carbon atoms, a heteroaryl group having 5 to 9 carbon atoms, an arylalkyl group and an acyl group having 1 to 7 carbon atoms; and $R^2$ represents any one of hydrogen, an alkyl group having 1 to 6 carbon atoms and a substituent represented by a structural formula (6).

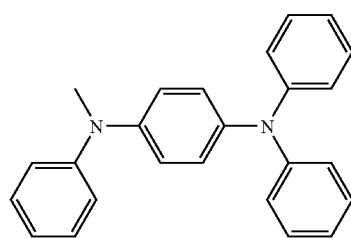
(6)

In the general formula (5), $R^1$ is preferably any one of a methyl group, an ethyl group, a tert-butyl group, a phenyl group, a 4-biphenyl group and a 1-naphthyl group.

Also, in the general formula (5), $R^2$ is preferably either hydrogen or a tert-butyl group. Alternatively, $R^2$ preferably has the structure of the general formula (6).

Furthermore, it is preferable to use a carbazole derivative having a structure represented by the following general formula (103):

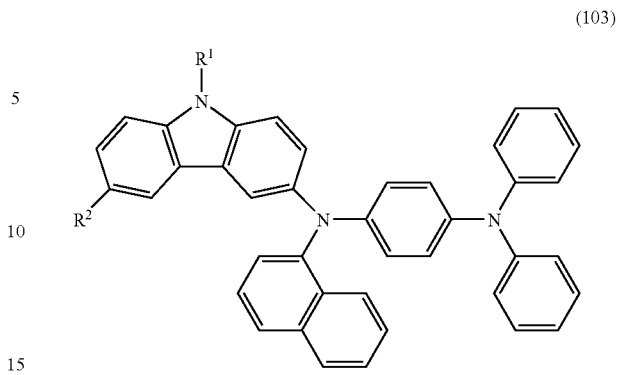
(103)

wherein $R^1$ represents any one of hydrogen, an alkyl group having 1 to 6 carbon atoms, an aryl group having 6 to 25 carbon atoms, a heteroaryl group having 5 to 9 carbon atoms, an arylalkyl group and an acyl group having 1 to 7 carbon atoms; and $R^2$ represents any one of hydrogen, an alkyl group having 1 to 6 carbon atoms and a substituent represented by a structural formula (104).

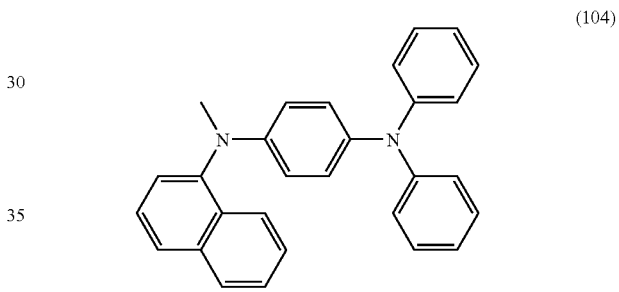
(104)

In the general formula (103), $R^1$ is preferably any one of a methyl group, an ethyl group, a tert-butyl group, a phenyl group, a 4-biphenyl group and a 1-naphthyl group.

Also, in the general formula (103), $R^2$ is preferably either hydrogen or a tert-butyl group. Alternatively, $R^2$ preferably has the structure of the structural formula (104).

Moreover, the present invention includes a light emitting device having the above described light emitting element. The light emitting device in this specification indicates an image display device, a light emitting device or a light source (including a lighting device). In addition, the light emitting device of the present invention includes a module in which a panel is attached with a connector such as an FPC (flexible printed circuit), a TAB (tape automated bonding) tape and a TCP (tape carrier package); a module in which a printed wiring board is provided on the tip of a TAB tape or a TCP; and a module in which an IC (integrated circuit) is directly mounted on a light emitting element by the COG (chip on glass) technique.

The light emitting element of the present invention has a layer that contains a carbazole derivative represented by the general formula (1) and an inorganic compound exhibiting an electron accepting property with respect to the carbazole derivative represented by the general formula (1). Therefore, electrons are transported between the carbazole derivative and the inorganic compound so that carriers are generated. Since the carriers are generated internally, the driving voltage can be reduced.

In addition, since the carriers are generated internally, the light emitting element has an excellent conducting property. Therefore, when a thickness of a layer containing a light emitting substance is increased, the increase in driving voltage can be suppressed. Consequently, the short circuiting can be prevented and the color purity can be improved by an optical design without increasing the driving voltage.

Further, in the light emitting element of the present invention, the layer containing the light emitting substance contains not only an organic compound but also an inorganic compound. Therefore, the light emitting element has an excellent heat resistance property along with long term durability.

Furthermore, by utilizing the light emitting element of the present invention, a light emitting device having less defects along with low power consumption can be provided.

BRIEF DESCRIPTION OF DRAWINGS

FIGS. 4A to 4C are diagrams explaining light emitting elements of the present invention;

FIGS. 6A to 6C are diagrams explaining light emitting elements of the present invention;

FIGS. 7A to 7C are diagrams explaining light emitting elements of the present invention;

BEST MODE FOR CARRYING OUT THE INVENTION

The embodiment modes according to the present invention will hereinafter be described in detail with reference to the drawings. It is easily understood by those skilled in the art that the embodiment modes and details herein disclosed can be modified in various ways without departing from the purpose and the scope of the invention. The present invention should not be interpreted as being limited to the description of the embodiment modes to be given below.

Further, within a pair of electrodes of a light emitting element of the present invention, one electrode serving as an anode emits light when being applied with a voltage such that a voltage of this electrode is higher than the other electrode, and the other electrode serving as a cathode emits light when being applied with a voltage such that a voltage of this electrode is lower than the other electrode serving as the anode.

[Embodiment Mode 1]

In Embodiment Mode 1, a light emitting element of the present invention will be described with reference to FIG. 1.

Figure 1:
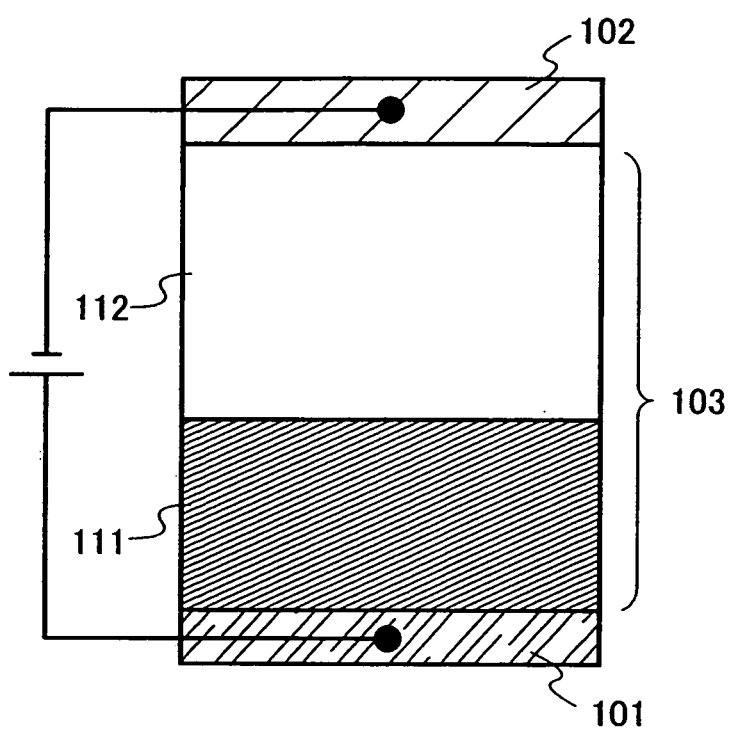
FIG. 1 is a diagram explaining a light emitting element of the present invention.

The light emitting element as shown in FIG. 1 has a structure in which a layer 103 containing a light emitting substance is interposed between a first electrode 101 and a second electrode 102. The layer 103 containing the light emitting substance includes a first layer 111 containing a carbazole derivative represented by a general formula (1) and an inorganic compound exhibiting an electron accepting property with respect to the carbazole derivative represented by the general formula (1).

The carbazole derivative represented by the general formula (1), in particular, has an excellent hole injecting property and an excellent hole transporting property. Therefore, the layer containing the carbazole derivative represented by the general formula (1) and the inorganic compound exhibiting an electron accepting property with respect to the carbazole derivative represented by the general formula (1) is preferably provided as a layer having a hole transporting property. That is, the first layer 111 containing the carbazole derivative represented by the general formula (1) and the inorganic compound exhibiting an electron accepting property with respect to the carbazole derivative represented by the general formula (1) is preferably provided to be closer to the anode than the light emitting layer. In Embodiment Mode 1, a case where the first layer 111 is provided to be in contact with the first electrode 101 serving as an anode will be described.

The first layer 111 contains the carbazole derivative represented by the general formula (1) and the inorganic compound exhibiting the electron accepting property with respect to the carbazole derivative represented by the general formula (1). Since the carbazole derivative represented by the general formula (1) has an excellent hole injecting property along with an excellent hole transporting property, the first layer 111 is preferably provided to be in contact with the first electrode 101.

The carbazole derivative contained in the first layer 111 has a structure represented by the general formula (1).

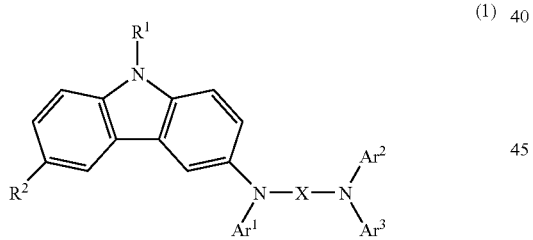

(1)

wherein $R^1$ represents any one of hydrogen, an alkyl group having 1 to 6 carbon atoms, an aryl group having 6 to 25 carbon atoms, a heteroaryl group having 5 to 9 carbon atoms, an arylalkyl group and an acyl group having 1 to 7 carbon atoms;

$R^2$ represents any one of hydrogen, an alkyl group having 1 to 6 carbon atoms and a substituent represented by a general formula (2);

$Ar^1$ to $Ar^6$ may be identical to or different from one another, and independently represent either an aryl group having 6 to 25 carbon atoms or a heteroaryl group having 5 to 9 carbon atoms; and X and Y may be identical to or different from each other, and independently represent either a bivalent aromatic hydrocarbon group having 6 to 25 carbon atoms or a bivalent heterocyclic ring group having 5 to 10 carbon atoms.

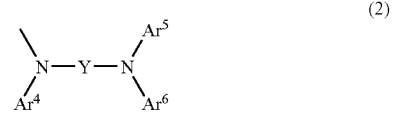

(2)

Specifically, as the alkyl group having 1 to 6 carbon atoms, a methyl group, an ethyl group, an n-propyl group, an n-butyl group, an n-hexyl group and the like can be given. Also, a branched alkyl group such as an iso-propyl group and a tert-butyl group may be used.

As the aryl group having 6 to 25 carbon atoms, specifically, a phenyl group, a 4-biphenyl group, a 1-naphthyl group, a 2-naphthyl group, a 9-antolyl group, a 9-phenanthryl group, a 1-pyrenyl group, a 9,9'-dimethyl-2-fluorenyl group, a spiro-9,9'-bifluorene-2-yl group and the like can be given. Also, an aryl group having a substituent such as an m-tolyl group, a p-tolyl group, a 2-fluorophenyl group, a 3-fluorophenyl group and a 4-fluorophenyl group may be used.

As the heteroaryl group having 5 to 9 carbon atoms, specifically, a 2-pyridyl group, a 8-quinolyl group, a 3-quinolyl group and the like can be given.

As the arylalkyl group, specifically, a benzyl group and the like can be given.

As the acyl group having 1 to 7 carbon atoms, specifically, an acetyl group, a benzoyl group, a propionyl group and the like can be given.

Further, as the bivalent aromatic hydrocarbon group having 6 to 25 carbon atoms, specifically, bivalent aromatic hydrocarbon groups represented by the following structural formulas (7) to (18) can be given.

(7)

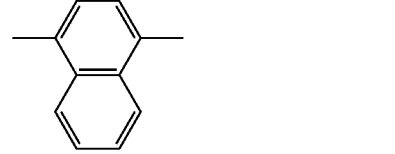

(8)

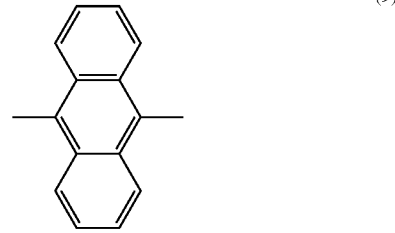

(9)

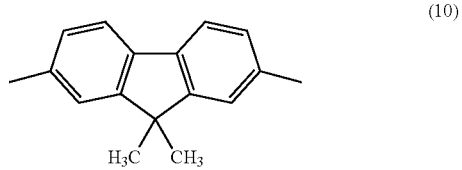

(10)

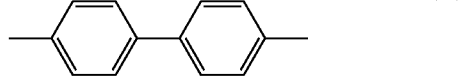

(11)

-continued

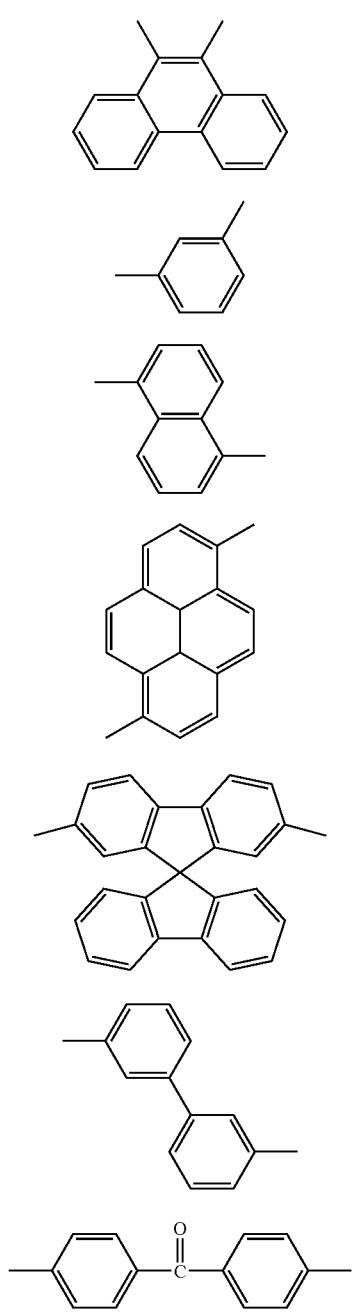

As the bivalent heterocyclic ring group having 5 to 10 carbon atoms, specifically, bivalent heterocyclic ring groups represented by the following structural formulas (19) to (24) can be given.

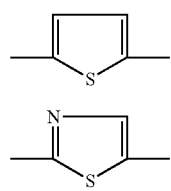

-continued

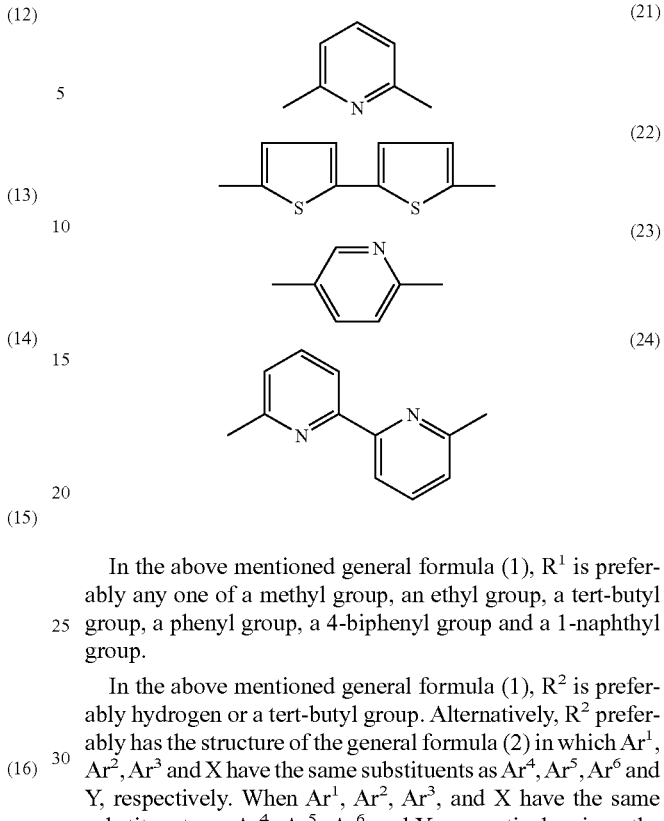

In the above mentioned general formula (1), $R^1$ is preferably any one of a methyl group, an ethyl group, a tert-butyl group, a phenyl group, a 4-biphenyl group and a 1-naphthyl group.

In the above mentioned general formula (1), $R^2$ is preferably hydrogen or a tert-butyl group. Alternatively, $R^2$ preferably has the structure of the general formula (2) in which $Ar^1$, $Ar^2$, $Ar^3$ and X have the same substituents as $Ar^4$, $Ar^5$, $Ar^6$ and Y, respectively. When $Ar^1$, $Ar^2$, $Ar^3$, and X have the same substituents as $Ar^4$, $Ar^5$, $Ar^6$ and Y, respectively, since the same substituents may be bonded to a carbazole skeleton, synthesis is performed easily.

Further, among carbazole derivatives having the structure represented by the general formula (1), a carbazole derivative having a structure represented by a general formula (3) can be easily synthesized, and therefore it is preferable.

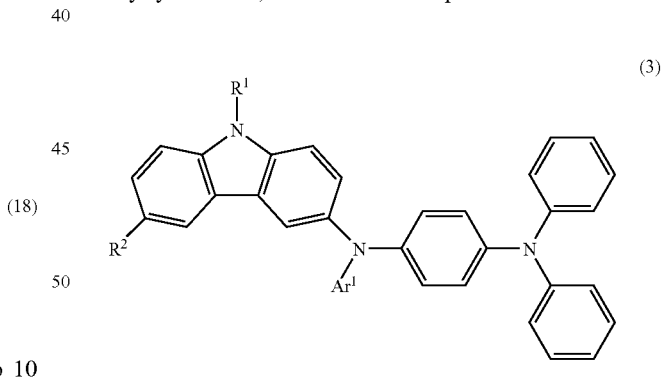

wherein $R^1$ represents any one of hydrogen, an alkyl group having 1 to 6 carbon atoms, an aryl group having 6 to 25 carbon atoms, a heteroaryl group having 5 to 9 carbon atoms, an arylalkyl group and an acyl group having 1 to 7 carbon atoms;

$R^2$ represents any one of hydrogen, an alkyl group having 1 to 6 carbon atoms and a substituent represented by a general formula (4); and $Ar^1$ and $Ar^2$ may be identical to or different from each other, and independently represent either an aryl group having 6 to 25 carbon atoms or a heteroaryl group having 5 to 9 carbon atoms.

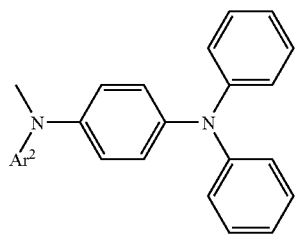
(4)

In the general formula (3), $R^1$ is preferably any one of a methyl group, an ethyl group, a tert-butyl group, a phenyl group, a 4-biphenyl group and a 1-naphthyl group.

Also, in the general formula (3), $R^2$ is preferably either hydrogen or a tert-butyl group. Alternatively, $R^2$ preferably has a structure of a general formula (4) in which $Ar^1$ and $Ar^2$ preferably have the same structure.

In particular, a carbazole derivative having a structure as represented by a general formula (5) is more preferable.

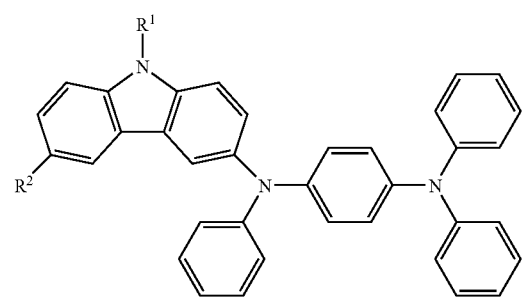
(5)

wherein $R^1$ represents any one of hydrogen, an alkyl group having 1 to 6 carbon atoms, an aryl group having 6 to 25 carbon atoms, a heteroaryl group having 5 to 9 carbon atoms, an arylalkyl group and an acyl group having 1 to 7 carbon atoms; and $R^2$ represents any one of hydrogen, an alkyl group having 1 to 6 carbon atoms and a substituent represented by a structural formula (6):

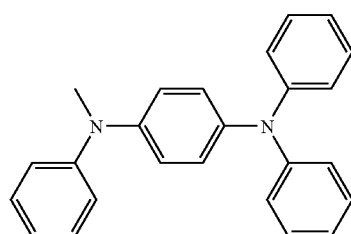
(6)

In the general formula (5), $R^t$ is preferably any one of a methyl group, an ethyl group, a tert-butyl group, a phenyl group, a 4-biphenyl group and a 1-naphthyl group.

Also, in the general formula (5), $R^2$ is preferably either hydrogen or a tert-butyl group, or $R^2$ preferably has a structure of the structural formula (6).

Moreover, it is more preferable to use a carbazole derivative having a structure as represented by the following general formula (103):

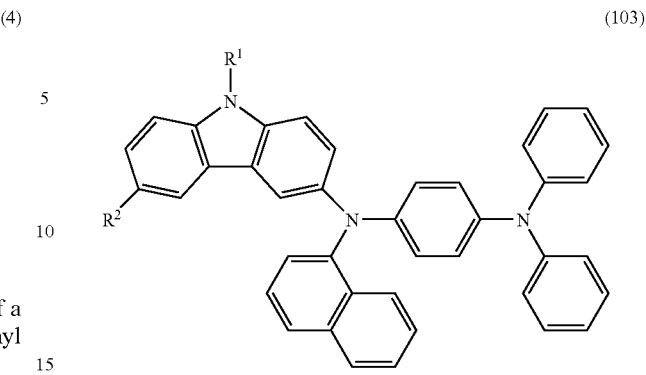
(103)

wherein $R^1$ represents any one of hydrogen, an alkyl group having 1 to 6 carbon atoms, an aryl group having 6 to 25 carbon atoms, a heteroaryl group having 5 to 9 carbon atoms, an arylalkyl group and an acyl group having 1 to 7 carbon atoms; and $R^2$ represents any one of hydrogen, an alkyl group having 1 to 6 carbon atoms and a substituent represented by a structural formula (104):

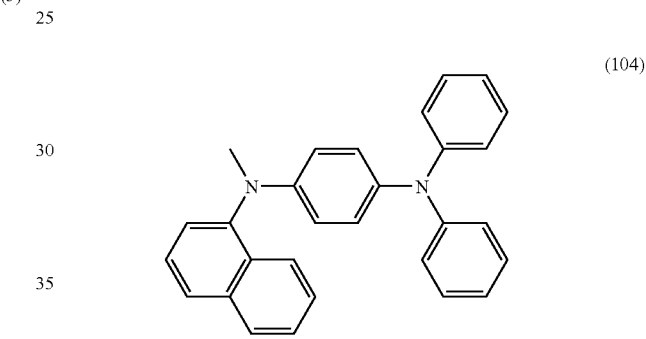
(104)

In the general formula (103), $R^1$ is preferably any one of a methyl group, an ethyl group, a tert-butyl group, a phenyl group, a 4-biphenyl group and a 1-naphthyl group.

Also, in the general formula (103), $R^2$ is preferably either hydrogen or a tert-butyl group, or, $R^2$ preferably has a structure of the structural formula (104).

As an inorganic compound included in the first layer 111, transition metal is preferably used. Specifically, titanium oxide, vanadium oxide, molybdenum oxide, tungsten oxide, rhenium oxide, ruthenium oxide, chromium oxide, zirconium oxide, hafnium oxide, tantalum oxide, silver oxide and the like can be given. Each of the transition metal oxide is a substance exhibiting an electron accepting property with respect to the carbazole derivative represented by the general formula (1) and accepts electrons from the carbazole derivative represented by the general formula (1) and generates holes. Since the carbazole derivative represented by the general formula (1) has an excellent hole transporting property, the carbazole derivative can transport the generated holes efficiently. Consequently, the driving voltage of the light emitting element can be reduced.

Further, since carriers are internally generated in the first layer 111, the first layer 111 has a high conducting property. Therefore, when the thickness of the first layer 111 is increased, the increase in driving voltage can be suppressed. As a consequence, the short-circuiting of the light emitting element can be suppressed, and the color purity can be improved by an optical design without increasing the driving voltage.

Furthermore, since the light emitting element of the present invention contains not only the organic compound but also the inorganic compound, this light emitting element has long term durability along with an excellent heat resistance property.

The second layer 112 has a light emitting function. The second layer 112 may include either a single layer or a plurality of layers. For example, the second layer 112 may be formed by freely combining various layers having various kinds of functions such as an electron injecting layer, an electron transporting layer, a hole blocking layer, a hole transporting layer and a hole injecting layer, in addition to the light emitting layer. Also, the second layer 112 can be formed by using a known material. A low molecular weight material and a high molecular weight material can be used. Further, as a material used for forming the second layer 112, an organic compound material and an organic compound material that partly contains an inorganic compound can be used.

Furthermore, since the first layer 111 serves as a hole injecting layer, a hole injecting layer may not be provided in the second layer 112 in this embodiment mode.

As a material with a hole injecting property that is used for forming the hole injecting layer, a know material can be used. Specifically, metal oxide such as vanadium oxide, molybdenum oxide, ruthenium oxide and aluminum oxide is preferably used. Also, a porphyrin compound is effectively used in the case of an organic compound, and phthalocyanine (abbreviation: $H_2$-Pc), copper phthalocyanine (abbreviation: Cu-Pc) and the like can be used. A conductive high molecular weight compound that is subjected to chemical doping can be given. Specifically, polyethylenedioxythiophene (abbreviation: PEDOT) doped with polystyrene sulfonate (abbreviation: PSS), polyaniline (abbreviation: PAni) or the like can be used.

As a material with a hole transporting property that is used for forming a hole transporting layer, a known material can be used. An aromatic amine (i.e., having a benzene ring-nitrogen bond) compound is given as a preferable material. As materials widely used for forming the hole transporting layer, 4,4'-bis[N-(3-methylphenyl)-N-phenyl-amino]-biphenyl (abbreviation: TPD); 4,4'-bis[N-(1-naphthyl)-N-phenyl-amino]-biphenyl (abbreviation: NPB) that is a derivative of TPD; and a starburst aromatic amine compound such as 4,4',4''-tris(N,N-diphenyl-amino)-triphenylamine (abbreviation: TDATA) and 4,4',4''-tris[N-(3-methylphenyl)-N-phenyl-amino]-triphenylamine (abbreviation: MTDATA) can be given.

The light emitting layer contains a substance with a light emitting property. The substance with a light emitting property is herein a substance that has an excellent light emitting efficiency and can emit light with a predetermined wavelength. Although the light emitting layer is not particularly limited, the light emitting layer is preferably one in that a substance with a light emitting property is dispersed in a layer formed using a substance having a larger energy gap than that of the substance with the light emitting property. This layer can prevent light emitted from the substance with the light emitting property from going out due to the concentration of the substance with the light emitting property. Further, the energy gap indicates an energy gap between the LUMO level and the HOMO level.

The substance with the light emitting property used for forming a light emitting layer is not particularly limited. A substance having an excellent light emitting efficiency that can emit light with a predetermined emission wavelength may be used. In order to emit red light, for example, the following substances exhibiting emission spectrum with peaks at 600 to 680 nm can be employed: 4-dicyanomethylene-2-isopropyl-6-[2-(1,1,7,7-tetramethyljulolidine-9-yl)ethenyl]-4H-pyran (abbreviation: DCJTI); 4-dicyanomethylene-2-methyl-6-[2-(1,1,7,7-tetramethyljulolidine-9-yl)ethenyl]-4H-pyran (abbreviation: DCJT); 4-dicyanomethylene-2-tert-butyl-6-[2-(1,1,7,7-tetramethyljulolidine-9-yl)ethenyl]-4H-pyran (abbreviation: DCJTB); periflanthene; 2,5-dicyano-1,4-bis[2-(10-methoxy-1,1,7,7-tetramethyljulolidine-9-yl)ethenyl]benzene; and the like. In order to obtain green light emission, substances exhibiting emission spectrum with peaks at 500 to 550 nm such as N,N'-dimethylquinacridon (abbreviation: DMQd), coumarin 6, coumarin 545T, and tris(8-quinolinolate) aluminum (abbreviation: $Alq_3$) can be employed. In order to obtain blue light emission, the following substances exhibiting emission spectrum with peaks at 420 to 500 nm can be employed: 9,10-bis(2-naphthyl)-tert-butylanthracene (abbreviation: t-BuDNA); 9,9'-bianthryl; 9,10-diphenylanthracene (abbreviation: DPA); 9,10-bis(2-naphthyl) anthracene (abbreviation: DNA); bis(2-methyl-8-quinolinolate)-4-phenylphenolate-gallium (abbreviation: BGaq); bis(2-methyl-8-quinolinolate)-4-phenylphenolate-aluminum (abbreviation: BAlq); and the like. In addition to the above mentioned fluorescing substances, the following phosphorescent substances can be used as substances with the light emitting properties: bis[2-(3,5-bis(trifluoromethyl)phenyl)pyridinato-N,$C^{2'}$]iridium(III) picolinate (abbreviation: Ir($CF_3$ ppy)$_2$(pic)); bis[2-(4,6-difluorophenyl)pyridinato-N,$C^{2'}$]iridium(III) acetylacetonate (abbreviation: FIr(acac)); bis[2-(4,6-difluorophenyl)pyridinato-N,$C^{2'}$]iridium(III) picolinate (FIr(pic)); tris(2-phenylpyridinato-N,$C^{2'}$) iridium (abbreviation: Ir(ppy)$_3$); and the like.

A substance used for dispersing a substance with a light emitting property is not particularly limited. For example, an anthracene derivative such as 9,10-di(2-naphthyl)-2-tert-butylanthracene (abbreviation: t-BuDNA), a carbazole derivative such as 4,4'-bis(N-carbazolyl) biphenyl (abbreviation: CBP), a metal complex such as bis[2-(2-hydroxyphenyl)pyridinato]zinc (abbreviation: $Znpp_2$) and bis[2-(2-hydroxyphenyl)benzoxazolato]zinc (abbreviation: ZnBOX), and the like can be used.

As a material with an electron transporting property that is used for forming an electron transporting layer, a known material can be used. Specifically, a representative metal complex such as tris(8-quinolinolato) aluminum (abbreviation: $Alq_3$); tris(4-methyl-8-quinolinolato) aluminum (abbreviation: $Almq_3$); bis(10-hydroxybenzo[h]-quinolinato) beryllium (abbreviation: $BeBq_2$); bis(2-methyl-8-quinolinolato)-(4-hydroxy-biphenyl)-aluminum (abbreviation: BAlq); bis[2-(2-hydroxyphenyl)-benzoxazolate]zinc (abbreviation: Zn(BOX)$_2$); and bis[2-(2-hydroxyphenyl)-benzothiazolate] zinc (abbreviation: Zn(BTZ)$_2$) can be given. In addition, a hydrocarbon compound such as 9,10-diphenylanthracene and 4,4'-bis(2,2-diphenylethenyl) biphenyl is preferably employed. Additionally, a triazole derivative such as 3-(4-tert-butylphenyl)-4-(4-ethylphenyl)-5-(4-biphenyl)-1,2,4-triazole; a phenanthroline derivative such as bathophenanthroline and bathocuproin may be used.

As a material with an electron injecting property that is used for forming an electron injecting layer, a known material can be used. Specifically, alkali metal salt and alkali earth metal salt such as calcium fluoride, lithium fluoride, lithium oxide and lithium chloride are preferable. Alternatively, a material with an electron transporting property to which a donor compound such as lithium is added, for example, tris (8-quinolinolato) aluminum (abbreviation: $Alq_3$) and bathocuproin (abbreviation: BCP) and the like can be employed.

In this embodiment mode, a dopant that contributes to light emission is added only to the light emitting layer and light emitted from the dopant is only observed. However, a dopant exhibiting different light emission may be added to, for example, an electron transporting layer or a hole transporting layer. When a color of light emitted from the light emitting layer and a color of light emitted from the dopant added to the other layer are complementary to each other, white light emission can be obtained.

By changing the kinds of the first electrode 101 and the second electrode 102, there are different variations in the light emitting element of this embodiment mode. Schematic views of the variations are shown in FIGS. 3A to 3C and FIGS. 4A to 4C. Further, the reference numerals used in FIG. 1 are also used in FIGS. 3A to 3C and FIGS. 4A to 4C. Moreover, reference numeral 100 represents a substrate for supporting a light emitting element of the present invention.

Figure 3A:
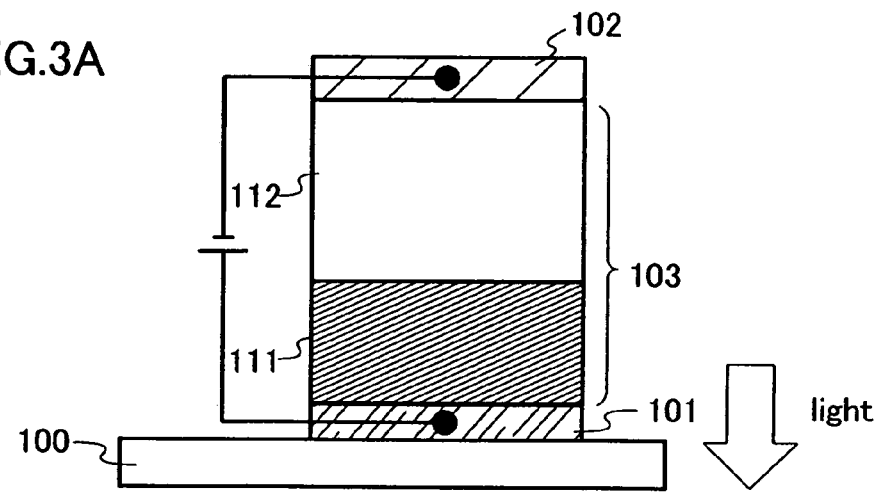
FIGS. 3A to 3C are diagrams explaining light emitting elements of the present invention.
Figure 3B:
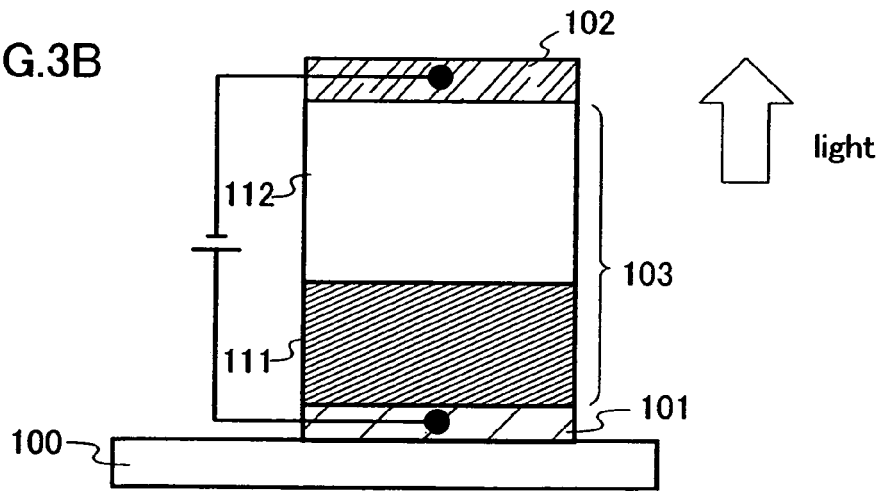
Figure 3C:
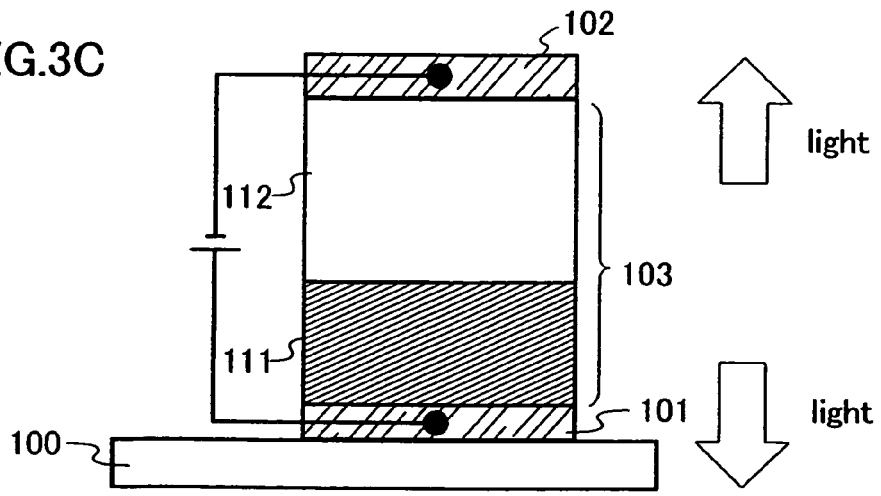

Each of FIGS. 3A to 3C shows an example in that the first layer 111 and the second layer 112 included in the layer 103 containing a light emitting substance are laminated in this order over the substrate 100. In this case, when the first electrode 101 is formed using a material having a light transmitting property and the second electrode 102 is formed using a material having a light shielding property (in particular, light reflecting property), light can be emitted through the substrate 100 as shown in FIG. 3A. Also, when the first electrode 101 is formed using a material with a light shielding property (in particular, light reflecting property) and the second electrode 102 is formed using a material having a light transmitting property, light can be emitted through the opposite side of the substrate 100 as shown in FIG. 3B. Further, when the first electrode 101 and the second electrode 102 are both formed using a material having a light transmitting property, light can be emitted toward both the substrate 100 and the opposite side of the substrate as shown in FIG. 3C.

Each of FIGS. 4A to 4C shows an example in that the second layer 112 and the first layer 111 included in the layer 103 containing a light emitting substance are laminated in this order over the substrate 100. In this case, when the first electrode 101 is formed using a material having a light shielding property (in particular, light reflecting property) and the second electrode 102 is formed using a material having a light transmitting property, light can be emitted through the substrate 100 as shown in FIG. 4A. When the first electrode 101 is formed using a material having a light transmitting property and the second electrode 102 is formed using a material having a light shielding property (in particular, light reflecting property), light can be emitted through the opposite side of the substrate 100 as shown in FIG. 4B. Further, when the first electrode 101 and the second electrode 102 are both formed using a material having a light transmitting property, light can be emitted toward both the substrate 100 and the opposite side of the substrate 100 as shown in FIG. 4C.

In the light emitting element of the present embodiment mode, since the first layer 111 contains a carbazole derivative represented by the general formula (1) and an inorganic compound exhibiting an electron accepting property with respect to the carbazole derivative represented by the general formula (1), the first layer 111 exhibits extremely excellent hole injecting and transporting properties. Therefore, the increase in driving voltage can be suppressed even when the thickness of the first layer 111 is increased. As a consequence, the short-circuiting of the light emitting element can be prevented while suppressing the increase in driving voltage. Moreover, since the color purity is improved by an optical design, the thickness of the first layer 111 can be freely set.

Furthermore, in the case where the second layer 112 and the first layer 111 are sequentially formed over the second electrode 102 and then the first electrode 101 is formed thereover by sputtering as shown in FIGS. 4A to 4C, it is possible to avoid damage to the second layer 112 in which the substance with the light emitting property exists.

[Embodiment Mode 2]

The layer, which contains a carbazole derivative represented by the general formula (1) and an inorganic compound exhibiting an electron accepting property with respect to the carbazole derivative represented by the general formula (1), is provided to be in contact with the anode in Embodiment Mode 1. Alternatively, Embodiment Mode 2 will describe a case in that the layer, which contains a carbazole derivative represented by the general formula (1) and an inorganic compound exhibiting an electron accepting property with respect to the carbazole derivative represented by the general formula (1), is provided between an anode and a light emitting layer so as not to be in contact with the anode.

Figure 2:
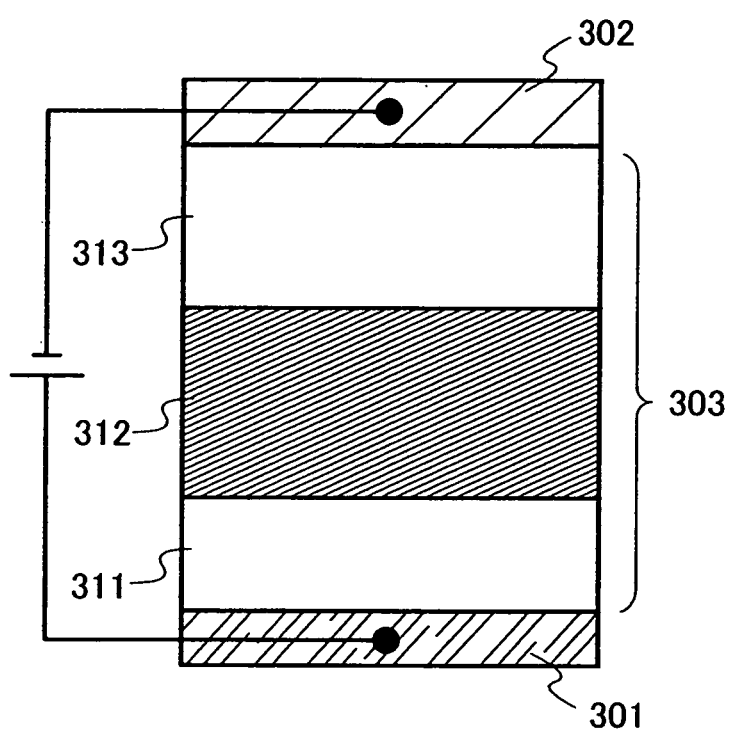
FIG. 2 is a diagram explaining a light emitting element of the present invention.

An example of a structure of a light emitting element of the present invention will be shown in FIG. 2. A layer 303 containing a light emitting substance is interposed between a first electrode 301 and a second electrode 302. The layer 303 containing the light emitting substance includes a structure in that a first layer 311, a second layer 312 and a third layer 313 are laminated in this order.

The first layer 311 has a function of injecting holes. As a material with a hole injecting property used for forming a hole injecting layer, a know material can be used. Specifically, the materials as shown in Embodiment Mode 1 can be used.

The second layer 312 contains a carbazole derivative represented by the general formula (1) and an inorganic compound exhibiting an electron accepting property with respect to the carbazole derivative represented by the general formula (1). The same structure as the first layer 111 shown in Embodiment Mode 1 can be applied to the second layer 312.

The third layer 313 has a function of emitting light. The same structure as the second layer 112 shown in Embodiment Mode 1 can be applied to the third layer 313.

By utilizing the above mentioned structure, the increase in driving voltage can be suppressed even when the thickness of the second layer 312 is increased. As a result, the short-circuiting of the light emitting element can be prevented and the color purity can be improved by an optical adjustment while suppressing the increase in driving voltage.

[Embodiment Mode 3]

In this embodiment mode, a light emitting element having a different structure from those in Embodiment Mode 1 will be described with reference to FIG. 5.

Figure 5:
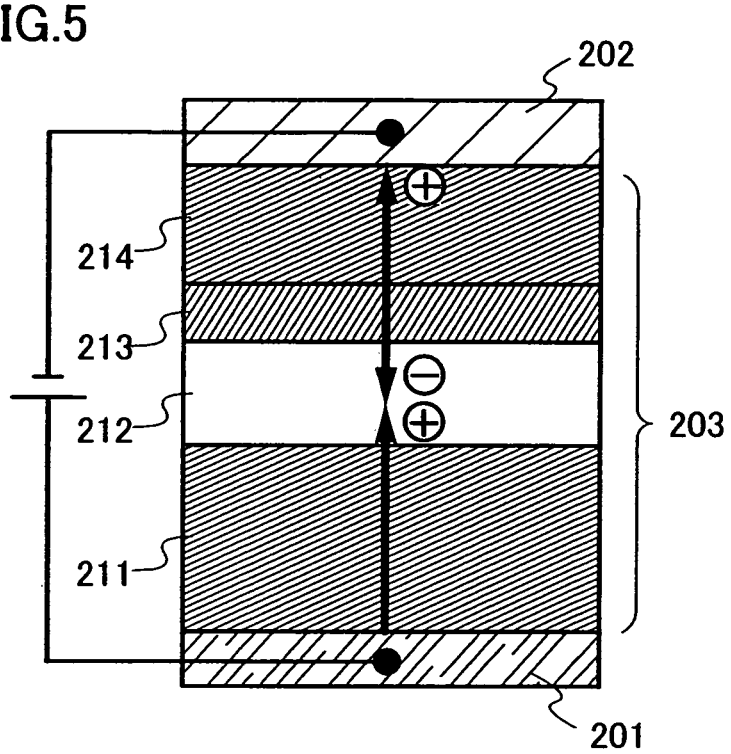
FIG. 5 is a diagram explaining a light emitting element of the present invention.

FIG. 5 shows an example of a structure of the light emitting element of the present invention. A layer 203 containing a light emitting substance is interposed between a first electrode 201 and a second electrode 202. The layer 203 containing the light emitting substance includes a first layer 211, a second layer 212, a third layer 213 and a fourth layer 214 that are laminated in this order.

The light emitting element of this embodiment mode is operated as follows. When a voltage is applied to the light emitting element such that a potential of the first electrode 201 is higher than that of the second electrode 202, holes are injected in the second electrode 202 from the fourth layer 214 while electrons are injected in the second layers 212 from the third layer 213. Further, holes are injected in the first layer 211 from the first electrode 201 and holes are injected in the second layer 212 from the first layer 211. The holes injected from the first layer 211 and the electrons injected from the third layer 213 are recombined in the second layer 212 so that the substance with the light emitting property is excited. Then, the light emitting substance emits light upon returning to a ground state from the excited state.

The same structures as the first electrode 101, the second electrode 102, the first layer 111 and the second layer 112 of Embodiment Mode 1 can be applied to the first electrode 201, the second electrode 202, the first layer 211 and the second layer 212. That is, the first electrode can be formed using a known material. The first layer 211 contains a carbazole derivative represented by the general formula (1) and an inorganic compound exhibiting an electron accepting property with respect to the carbazole derivative represented by the general formula (1). The second layer 212 contains a substance having a light emitting property.

The third layer 213 is a layer containing a material having a donor level that generates electrons. As the third layer, for example, a layer that contains a substance with an electron transporting property and a substance exhibiting an electron donating property with respect to the substance with the electron transporting property can be given. The substance with the electron transporting property mentioned here is a substance of which an electron transporting property is stronger than a hole transporting property. The substance with the electron transporting property is not particularly limited. For example, a metal complex such as tris(8-quinolinolato) aluminum (abbreviation: Alq$_3$); tris(4-methyl-8-quinolinolato) aluminum (abbreviation: Almq$_3$); bis(10-hydroxybenzo[h]-quinolinato) beryllium (abbreviation: BeBq$_2$); bis(2-methyl-8-quinolinolato)-4-phenylphenolate-aluminum (abbreviation: BAlq); bis[2-(2-hydroxyphenyl)benzoxazolate]zinc (abbreviation: Zn(BOX)$_2$); and bis[2-(2-hydroxyphenyl)benzothiazolate]zinc (abbreviation: Zn(BTZ)$_2$) can be given. In addition, the following substances can be used as the substance with the electron transporting property: 2-(4-biphenylyl)-5-(4-tert-butylphenyl)-1,3,4-oxadiazole (abbreviation: PBD); 1,3-bis[5-(p-tert-butylphenyl)-1,3,4-oxadiazole-2-yl] benzene (abbreviation: OXD-7); 3-(4-tert-butylphenyl)-4-phenyl-5-(4-biphenylyl)-1,2,4-triazole (abbreviation: TAZ); 3-4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP); and the like. The substance exhibiting the electron donating property with respect to the substance with the electron transporting property is not particularly limited. For example, alkali metal such as lithium and cesium, alkali earth metal such as magnesium and calcium, rare earth metal such as erbium and ytterbium and the like can be used. Also, a substance selected from alkali metal oxide and alkali earth metal oxide such as lithium oxide (Li$_2$O), calcium oxide (CaO), sodium oxide (Na$_2$O), kalium oxide (K$_2$O) and magnesium oxide (MgO) may be used as the substance exhibiting the electron donating property with respect to the substance with the electron transporting property. Further, the alkali metal oxide, alkali earth metal oxide and the like have low reactivity so that they are easily handled. The third layer 213 preferably contains the substance exhibiting the electron donating property with respect to the substance with the electron transporting property such that the molar ratio of the substance exhibiting the electron donating property to the substance with the electron transporting property (i.e., the substance exhibiting the electron donating property with respect to the substance with the electron transporting property/the substance with the electron transporting property) is 0.5 to 2. Further, the third layer 213 may includes an n-type semiconductor such as zinc oxide, zinc sulfide, zinc selenide, tin oxide and titanium oxide.

The fourth layer 214 contains the carbazole derivative represented by the general formula (1) and an inorganic compound exhibiting an electron accepting property with respect to the carbazole derivative represented by the general formula (1). Therefore, the inorganic compounds given in Embodiment Mode 1 can be used for the inorganic compound contained in the fourth layer. Further, the same inorganic compound contained in the first layer 211 may be used, or an inorganic compound different from the inorganic compound contained in the first layer 211 may be used as the inorganic compound contained in the fourth layer 214.

By utilizing the above mentioned structure, when the voltage is applied to the light emitting element, the electrons are transported in the vicinity of an interface between the third layer 213 and the fourth layer 214 so that the electrons and the holes are generated, as shown in FIG. 5. The third layer 213 transports the electrons to the second layer 212 while the fourth layer 214 transports the holes to the second electrode 202. That is, a combination of the third layer 213 and the fourth layer 214 serves as a carrier generating layer. Also, it can be said that the fourth layer 214 has a function of transporting the holes to the second electrode 202. Further, when another second layer and another third layer are also laminated between the fourth layer 214 and the second electrode 202, a multiphoton light emitting element can be formed.

Furthermore, since each of the first layer 211 and the fourth layer 214 contains a carbazole derivative represented by the general formula (1) and an inorganic compound exhibiting an electron accepting property with respect to the carbazole derivative represented by the general formula (1), the first and fourth layers have extremely strong hole injecting and transporting properties. Therefore, the increase in driving voltage can be suppressed even when the thicknesses of the first layer 211 and the fourth layer 214 are increased. Thus, in the light emitting element of this embodiment mode, the thicknesses of both the first layer 211 and the fourth layer 214 can be significantly increased. That is, a distance between the first electrode and the second electrode can be increased. In addition, the short-circuiting of the light emitting element can be effectively prevented. Moreover, to improve the color purity by an optical design, the thicknesses of layers on the both sides of the second layer 212 can be freely set. Additionally, when the first electrode 201 or the second electrode 202 is formed by sputtering after forming the layer 203 containing the light emitting substance, it is possible to reduce damage to the second layer 212 in which the substance with the light emitting property exists. Furthermore, by forming the first layer 211 and the fourth layer 214 using the same material, the layers of the both sides of the layer 203 containing the light emitting substance will be formed using the same material, and there are expectations for an effect of suppressing stress distortion.

Further, in the light emitting element of the present embodiment mode, by changing the kinds of the first electrode 201 and the second electrode 202, there are many variations in the light emitting element. Schematic views of the variations are shown in FIGS. 6A to 6C and FIGS. 7A to 7C. The reference numerals used in FIG. 5 are also used in FIGS. 6A to 6C and FIGS. 7A to 7C. Reference numeral 200 represents a substrate for supporting a light emitting element of the present invention.

Each of FIGS. 6A to 6C shows an example in which a layer 203 containing a light emitting substance includes a first layer 211, a second layer 212, a third layer 213 and a fourth layer 214 that are laminated in this order beginning from the side of the substrate 200. In this case, when the first electrode 201 is formed using a material with a light transmitting property and the second electrode 202 is formed using a material with a light shielding property (in particular, light reflecting property), light can be emitted through the substrate 200 as shown in FIG. 6A. When the first electrode 201 is formed using a material with a light shielding property (in particular, light reflecting property) and the second electrode 202 is formed using a material with a light transmitting property, light can be emitted through the opposite side of the substrate 200 as shown in FIG. 6B. Further, when the first electrode 201 and the second electrode 202 are both formed using a material having a light transmitting property, light can be emitted through both the substrate 200 and the opposite side of the substrate, as shown in FIG. 6C.

Each of FIGS. 7A to 7C shows an example in which a layer 203 containing a light emitting substance includes a fourth layer 214, a third layer 213, a second layer 212 and a first layer 211 that are laminated in this order beginning from the side of the substrate 200. In this case, when the first electrode 201 is formed using a material with a light shielding property (in particular, light reflecting property) and the second electrode 202 is formed using a substance with a light transmitting property, light can be emitted through the substrate 200 as shown in FIG. 7A. When the first electrode 201 is formed using a material with a light transmitting property and the second electrode 202 is formed using a material with a light shielding property (in particular, light reflecting property), light can be emitted through the opposite side of the substrate 200 as shown in FIG. 7B. Further, when the first electrode 201 and the second electrode 202 are both formed using a material with a light transmitting property, light can be emitted through both the substrate 200 and the opposite side of the substrate 200, as shown in FIG. 7C.

Figure 37:
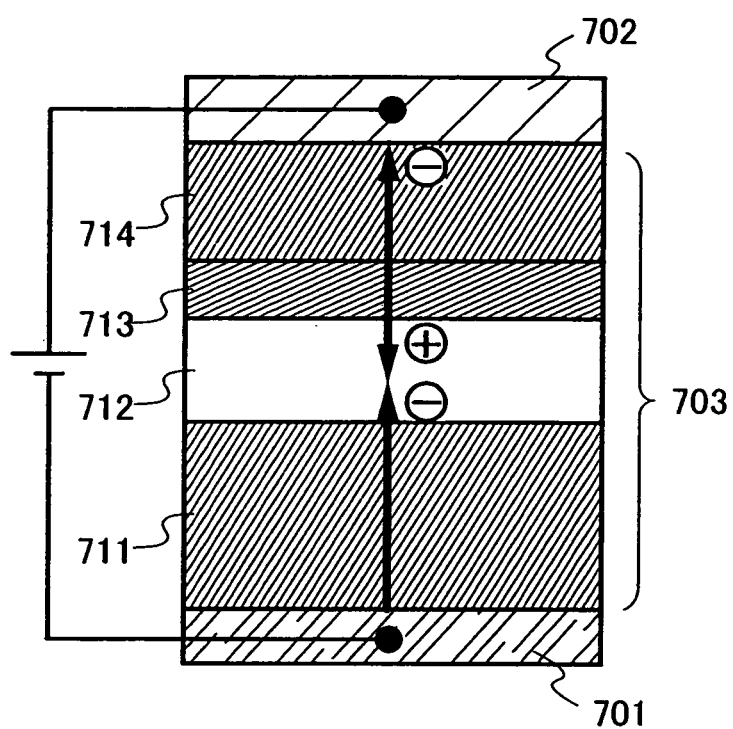
FIG. 37 is a diagram explaining a light emitting element of the present invention.

Alternatively, as shown in FIG. 37, the positions of the layer containing the material having the donor level that generates electrons and the layer containing the carbazole derivative represented by the general formula (1) and the inorganic compound exhibiting the electron accepting property with respect to the carbazole derivative represented by the general formula (1) shown in FIG. 5 may be changed. FIG. 37 shows an example in which a layer 703 containing a light emitting substance includes a first layer 711, a second layer 712, a third layer 713 and a fourth layer 714 that are laminated in this order between a first electrode 701 and a second electrode 702. The first layer 711 can be formed using a material having a donor level that generates electrons, the third layer 713 can be formed using a carbazole derivative represented by the general formula (1) and an inorganic compound exhibiting an electron accepting property with respect to the carbazole derivative represented by the general formula (1), and the fourth layer 714 can be formed using a material having a donor level that generates electrons. In this case, since the third layer 713 contains the carbazole derivative represented by the general formula (1) and the inorganic compound exhibiting the electron accepting property with respect to the carbazole derivative represented by the general formula (1), the third layer 713 has an excellent hole transporting property. Therefore, the driving voltage of the light emitting element can be reduced. In addition, to improve the color purity by an optical design, the thickness of the third layer 713 can be freely set.

[Embodiment Mode 4]

In this embodiment mode, a light emitting device having a light emitting element of the present invention will be described.

A light emitting device having a light emitting element of the prevent invention in a pixel portion will be described in this embodiment mode with reference to FIGS. 8A and 8B.

Figure 8A:
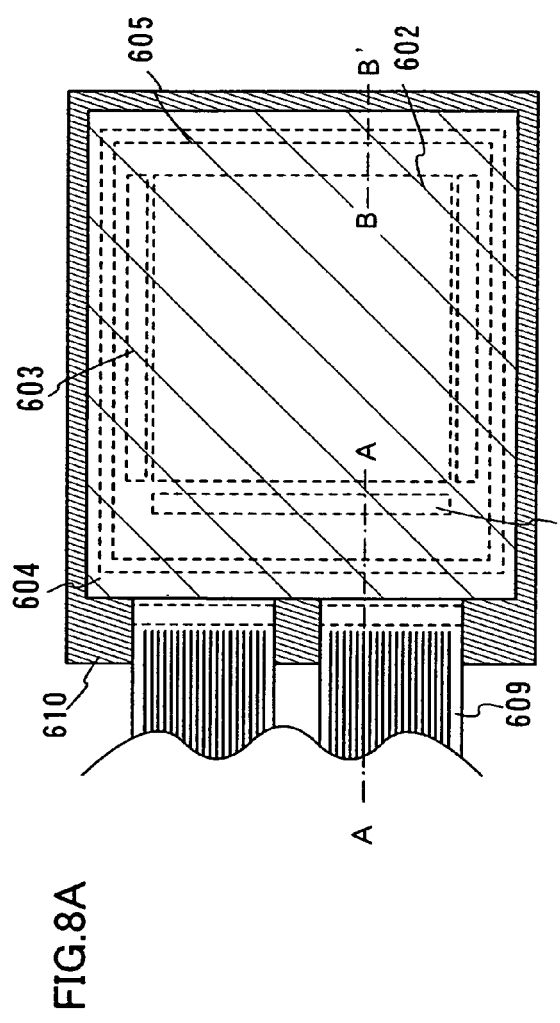
FIGS. 8A and 8B are diagrams explaining a light emitting device.
Figure 8B:
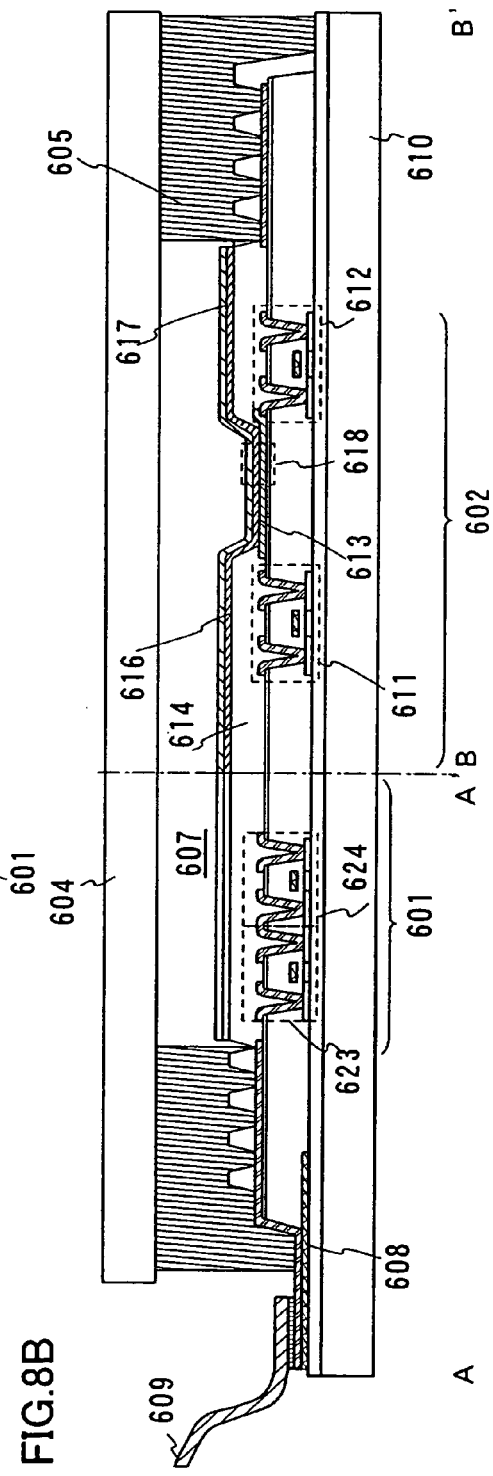

FIG. 8A is a top view showing the light emitting device and FIG. 8B is a cross sectional view along a line A-A' and a line B-B' of FIG. 8A. Reference numeral 601 marked by a dashed line indicates a driver circuit portion (a source signal line driver circuit); 602, a pixel portion; and 603, a driver circuit portion (a gate signal line driver circuit). Further, reference numeral 604 indicates a sealing substrate and reference numeral 605 indicates a sealing material. A hollow 607 is provided inside of a portion surrounded by the sealing material 605.

A leading wiring 608 is a wiring for transmitting signals input in the source signal line driver circuit 601 and the gate signal line driver circuit 603. The leading wiring 608 receives video signals, clock signals, start signals, reset signals and the like from FPCs (flexible printed circuits) 609 that serves as external input terminals. Although only the FPCs are depicted in FIG. 8A, printed wiring boards (PWBs) may be attached to the FPCs. The light emitting device in the present specification includes not only the main body of the light emitting device but also the FPCs or the FPCs attached with the PWBs.

Next, a cross sectional structure will be described with reference to FIG. 8B. The driver circuit portions and the pixel portions are provided over an element substrate 610. In FIG. 8B, only the source signal line driver circuit 601, which is the driver circuit portion, and one pixel of the pixel portion 602 are shown here.

A CMOS circuit with a combination of an n-channel TFT 623 and a p-channel TFT 624 is provided in the source signal line driver circuit 601. Further, a known CMOS circuit, PMOS circuit or NMOS circuit may be employed for TFTs used for forming the driver circuit. Although the driver circuits are integrated over the element substrate in this embodiment mode, the present invention is not limited this structure. Alternatively, the driver circuits can be provided outside of the element substrate.

The pixel portion 602 includes a plurality of pixels each having a switching TFT 611, a current controlling TFT 612 and a first electrode 613 that is electrically connected to a drain of the current controlling TFT. An insulator 614 is formed to cover the edge of the first electrode 613. The insulator 614 is formed by using a positive photosensitive acrylic resin film here.

In order to improve the coverage, the insulator 614 is provided such that either an upper edge portion or a lower edge portion of the insulator has a curbed surface with a curvature. For example, when positive photosensitive acrylic is used as a material of the insulator 614, it is preferable that only an upper portion of the insulator 614 have a curved surface with a radius of curvature (0.2 to 3 µm). Further, the insulator 614 can be formed using either negative photosensitive acrylic that becomes insoluble in an etchant due to light irradiation, or positive photosensitive acrylic that becomes dissoluble in an etchant due to light irradiation.

A layer 616 containing a light emitting substance and a second electrode 617 are provided over the first electrode 613. A first electrode 613 that serves as an anode is preferably formed using a material having a large work function. For example, a single film such as an indium tin oxide (hereinafter, referred to as M) film, an indium tin oxide film containing silicon, an indium oxide film containing 2 to 20 wt % zinc oxide, a titanium nitride film, a chromium film, a tungsten film, a Zn film, and a Pt film can be used. In addition, a laminated layer including a titanium nitride film and a film mainly containing aluminum, a three-layered structure including a titanium nitride film, a film mainly containing aluminum and a titanium nitride film, and the like can be employed. Furthermore, when the first electrode 613 is formed using a laminated layer, the resistance can be reduced as a wiring and a good ohmic contact can be obtained. In addition, this first electrode can serve as the anode.

The layer 616 containing the light emitting substance is formed by a known method such as evaporation using an evaporation mask, an ink-jet method and spin coating or the like. The layer 616 containing the light emitting substance has a layer that contains a carbazole derivative represented by the general formula (1) and an inorganic compound exhibiting an electron accepting property with respect to the carbazole derivative represented by the general formula (1). As the other material included in the layer 616 containing the light emitting substance, a low molecular weight material, an intermediate molecular weight material (including oligomer and dendrimer) or a high molecular weight material may be used. Further, a single layer or a laminated layer using an organic compound is usually used as a material for the layer containing the light emitting substance. However, in the present invention, the layer 616 containing the light emitting substance may also includes an organic compound that partly contains an inorganic compound.

Furthermore, since the carbazole derivative represented by the general formula (1) has an excellent hole injecting property, the layer containing the carbazole derivative represented by the general formula (1) and the inorganic compound exhibiting an electron accepting property with respect to the carbazole derivative represented by the general formula (1) is preferably provided to be closer to the anode than the light emitting layer.

A second electrode 617 is formed on the layer 616 containing the light emitting substance and serves as a cathode. The second electrode 617 is preferably formed using a material having a low work function such as Al, Mg, Li, Ca, and an alloy or a compound thereof (e.g., MgAg, MgIn, AlLi, $CaF_2$, LiF or calcium nitride). In the case where light generated in the layer 616 containing the light emitting substance transmits through the second electrode 617, the second electrode 617 is preferably formed by laminating a thin metal film and a transparent conductive film (such as ITO, indium oxide containing 2 to 20 wt % zinc oxide, indium tin oxide containing silicon, and zinc oxide (ZnO)).

By adhering the sealing substrate 604 to the element substrate 610 using the sealing material 605, the light emitting element 618 is provided in the hollow 607 where is surrounded by the element substrate 610; the sealing substrate 604 and the sealing material 605. Further, filler is filled in the hollow 607. When an inert gas (such as nitrogen and argon) is filled in the hollow, the hollow is sometimes filled with the sealing material 605.

As the sealing material 605, an epoxy resin is preferably used. More preferably, a material that does not transmit moisture and oxygen as much as possible is used for the sealing material. A glass substrate, a quartz substrate or a plastic substrate made from FRP (fiberglass-reinforced plastic), PVF (polyvinyl fluoride), mylar, polyester, acrylic or the like can be used as the sealing substrate 604.

As mentioned above, the light emitting device having the light emitting element of the present invention can be obtained.

Since the light emitting device of the invention includes the carbazole derivative represented by the general formula (1) and the inorganic compound exhibiting the electron accepting property with respect to the carbazole derivative represented by the general formula (1), the driving voltage can be reduced, thereby reducing the power consumption.

Also, the increase in driving voltage can be suppressed even when the thickness of the layer containing the light emitting substance is increased. Therefore, the increase in driving voltage can be suppressed while the short-circuiting of the light emitting element can be prevented. In addition, the increase in driving voltage can be suppressed while the color purity can be improved by an optical design. Consequently, a light emitting device having less defect and good color purity can be achieved.

Figure 10:
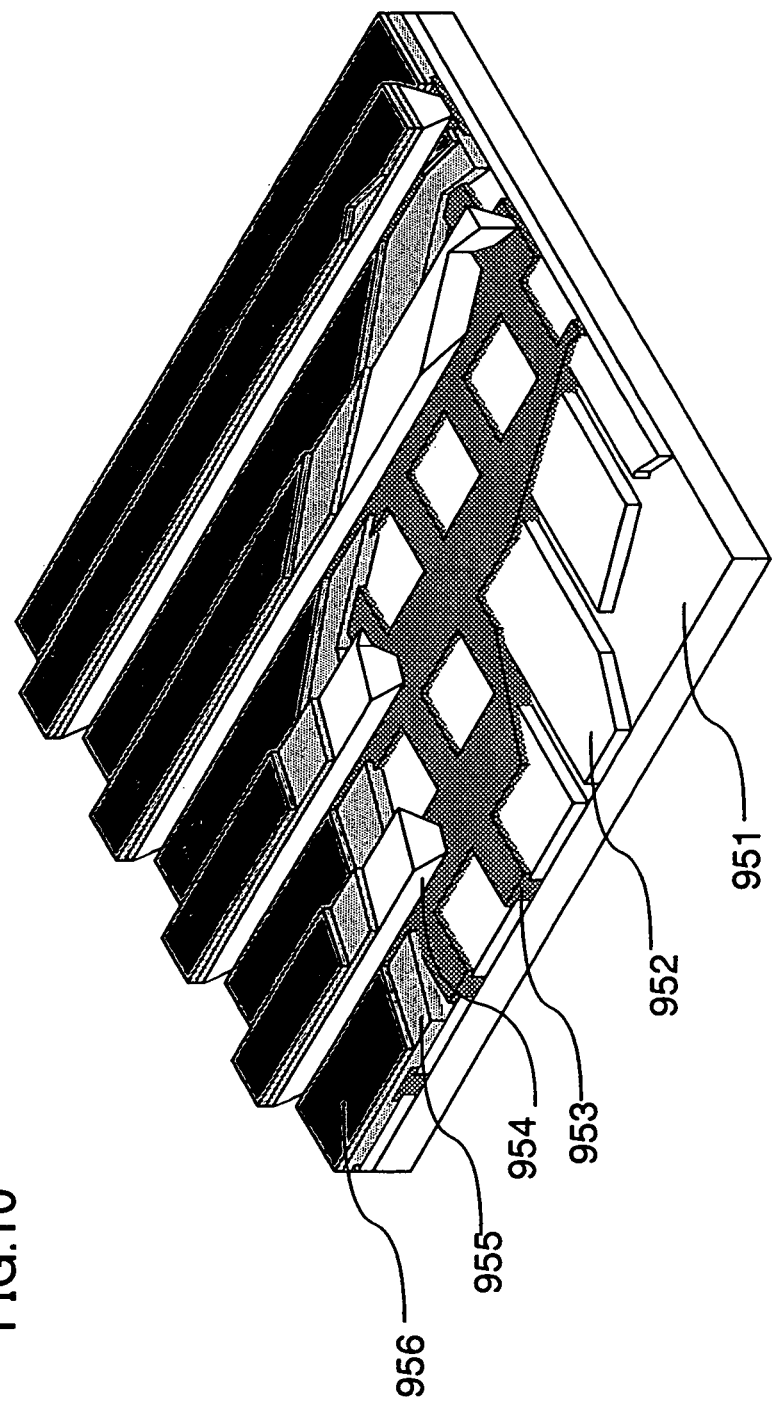
FIG. 10 is a diagram explaining a light emitting device of the present invention.

As set forth above, an active light emitting device in which the light emitting element is driven by the transistors is described. Alternatively, a passive light emitting device in which a light emitting element is driven without providing a driving element such as a transistor may be employed. FIG. 10 shows a perspective view of the passive light emitting device that is manufactured in accordance with the present invention. In FIG. 10, a layer 955 containing a light emitting substance is provided between an electrode 952 and an electrode 956 over a substrate 951. The edge of the electrode 952 is covered with an insulating layer 953. A partition wall layer 954 is provided on the insulating layer 953. The sidewalls of the partition wall layer 954 are aslope so that a distance between both sidewalls is gradually narrowed toward the surface of the substrate. That is, a cross section in the direction of a narrow side of the partition wall layer 954 has a trapezoidal shape, and a lower side (which faces a surface of the insulating layer 953 and is in contact with the insulating layer 953) is shorter than an upper side (which faces the surface of the insulating layer 953 and is not in contact with the insulating layer 953). By providing the partition wall layer 954 in this manner, defects of the light emitting element due to static charge and the like can be prevented. In addition, by forming the passive light emitting device utilizing the light emitting element of the present invention, which is operated at low driving voltage, the passive light emitting device can be driven at low power consumption.

[Embodiment Mode 5]

In this embodiment mode, various kinds of electronic appliances that include light emitting devices manufactured using light emitting elements of the present invention will be described.

As the electronic appliances manufactured using the light emitting devices that has the light emitting element of the present invention, a camera such as a video camera and a digital camera; a goggle type display; a navigation system; a sound reproducing device (such as a car audio and an audio component system); a personal computer; a game machine; a portable information terminal (such as a mobile computer, a cellular telephone, a portable game machine and an electronic book); a picture reproducer provided with a recording medium (typically, a device which can play the recording medium such as a digital versatile disc (DVD) and display images thereof); and the like can be given. Specific examples of these electronic appliances are shown in FIGS. 9A to 9E.

Figure 9A:
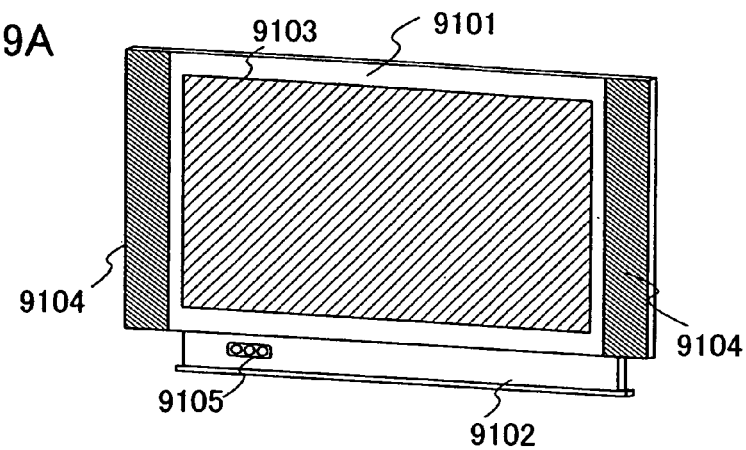
FIGS. 9A to 9E are diagrams explaining electronic appliances using light emitting devices of the present invention.

FIG. 9A is a television receiver including a housing 9101, a supporting base 9102, a display portion 9103, speaker portions 9104, a video input terminal 9105 and the like. By using a light emitting device having a light emitting element of the present invention as the display portion 9103, the television receiver is manufactured. The light emitting device of the present invention uses much less power and has less defects. In addition, since the increase in driving voltage can be suppressed and the color purity can be improved in the light emitting device, the color reproducibility is improved, making it possible to display fine images. Further, the television receiver also includes all information displaying apparatuses for a computer, a TV broadcasting, advertisement, and the like.

Figure 9B:
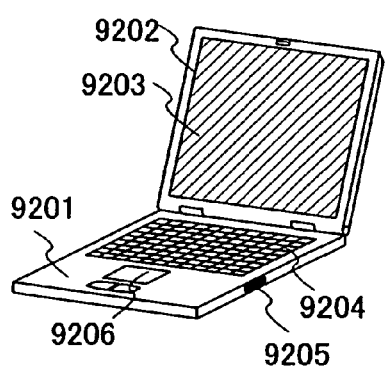

FIG. 9B is a personal computer including a main body 9201, a housing 9202, a display portion 9203, a keyboard 9204, an external connection port 9205, a pointing mouse 9206, and the like. The computer is manufactured by using the light emitting device having the light emitting element of the present invention as the display portion 9203. The light emitting device of the present invention uses much less power and has less defects. In addition, since the increase in driving voltage can be suppressed and the color purity can be improved in the light emitting device, the color reproducibility is improved, making it possible to display fine images.

Figure 9C:
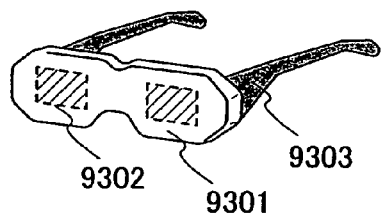

FIG. 9C is a goggle-type display including a main body 9301, a display portion 9302, arm portions 9303 and the like. This goggle-type display is manufactured by using the light emitting device having the light emitting element of the present invention as the display portion 9302. The light emitting device of the present invention uses much less power and has less defects. In addition, since the increase in driving voltage can be suppressed and the color purity can be improved in the light emitting device, the color reproducibility is improved, making it possible to display fine images.

Figure 9D:
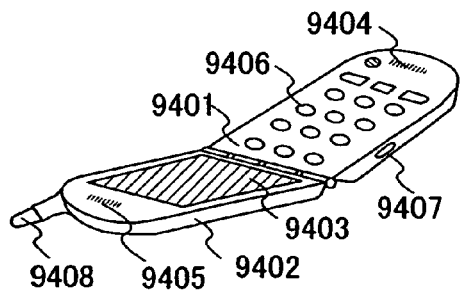

FIG. 9D is a mobile phone including a main body 9401, a housing 9402, a display portion 9403, an audio input portion 9404, an audio output portion 9405, operation keys 9406, an external connection port 9407, an antenna 9408 and the like. This mobile phone is manufactured by using the light emitting device having the light emitting element of the present invention as the display portion 9403. Further, the power consumption of the mobile phone can be suppressed by displaying white characters against a black back of the display portion 9403. The light emitting device of the present invention uses much less power and has less defects. In addition, since the increase in driving voltage can be suppressed and the color purity can be improved in the light emitting device, the color reproducibility is improved, making it possible to display fine images.

Figure 9E:
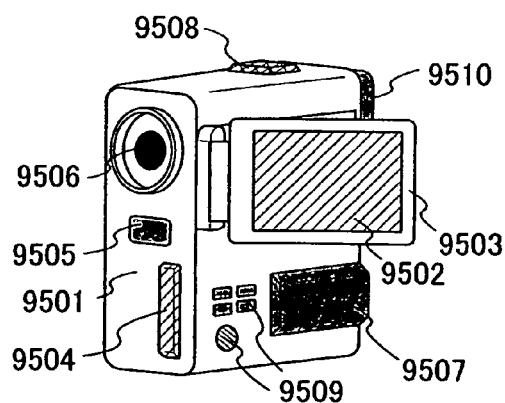

FIG. 9E is a camera including a main body 9501, a display portion 9502, a housing 9503, an external connection port 9504, a remote-control receiver 9505, an image receiver 9506, a buttery 9507, an audio input portion 9508, operation keys 9509, an eyepiece portion 9510 and the like. The camera can be manufactured by using the light emitting device having the light emitting element of the present invention as the display portion 9502. The light emitting device of the present invention uses much less power and has less defects. In addition, since the increase in driving voltage can be suppressed and the color purity can be improved in the light emitting device, the color reproducibility is improved, making it possible to display fine images.

As set forth above, the application range of the light emitting device having the light emitting element of the present invention is extremely wide, and hence, the light emitting device can be applied to electronic appliances in various fields. By utilizing the light emitting device having the light emitting element of the present invention, an electronic appliance that uses much less power and has less defects and an excellent color reproducibility can be provided.

[Embodiment Mode 6]

The present embodiment mode will describe the carbazole derivative represented by the general formula (1).

As specific examples of the carbazole derivative represented by the general formula (1), carbazole derivatives represented by the following structural formulas (25) to (102) can be given. However, the present invention is not limited to the following structural formulas.

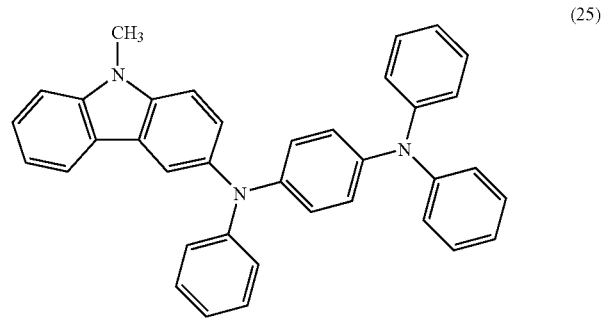

(25)

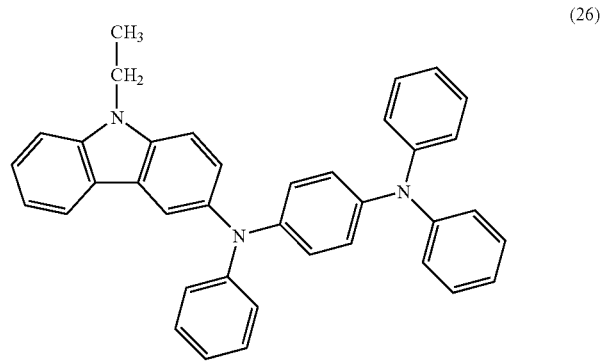

(26)

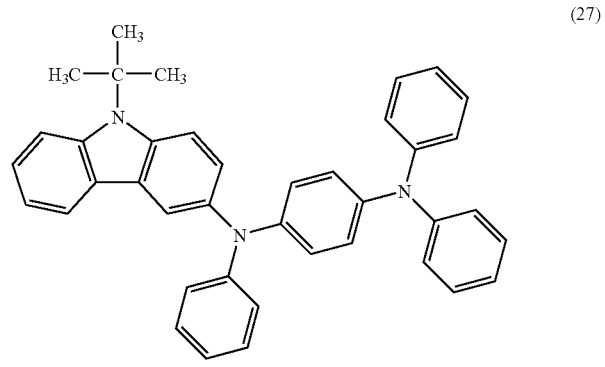

(27)

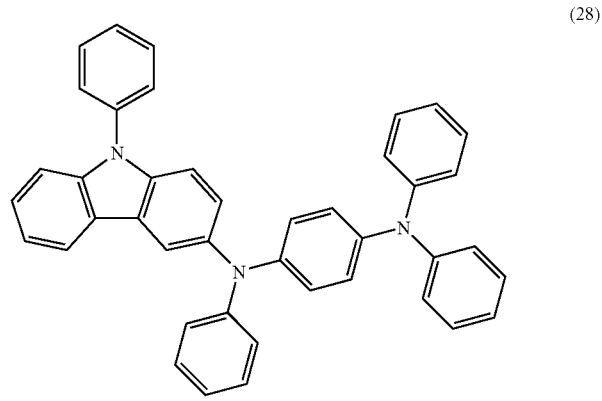

(28)

-continued
(29)
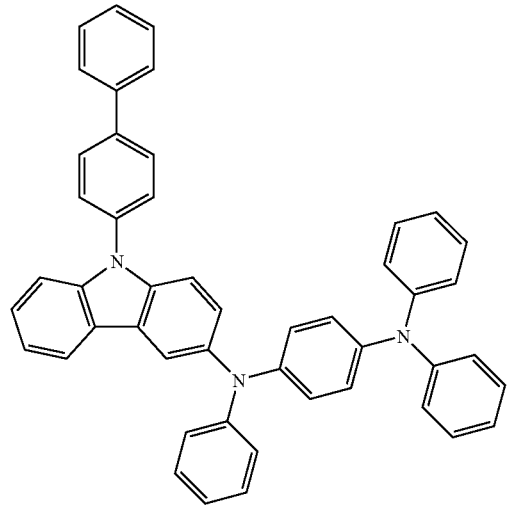
(30)
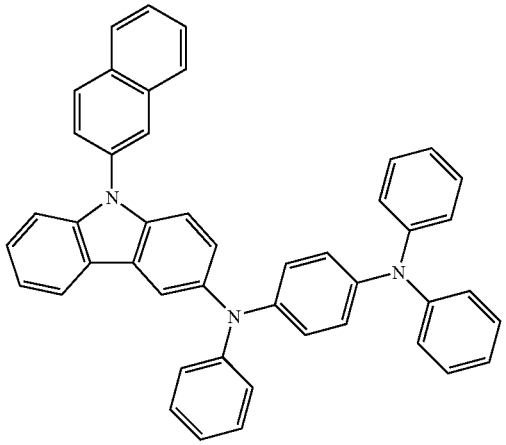
(31)
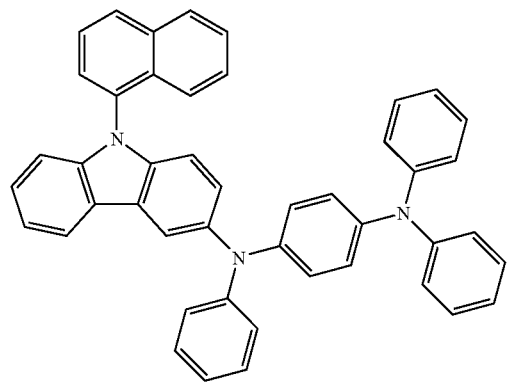
(32)
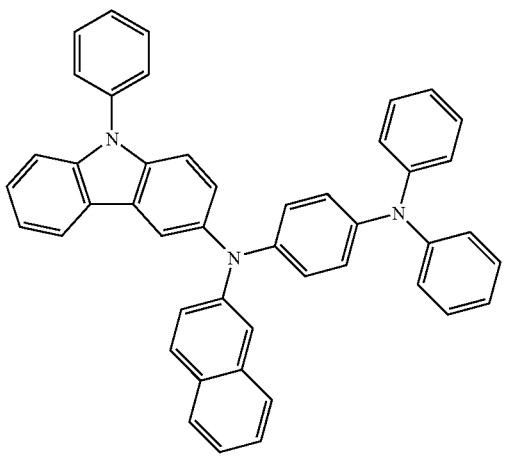
(33)
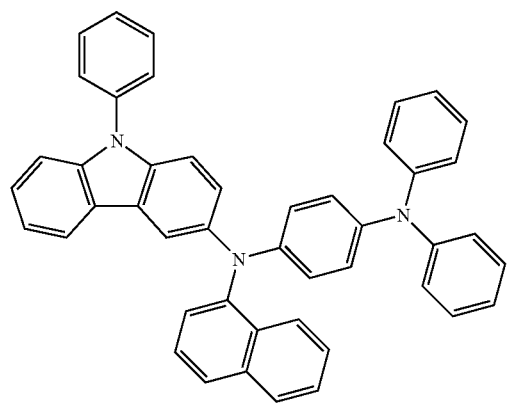
(34)
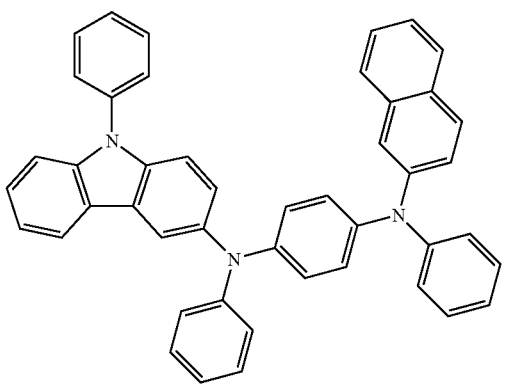

-continued
(35)
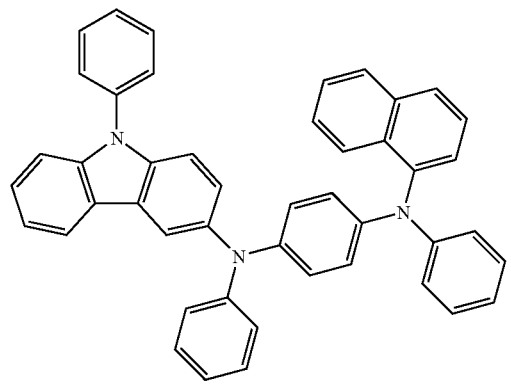
(36)
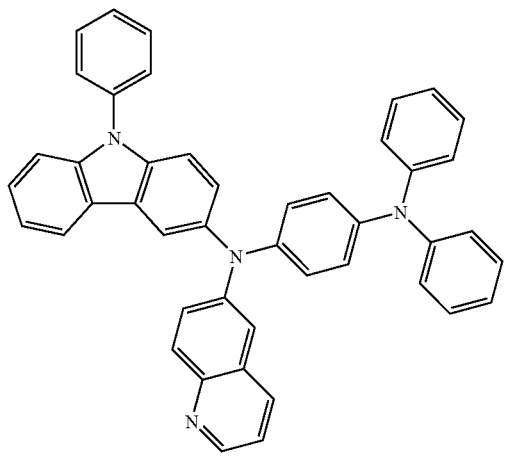
(37)
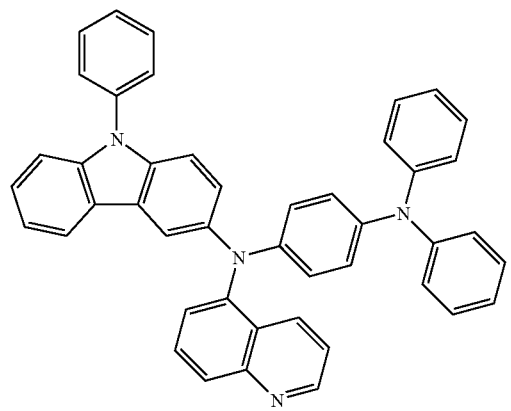
(38)
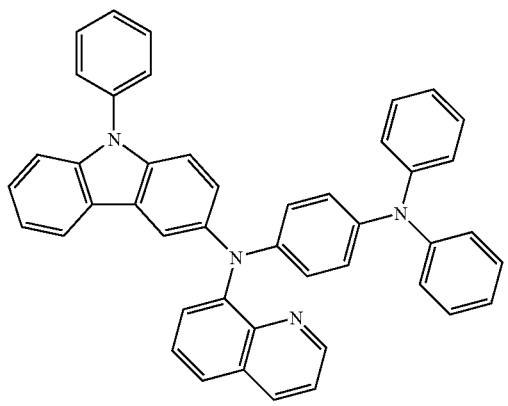
(39)
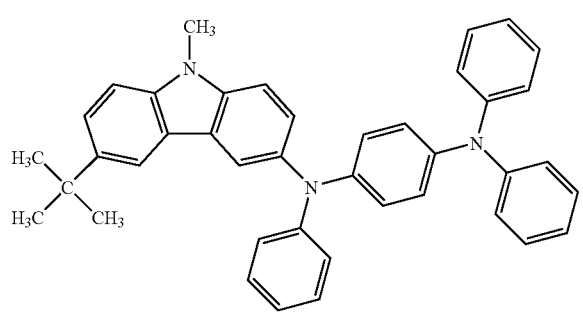
(40)
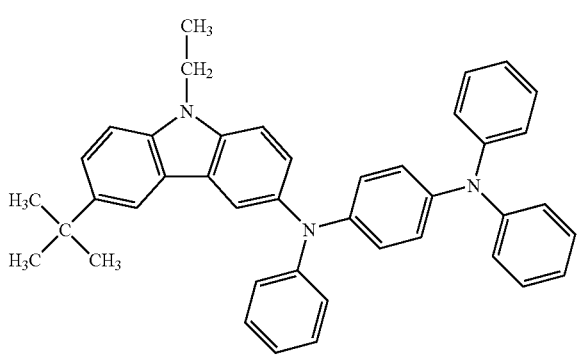
(41)
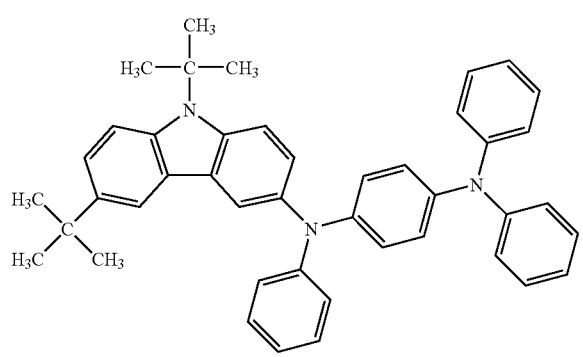
(42)
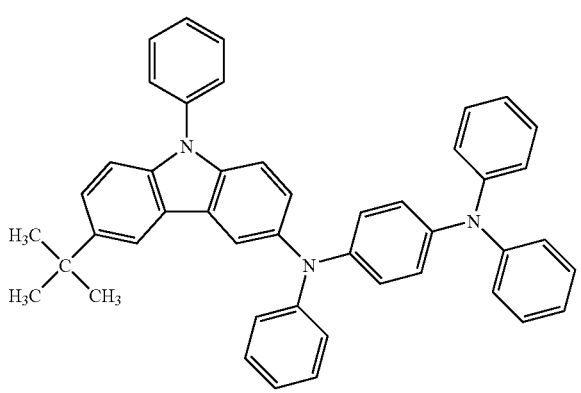

-continued
(43)
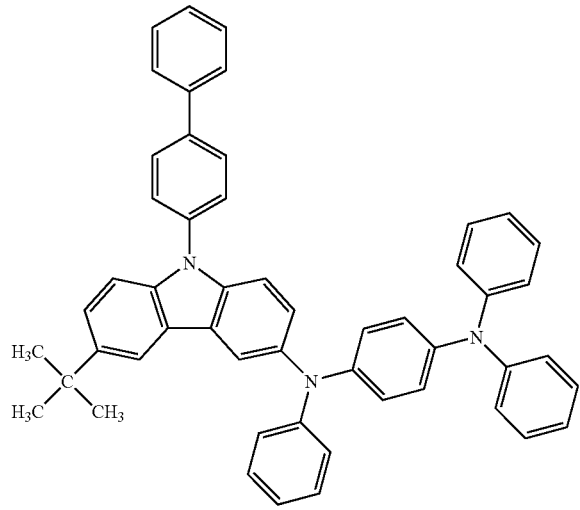
(44)
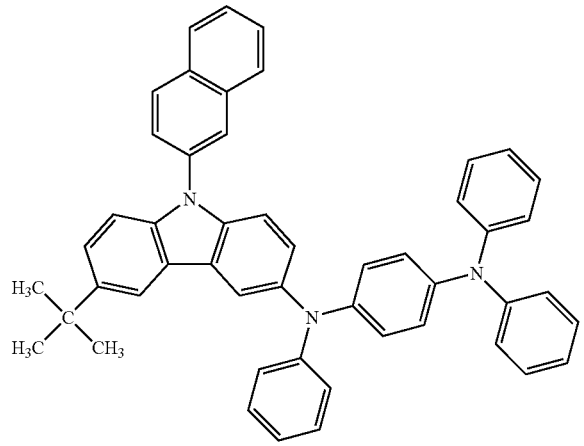
(45)
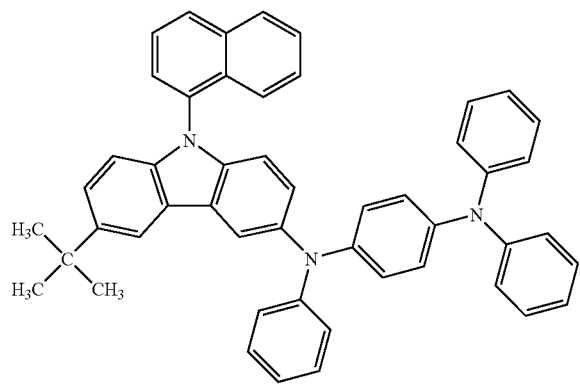
(46)
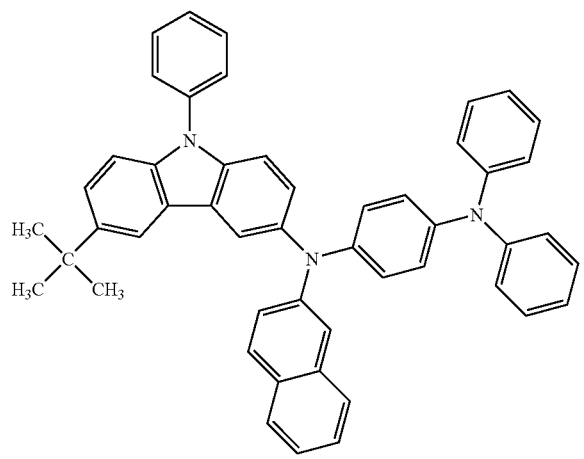
(47)
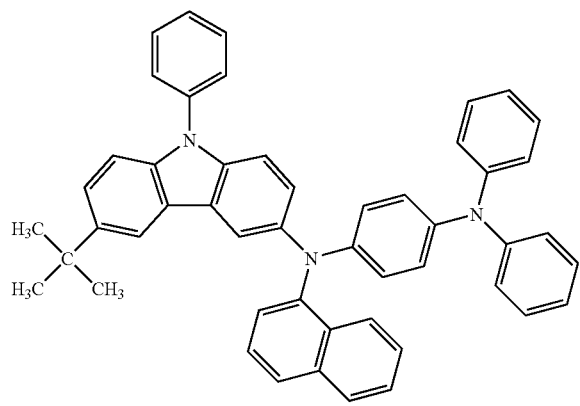
(48)
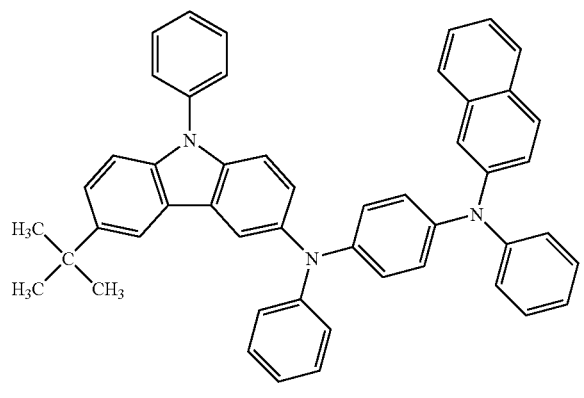

(49)
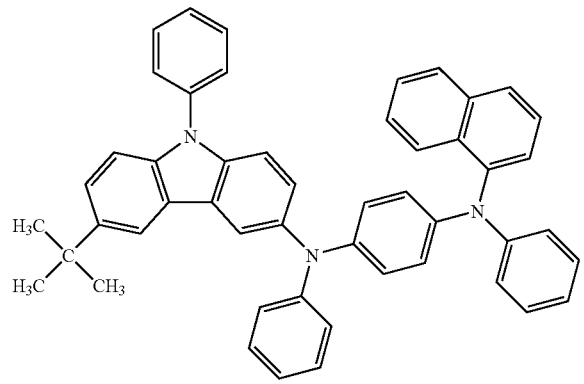
(50)
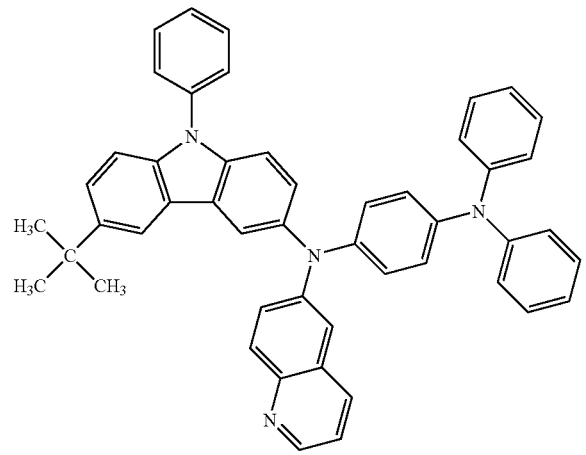
(51)
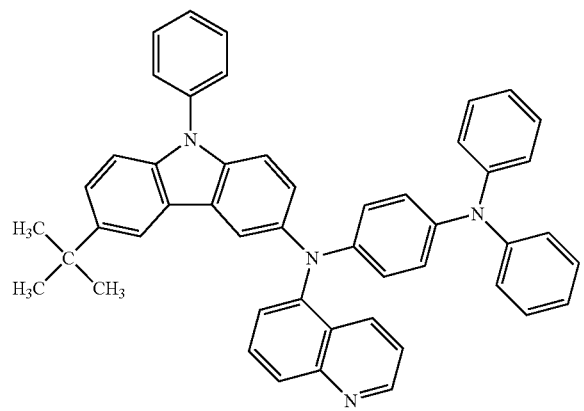
(52)
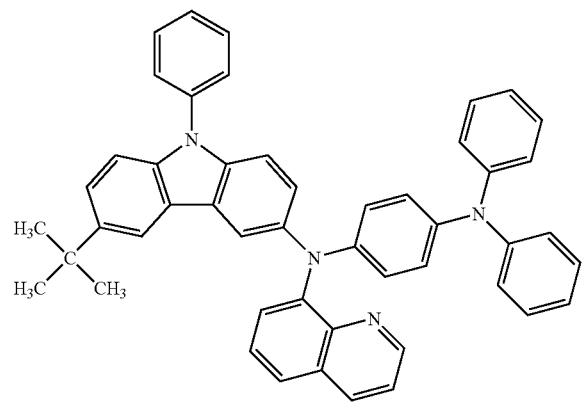
(53)
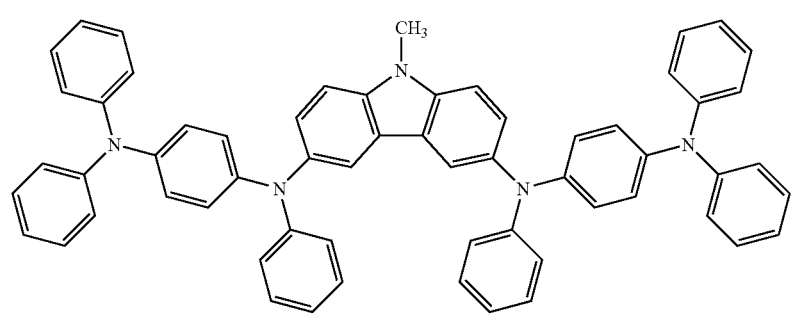
(54)
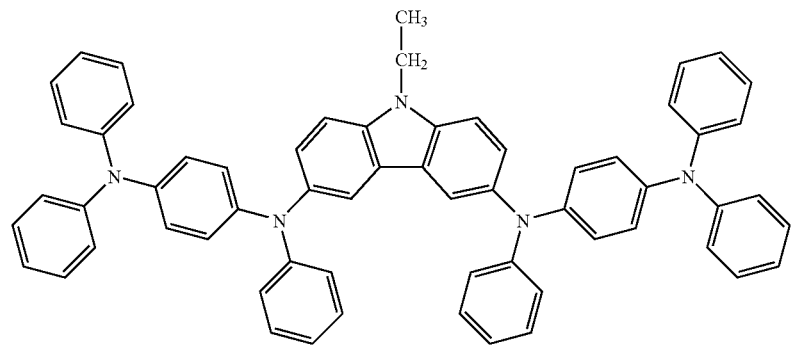

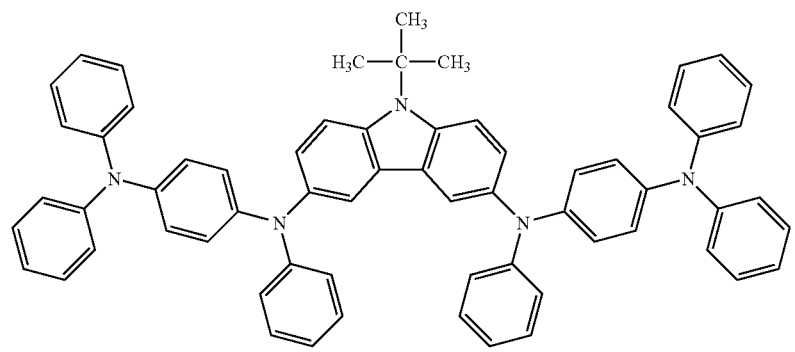
(55)
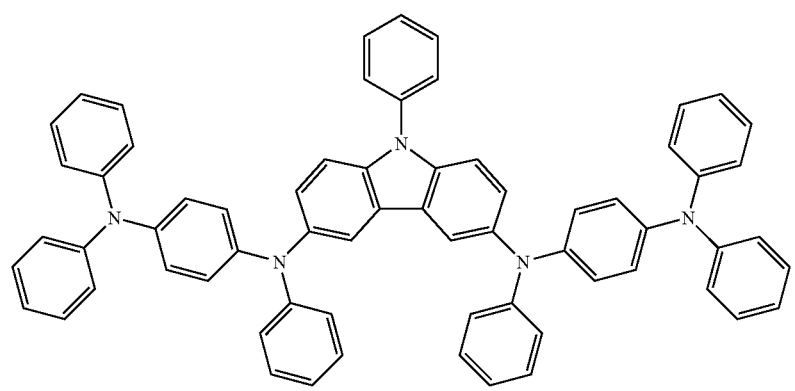
(56)
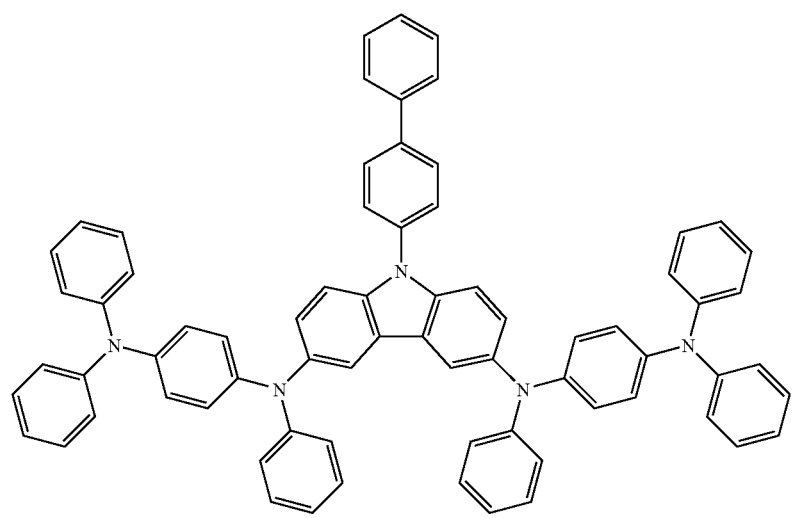
(57)

-continued
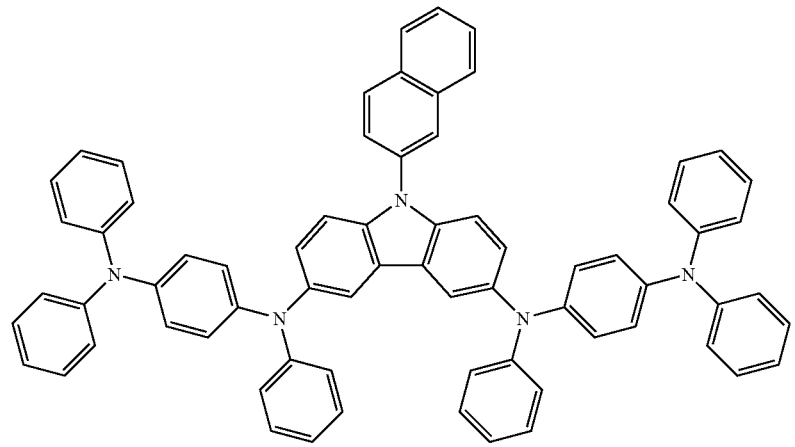
(58)
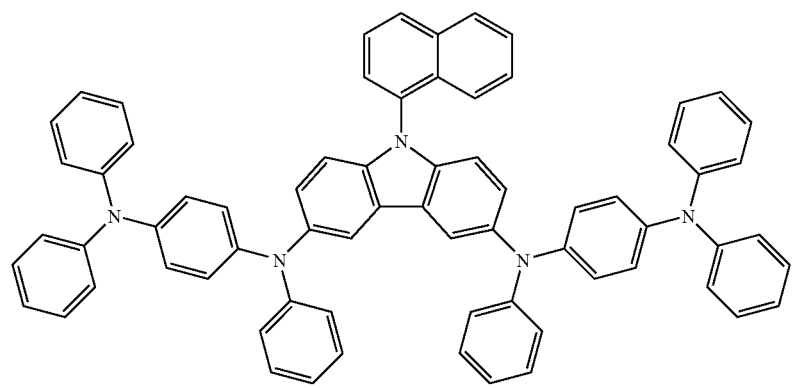
(59)
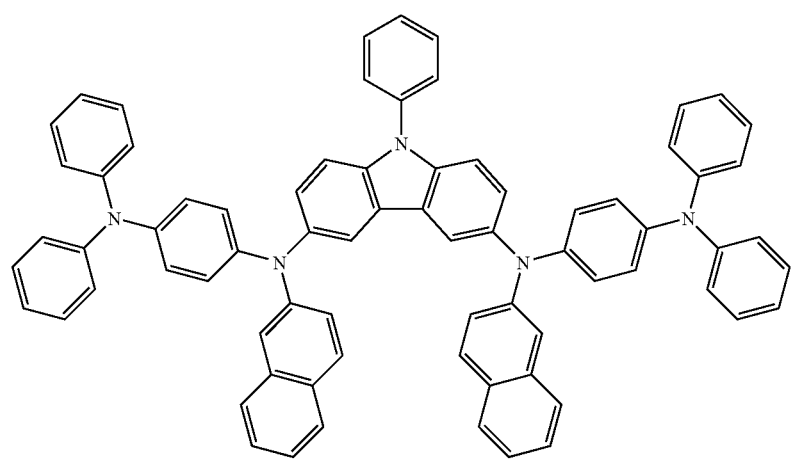
(60)

(61)
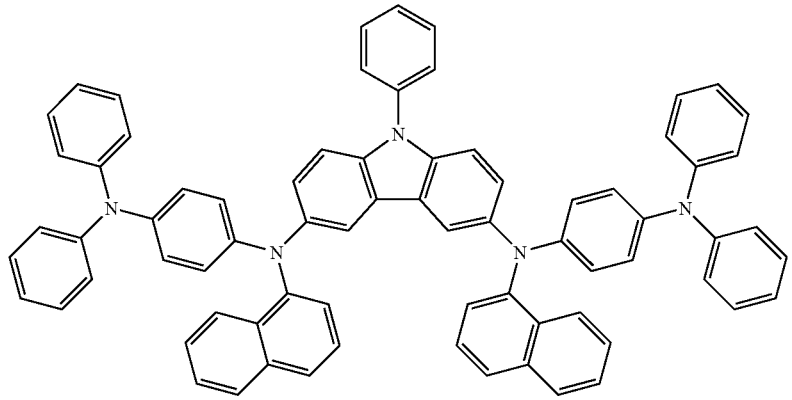
(62)
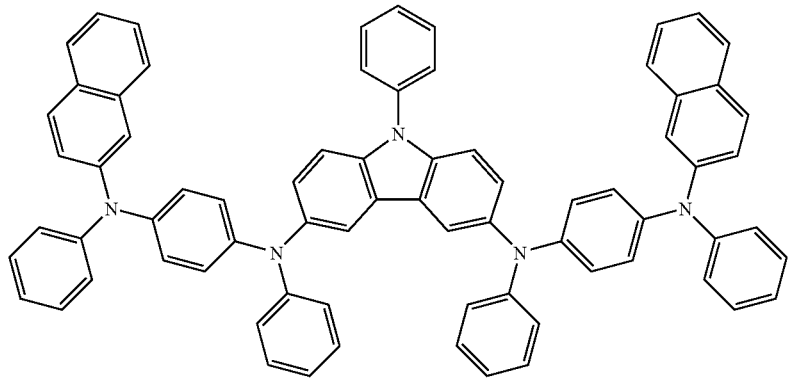
(63)
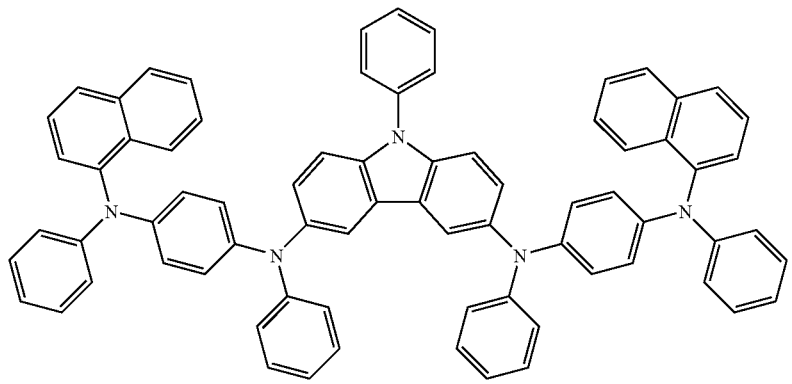
(64)
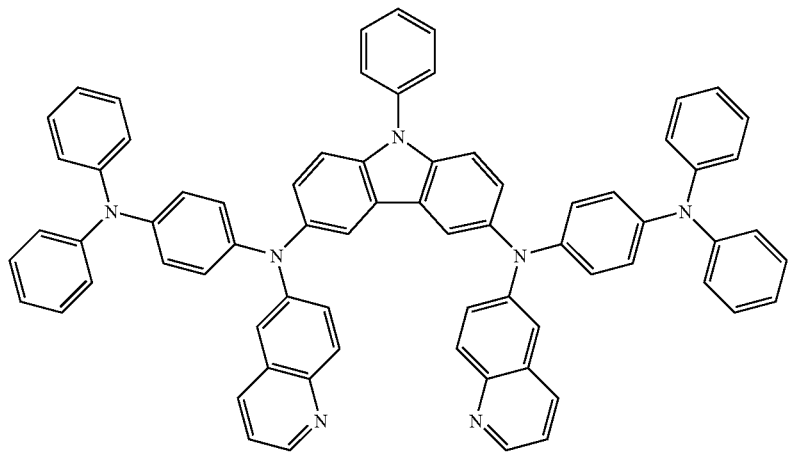

(65)
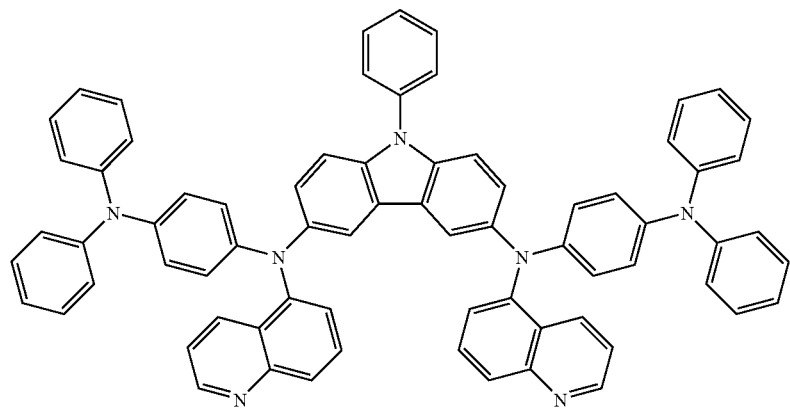
(66)
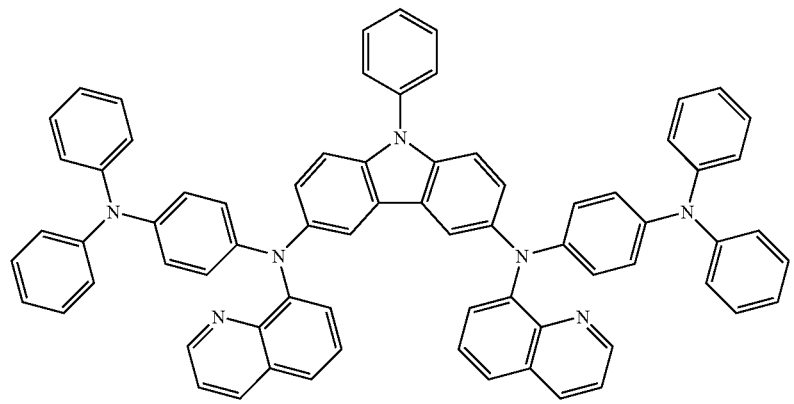
(67)
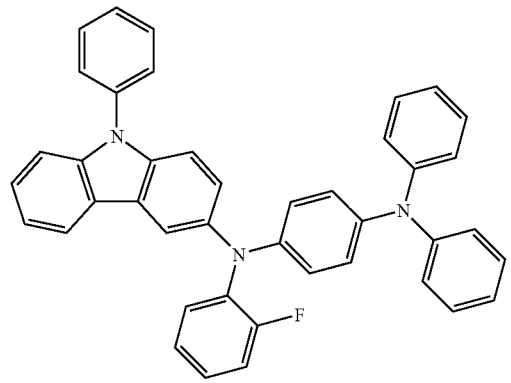
(68)
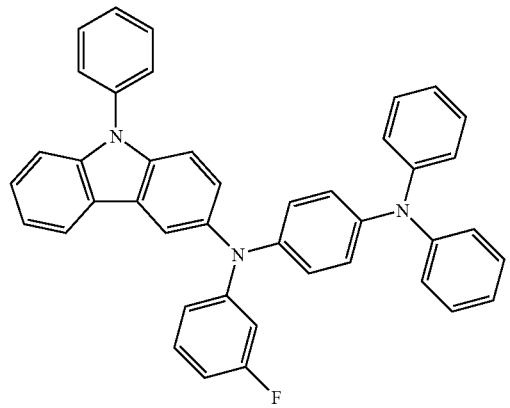
(69)
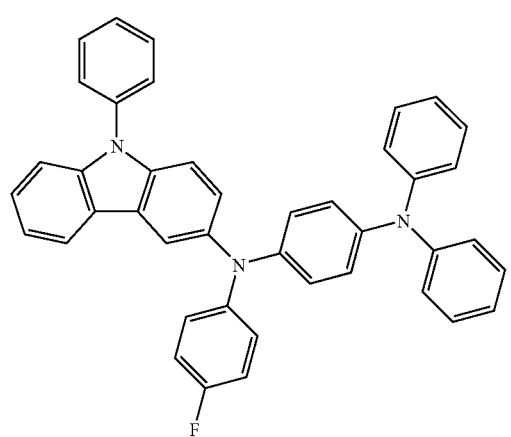
(70)
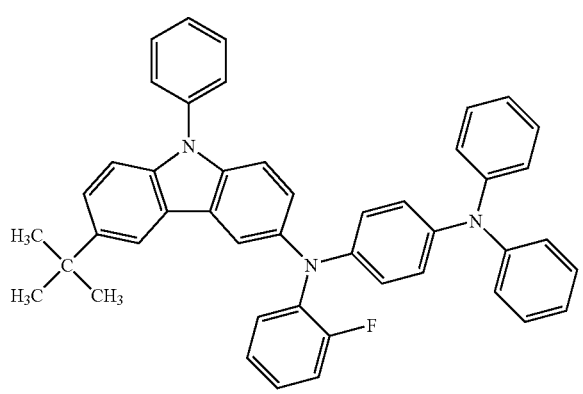

-continued
(71) (72)
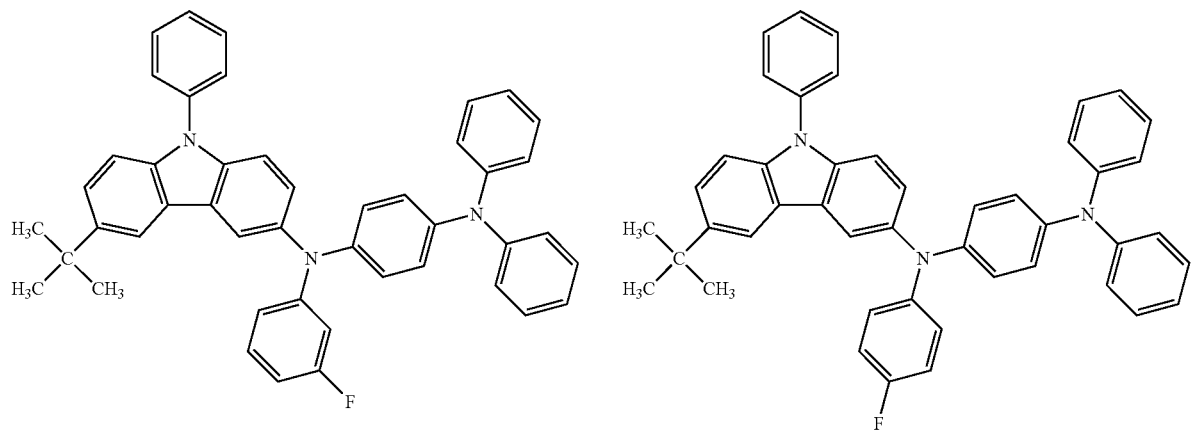
(73)
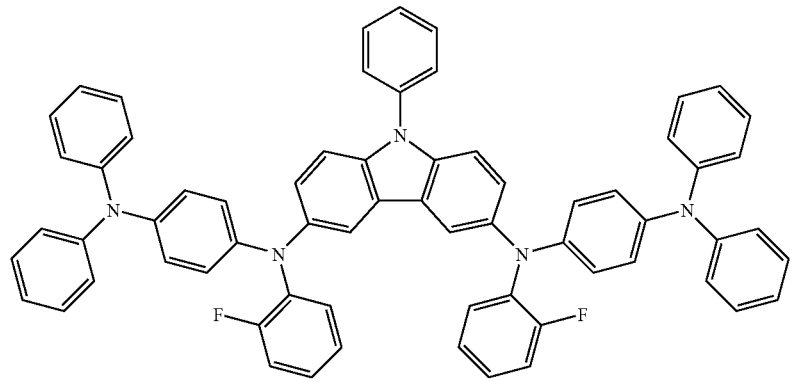
(74)
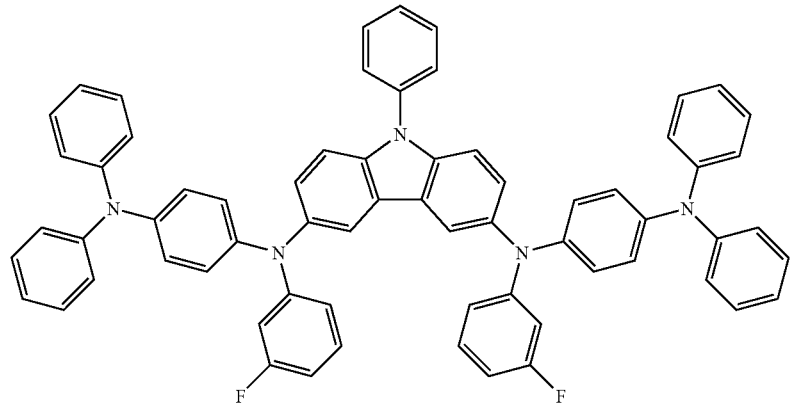
(75)
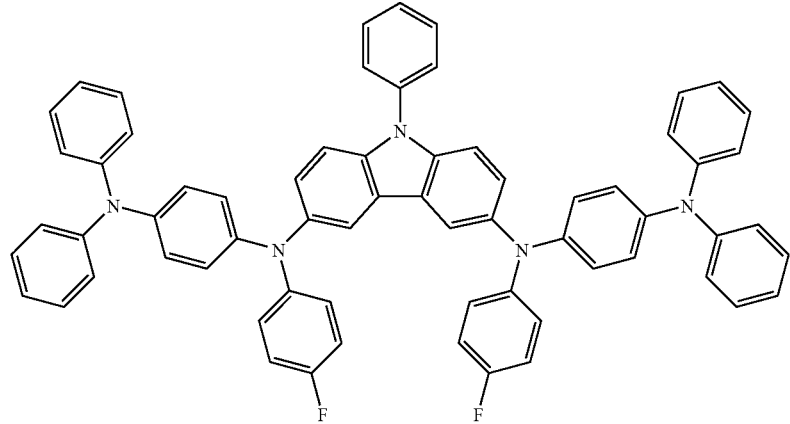

-continued
(76)
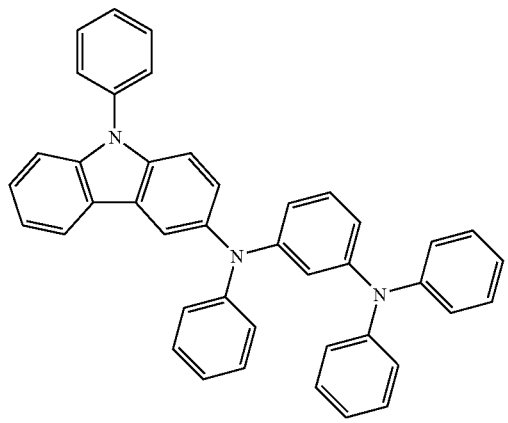
(77)
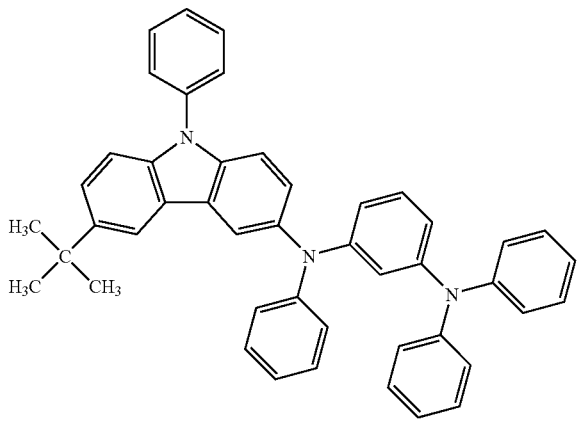
(78)
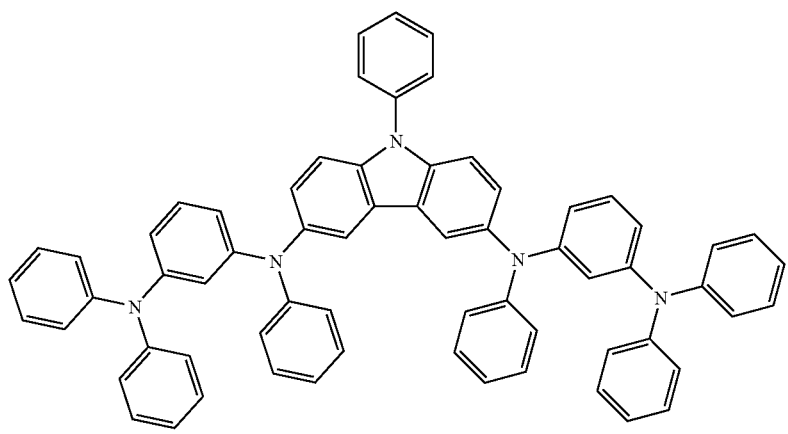
(79)
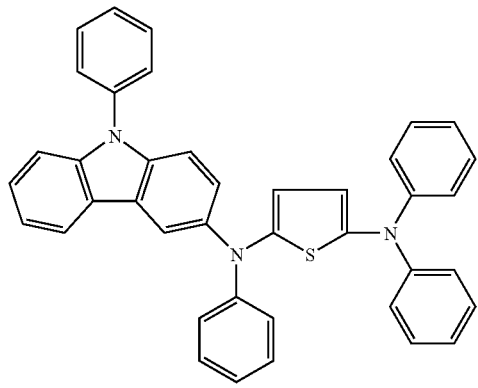
(80)
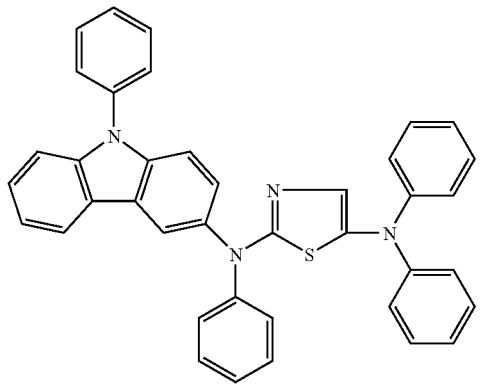
(81)
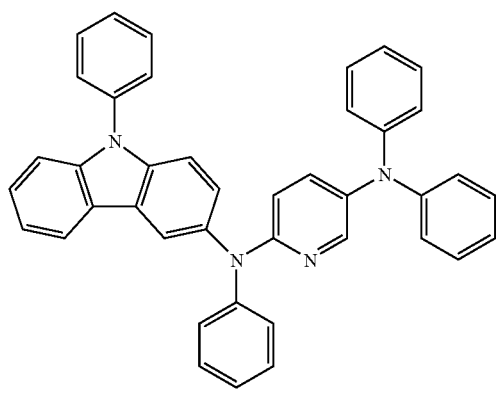
(82)
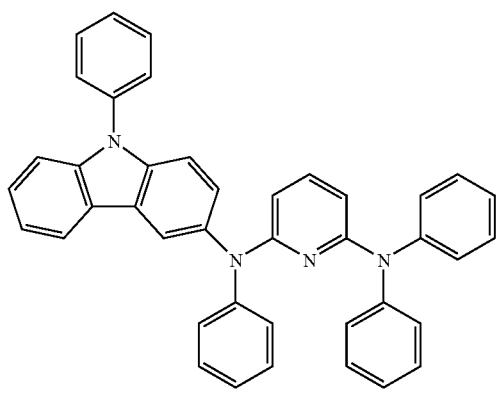

-continued
(83)
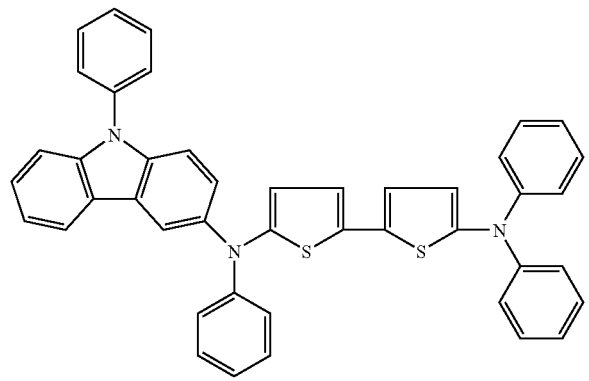
(84)
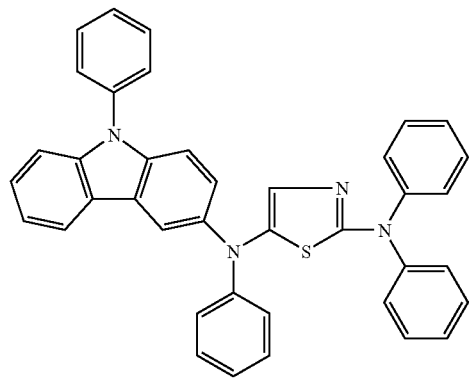
(85)
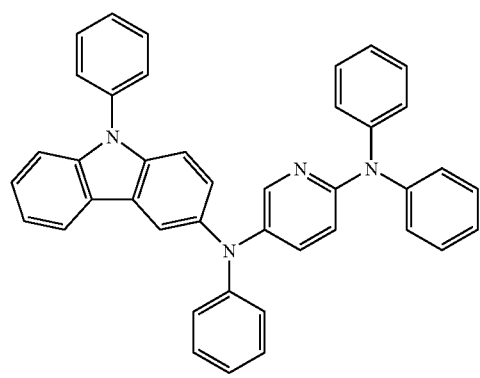
(86)
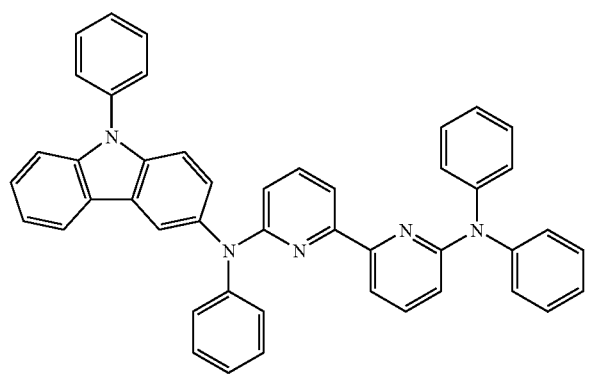
(87)
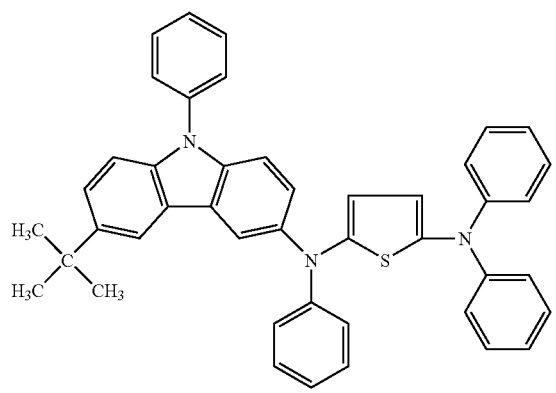
(88)
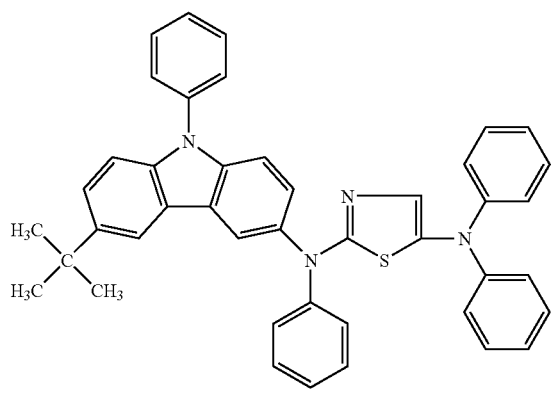
(89)
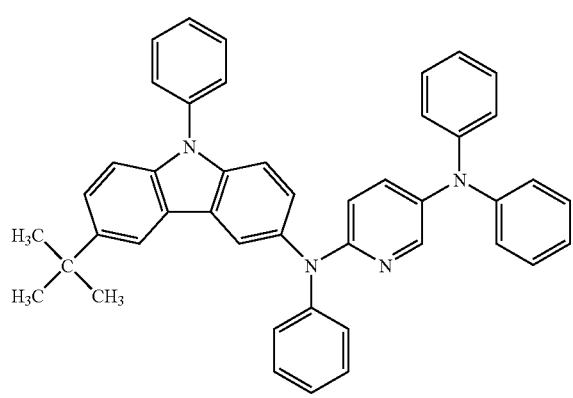
(90)
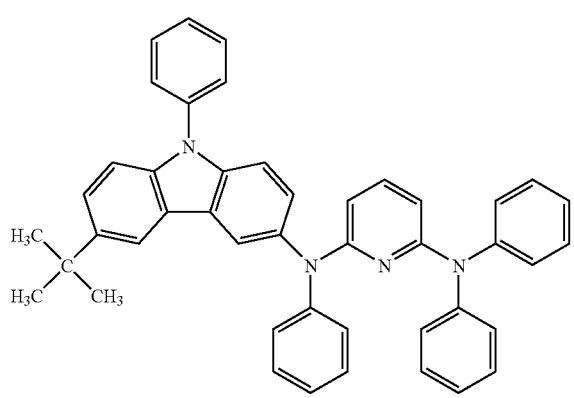

-continued
(91)
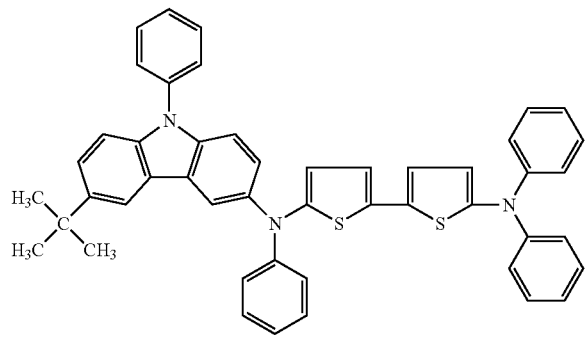
(92)
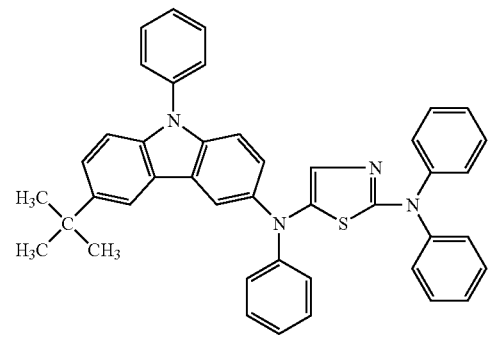
(93)
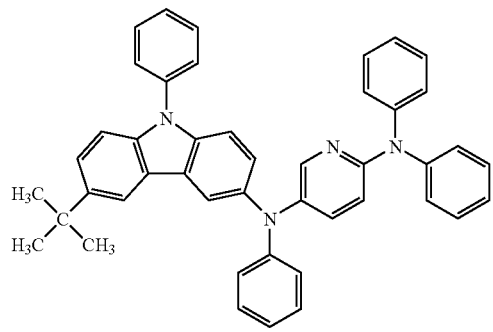
(94)
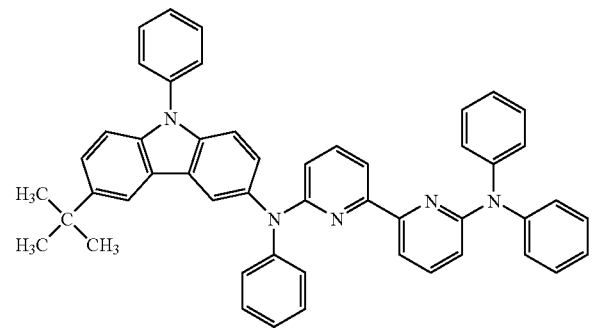
(95)
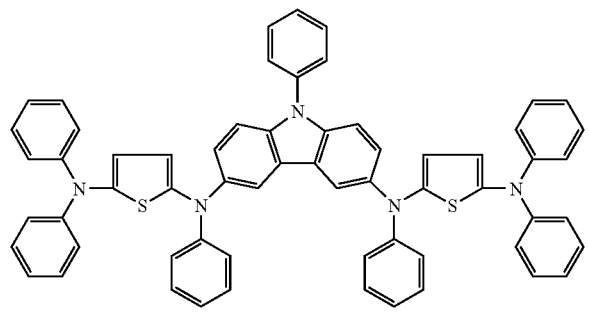
(96)
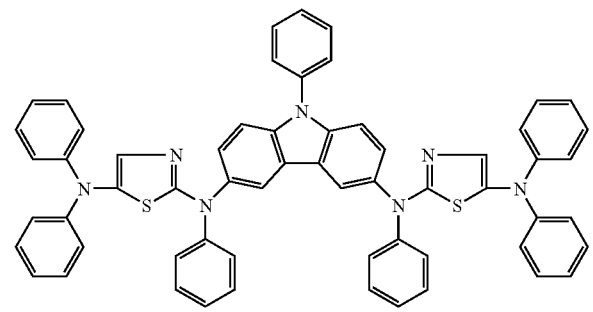
(97)
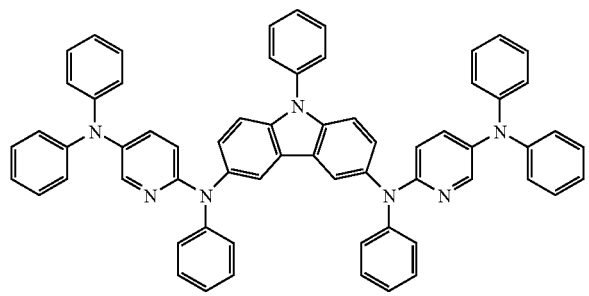
(98)
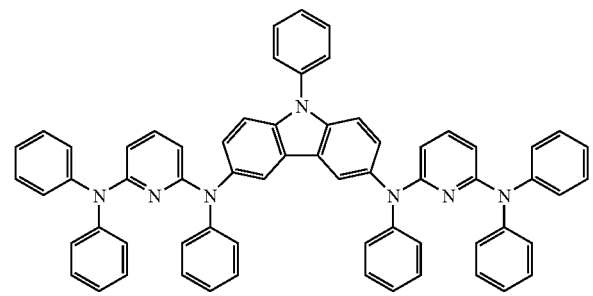

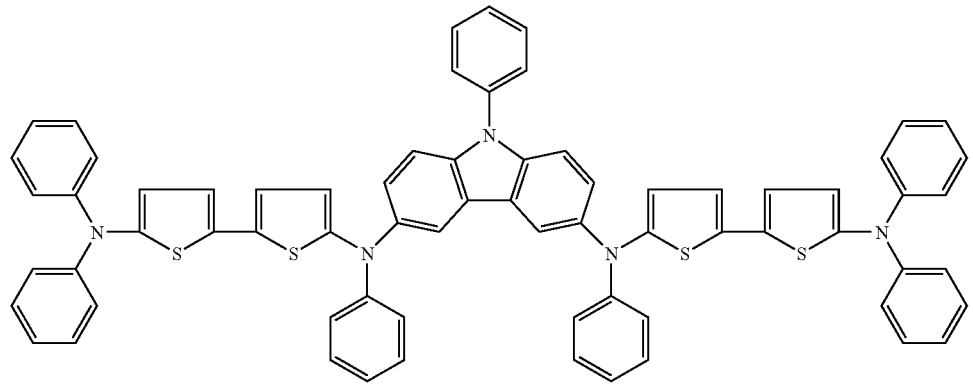

(99)

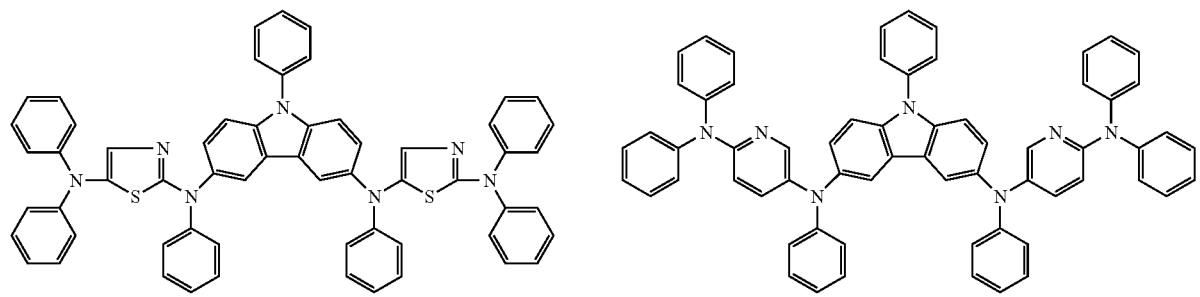

(100) (101)

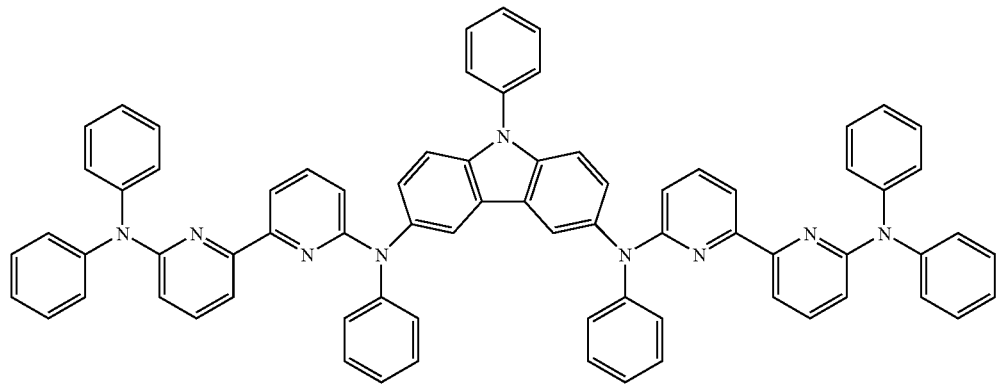

(102)

The carbazole derivatives represented by the structural formulas (25) to (38) are in the case where $R^2$ in the general formula (1) is hydrogen. The carbazole derivatives represented by the structural formulas (39) to (52) are in the case where $R^2$ in the general formula (1) is an alkyl group.

The carbazole derivatives represented by the structural formulas (53) to (66) each independently has a structure in which same substituents are bonded to a carbazole skeleton. These carbazole derivatives can be easily synthesized as compared with a carbazole derivative having a structure in that different substituents are bonded to a carbazole skeleton. That is, in the general formula (1), when $R^2$ has the general formula (2) and $Ar^1$, $Ar^2$ $Ar^3$ and X are the same as $Ar^4$, $Ar^5$, $Ar^6$ and Y, respectively, same substituents may be bonded to a carbazole skeleton, and therefore, a carbazole derivative can be easily synthesized.

Also, as represented by the structural formulas (67) to (75), a carbazole derivative may include a halogen element.

The substitution positions of X and Y in the general formula (1) and the general formula (2) may be at an ortho position represented by the structural formula (28), the structural formula (42) and the structural formula (56) but also at a meta position represented by the structural formulas (76) to (78). Alternatively, the substitution positions thereof may be at a para position.

Furthermore, as shown in the structural formulas (79) to (102), the substituents of X and Y in the general formula (1) and the general formula (2) may be heterocyclic rings.

As a method for synthesizing the carbazole derivative represented by the general formula (1), various kinds of reactions can be applied. For example, a method represented by the following reaction scheme (A-1) can be given. However, the method for synthesizing the carbazole derivative represented by the general formula (1) is not limited thereto.

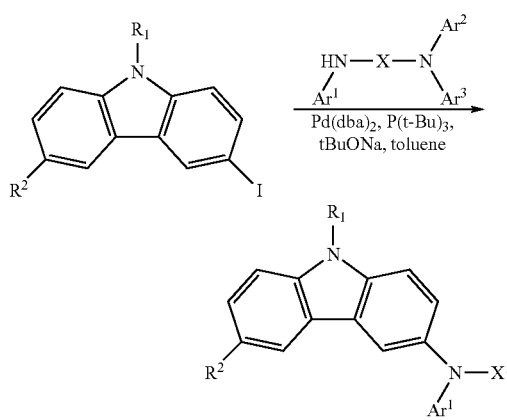
(A-1)

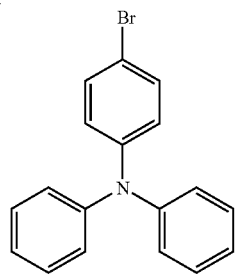

[Embodiments]

[Embodiment 1]

In Embodiment 1, a method for synthesizing a carbazole derivative used in the present invention will be described. A method for synthesizing 3-[N-(4-diphenylaminophenyl)-N-phenylamino]-9-phenylcarbazole (abbreviation: PCzDPA1), which is represented by a structural formula 28, will be described in Embodiment 1.

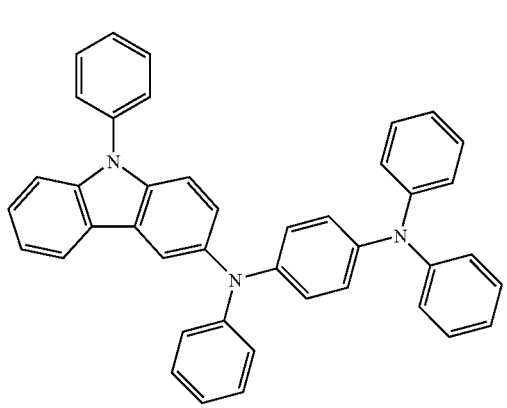

(28)

3-[N-(4-diphenylaminophenyl)-N-phenylamino]-9-phenylcarbazole

[Step 1]

Firstly, a method for synthesizing 4-bromotriphenylamine will be described. A synthetic scheme of 4-bromotriphenylamine is represented by (A-2).

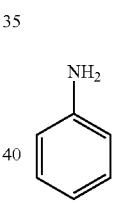

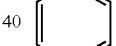

(A-2)

Specifically, 35.6 g (200 mmol) of N-bromo succinic imide (NBS) was added to 1.5 L of an ethyl acetate solution that contains 54.0 g (220 mmol) of triphenylamine. The mixture was stirred for overnight. After the mixture was concentrated to 1 L, the concentrated mixture was washed with 1 L of an aqueous solution that contains 5% of sodium acetate. The washed solution was further concentrated to about 50 ml, and precipitated by adding methanol to obtain 46.5 g (the yield: 73%) of a white powder.

[Step 2]

Next, a method for synthesizing N-(4-diphenylaminophenyl)-N-phenylamine will be described. A synthetic scheme of N-(4-diphenylaminophenyl)-N-phenylamine is represented by (A-3).

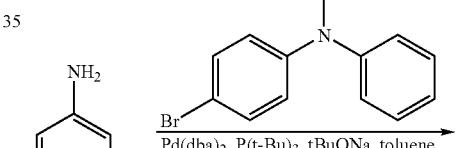

(A-3)

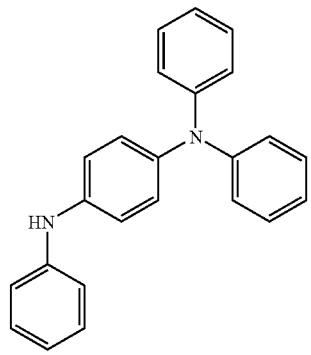

Firstly, 559 mg (6 mmol) of 4-bromotriphenylamine, 345 mg (0.6 mmol) of bis(dibenzylidene acetone) palladium (0) and 577 mg (6 mmol) of sodium tert-butoxide were mixed in a three-neck flask. After substituting nitrogen for air in the flask, 5 ml of dehydrated toluene was added in the mixture in the three-neck flask, and degassed for about 3 minutes until no bubbles remained in the mixture. Then, 559 mg (6 mmol) of aniline and 0.37 ml (1.8 mmol) of a hexane solution that contains 10% of tri-tert-butyl phosphine were added to the mixture and this mixture was stirred, while heating at 80° C., for 5 hours under nitrogen atmosphere. Then, it was con-

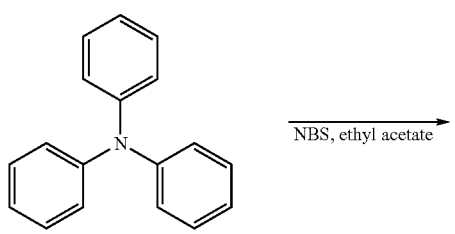

firmed by thin layer chromatography (TLC) that there was almost no 4-bromotriphenylamine, which was one of the raw materials, in the stirred mixture. Saturated saline was added to the product to terminate the reaction so that a toluene layer and a water layer were obtained. The water layer was extracted with about 100 ml of ethyl acetate, and this ethyl acetate layer and the toluene layer obtained previously were mixed. Magnesium sulfate was added to this mixed solution to remove moisture, and then the magnesium sulfate was filtered to be eliminated. After this filtrate was concentrated, a target matter was taken out by a silica gel column using a solvent containing ethyl acetate and hexane with a ratio of 1:20. After the target matter was taken out, the target matter was further concentrated, and then hexane was added to the concentrated target matter. Then, by using an ultrasonic washing machine, a target matter was precipitated. After obtaining the precipitate, the precipitate was concentrated again and collected to obtain 700 mg (the yield: 42%) of a cream-colored powder.

[Step 3]

A method for synthesizing 3-iodine-9-phenylcarbazole will be described. A synthetic scheme of N-phenyl-3-iodocarbazole is represented by (A-4).

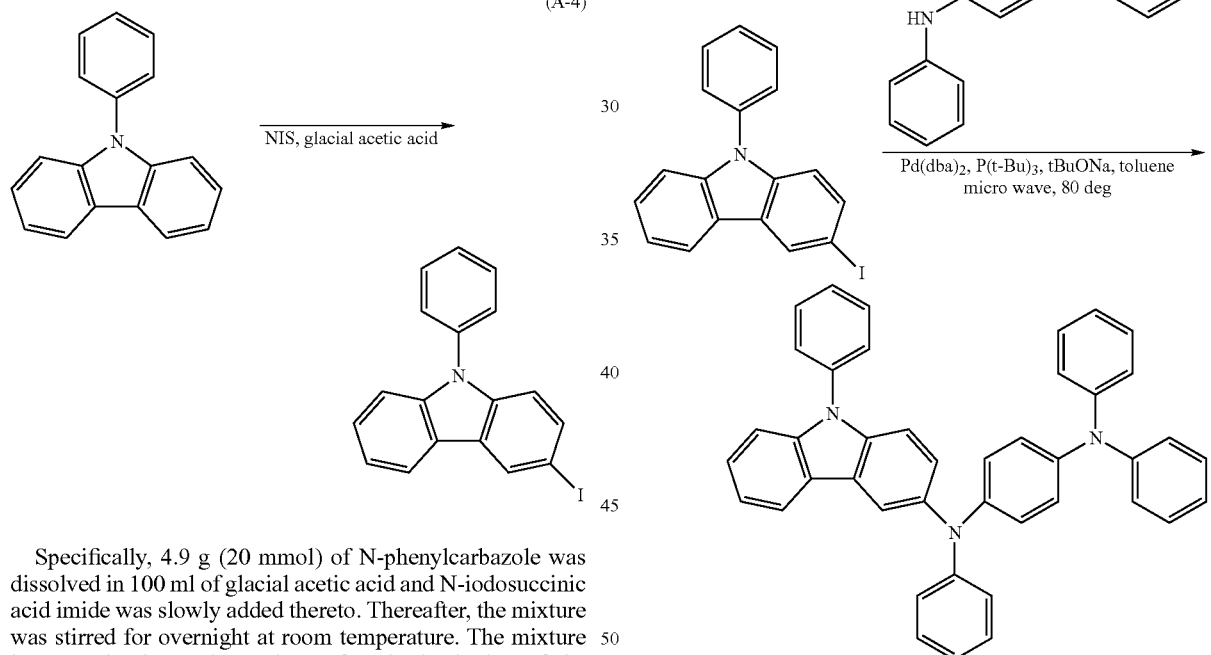

Specifically, 4.9 g (20 mmol) of N-phenylcarbazole was dissolved in 100 ml of glacial acetic acid and N-iodosuccinic acid imide was slowly added thereto. Thereafter, the mixture was stirred for overnight at room temperature. The mixture became cloudy 2.5 hours later after the beginning of the reaction. A light-orange precipitate was suspended in the mixture 3.5 hours later. This suspension was dripped into 300 ml of saturated saline to obtain a light salmon-pink block. This block was washed with water three times, and thereafter 200 ml of ethyl acetate was added to the block to dissolve the block in the ethyl acetate. This solution was washed with a sodium hydrogen carbonate solution, and then with water. Magnesium sulfate was added to remove moisture. Afterwards, the magnesium sulfate was filtered to be eliminated. Hexane was added to the resultant solution. The mixture was heated and recrystallized to obtain 5 g (the yield: 68%) of a white powder.

Further, 3-iodine-9-phenylcarbazole can also be synthesized in accordance with the method described below. Specifically, 24.3 g (100 mmol) of N-phenylcarbazole was dissolved in 600 ml of glacial acetic acid, and 22.5 g (100 mmol) of N-iodosuccinic acid imide was slowly added thereto. Thereafter, the mixture was stirred for overnight at room temperature. The mixture became cloudy 2.5 hours later after the beginning of the reaction. A light-orange precipitate was suspended in the mixture 3.5 hours later. This suspension was filtered. The filtrate was washed with a sodium hydrogen carbonate solution, and then with water. Finally, the resultant was washed with methanol so as to obtain 24.7 g (the yield: 67%) of a white powder.

[Step 4]

A method for synthesizing 3-[N-(4-diphenylaminophenyl)-N-phenylamino]-9-phenylcarbazole (abbreviation: PCzDPA1) will be described. A synthetic scheme of PCzDPA1 is represented by (A-5).

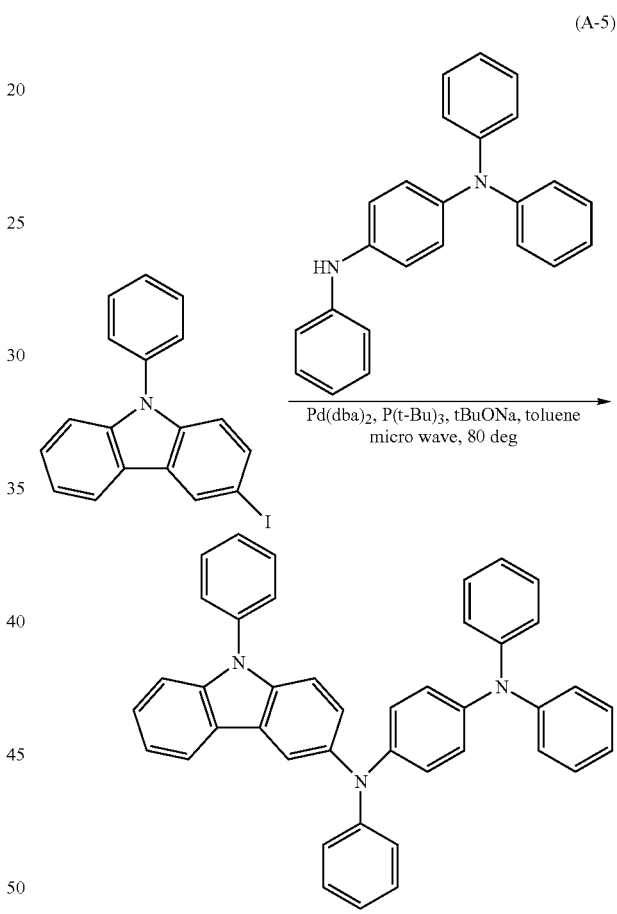

Figure 13:
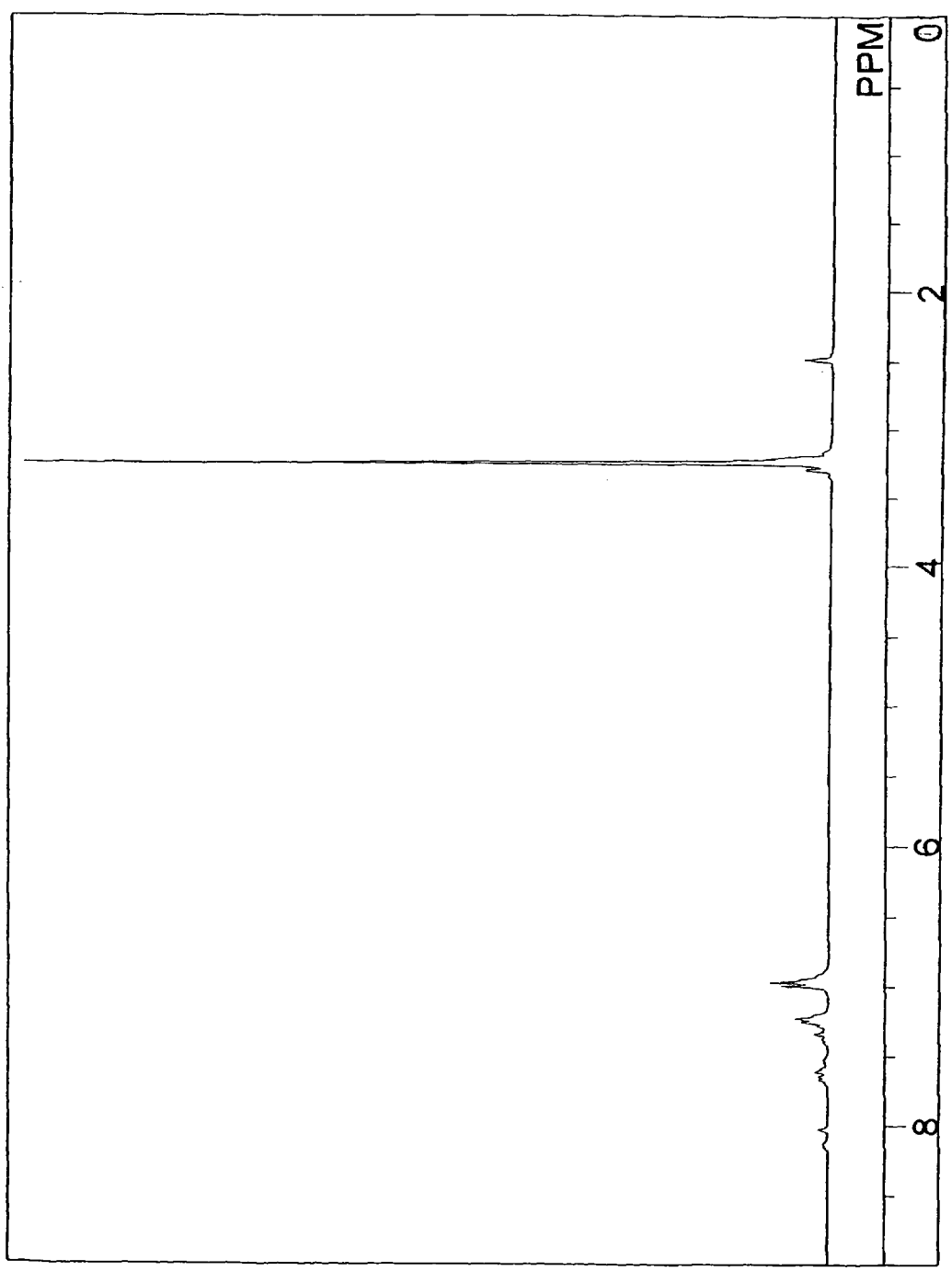
FIG. 13 shows a $^1$H-NMR chart of 3-[N-(4-diphenylaminophenyl)-N-phenylamino]-9-phenylcarbazole that is a carbazole derivative of the present invention.
Figure 14:
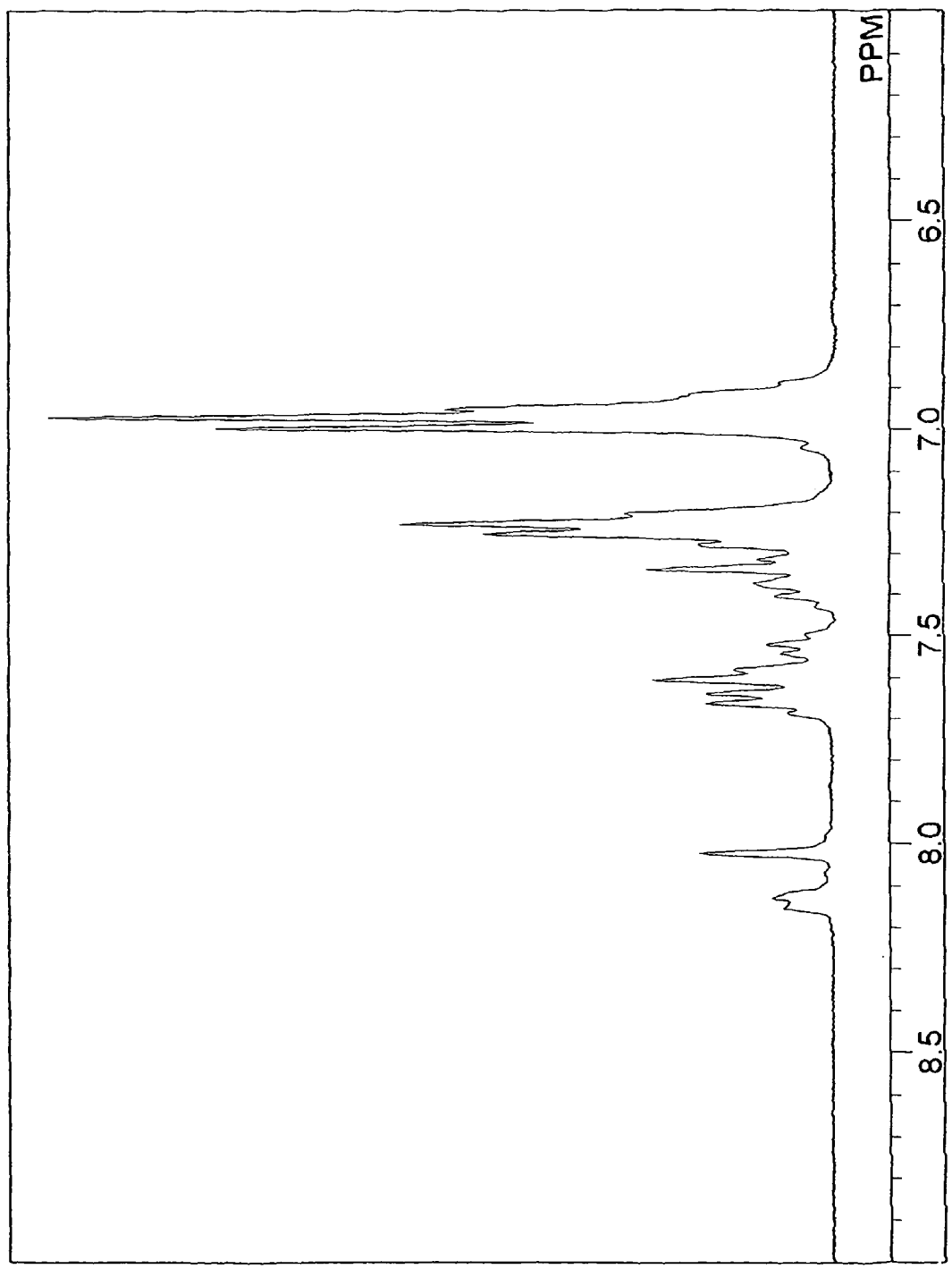
FIG. 14 shows a $^1$H-NMR chart of 3-[N-(4-diphenylaminophenyl)-N-phenylamino]-9-phenylcarbazole that is a carbazole derivative of the present invention.

Specifically, 627.64 mg (1.7 mmol) of 3-iodine-9-phenylcarbazole, 672.86 mg (2.0 mmol) of N-(4-diphenylaminophenyl)-N-phenylamine, 57.5 mg (0.1 mmol) of bis(dibenzylidene acetone) palladium and 335 mg (3.5 mmol) of sodium tert-butoxide were mixed in a three-neck flask. Nitrogen was substituted for air inside of the three-neck flask. Then, 3.5 ml of dehydrated toluene was added in the mixture in the three-neck flask, and degassed for about 3 minutes. Subsequently, 0.4 ml of tri-tert-butyl phosphine (a 10 wt % hexane solution) was added to the mixture and the content was mixed by lightly shaking the container up and down. The content was stirred further for 10 minutes while being irradiated and heated at 80° C. with 200 W of microwave. After the reaction, saturated saline was added and a product was extracted with 100 ml of ethyl acetate. Further, magnesium sulfate was added to the product to remove moisture, and then the magnesium sulfate was filtered to be removed. The filtrate was concentrated, and a target matter was taken out by a silica gel column using a solvent containing ethyl acetate and hexane with a ratio of 1:1. Hexane was added to the thus-obtained solution and the resultant was heated to be recrystallized. Consequently, 650 mg (the yield: 65%) of a cream-colored powder was obtained. The NMR data is shown below. The $^1$H-NMR (300 MHz, DMSO-d); δ=6.89-7.05 (m, 13H), 7.21-7.28 (m, 9H), 7.32-7.43 (m, 3H), 7.50-7.69 (m, 5H), 8.02 (s, 1H), 8.14 (d, j=7.2, 1H). Also, a chart of $^1$H-NMR is shown in FIG. 13. Also, a chart of an enlarged portion of FIG. 13 in the range of 6.0 ppm and 9.0 ppm is shown in FIG. 14.

Figure 17:
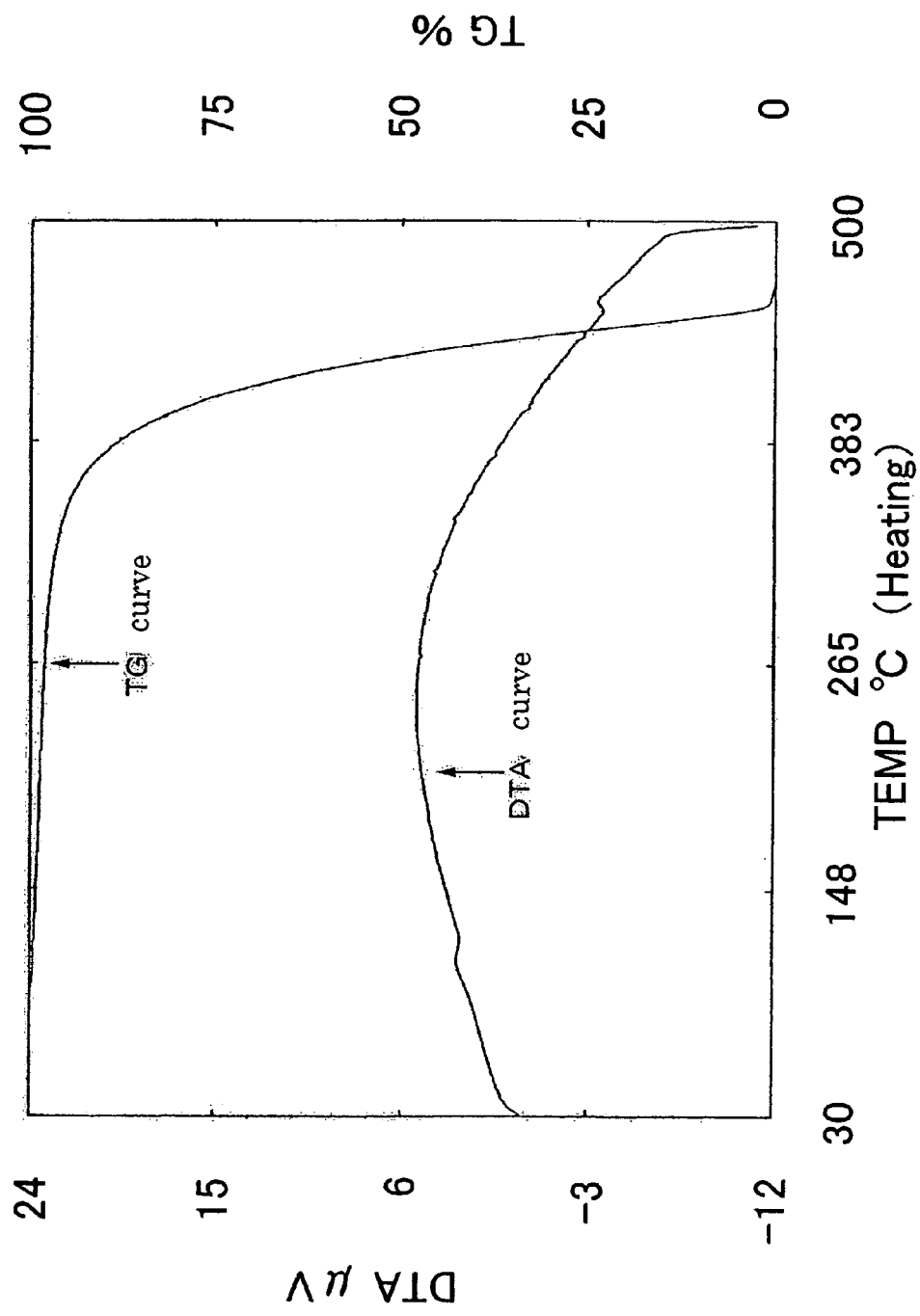
FIG. 17 is a graph showing results of thermogravimetric measurement of 3-[N-(4-diphenylaminophenyl)-N-phenylamino]-9-phenylcarbazole that is a carbazole derivative of the present invention.

The thermogravimetry-differential thermal analysis (TG-DTA) of the thus obtained PCzDPA1 was performed. The results are shown in FIG. 17. In FIG. 17, a longitudinal axis on the left side indicates the heat quantity (μV) and a longitudinal axis on the right side indicates the gravity (%; the gravity at the start of measurement is expressed as 100%). Furthermore, a lower horizontal axis represents the temperature (° C.). By utilizing a thermo-gravimetric/differential thermal analyzer (TG/DTA 320, Seiko Instruments Inc.), thermophysical properties were measured at the temperature rising velocity of 10° C./min under nitrogen atmosphere. As a result, because of the gravity-temperature relation (thermogravimetric measurement), the temperature by which the gravity becomes 95% or less of the gravity at the start of the measurement, was 375° C. under normal pressure. Also, when the measurement was carried out by using a melting-point apparatus (ATM-01, As One Corporation), the melting point was 185 to 186° C.

Although the method for synthesizing 3-[N-(4-diphenylaminophenyl)-N-phenylamino]-9-phenylcarbazole (abbreviation: PCzDPA1) by using 3-iodine-9-phenylcarbazole is described in this embodiment, PCzDPA1 can also be synthesized by using 3-bromo-9-phenylcarbazole. The 3-bromo-9-phenylcarbazole is less expensive than the 3-iodine-9-phenylcarbazole. On the other hand, when using the 3-iodine-9-phenylcarbazole, the reaction time can be shortened compared to using the 3-bromo-9-phenylcarbazole. Also, even when the amounts of a catalyst (which is bis(dibenzylidene acetone) palladium (0) in the above mentioned scheme) and a ligand (which is tri-tert-butyl phosphine in the above mentioned scheme) are reduced to about 1/10, the reaction still proceeds.

[Embodiment 2]

A method for synthesizing a carbazole derivative used in the present invention will be described. In Embodiment 2, a method for synthesizing 3,6-bis[N-(4-diphenylaminophenyl)-N-phenylamino]-9-phenylcarbazole (abbreviation: PCzDPA2), which is represented by a structural formula 56, will be described.

(56)

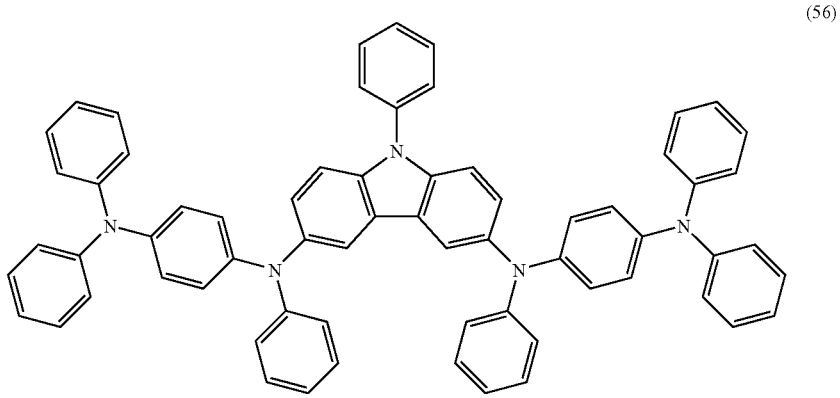 [SMILES: c1ccc(N(c2ccccc2)c2ccc(N(c3ccccc3)c3ccc4c(c3)c3cc(N(c5ccccc5)c5ccc(N(c6ccccc6)c6ccccc6)cc5)ccc3n4-c3ccccc3)cc2)cc1]

3,6-bis[N-(4-diphenylaminophenyl)-N-phenylamino]-9-phenylcarbazole

[Step 1]

A method for synthesizing 3,6-diiodo-9-phenylcarbazole will be described. A synthetic scheme of 3,6-diiodo-9-phenylcarbazole is represented by (A-6).

(A-6)

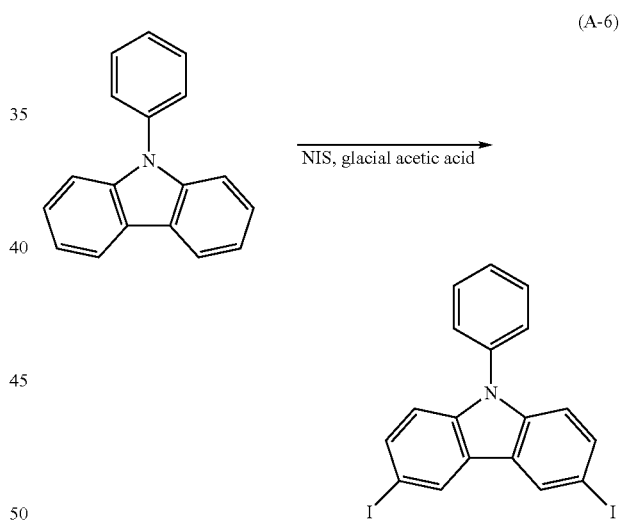

Specifically, 24.3 g (100 mmol) of N-phenylcarbazole was dissolved in 700 ml of glacial acetic acid, and 44.9 g (200 mmol) of N-iodosuccinic acid imide was slowly added thereto. Then, the mixture was stirred for overnight at room temperature. The mixture became cloudy 2.5 hours later after the beginning of the reaction. The precipitation was started 3.5 hours later. The thus obtained precipitate was filtered. The filtrate was added to a sodium hydrogen carbonate solution and suspended to be naturalized. The product was filtered and washed with water. Then, the resultant was dried so as to obtain 47 g (the yield: 95%) of a white powder.

[Step 2]

Next, a method for synthesizing 3,6-bis[N-(4-diphenylaminophenyl)-N-phenylamino]-9-phenylcarbazole (abbreviation: PCzDPA2) will be described. A synthetic scheme of PCzDPA2 is shown in (A-7).

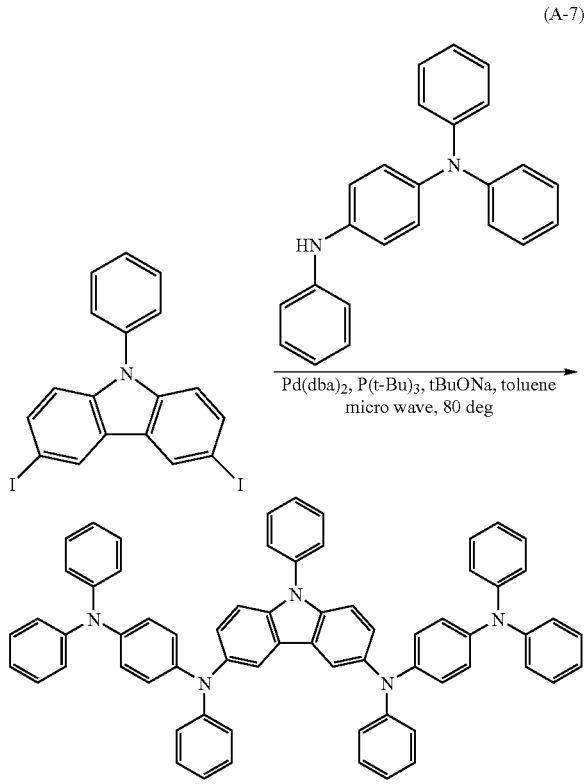

(A-7)

Figure 15:
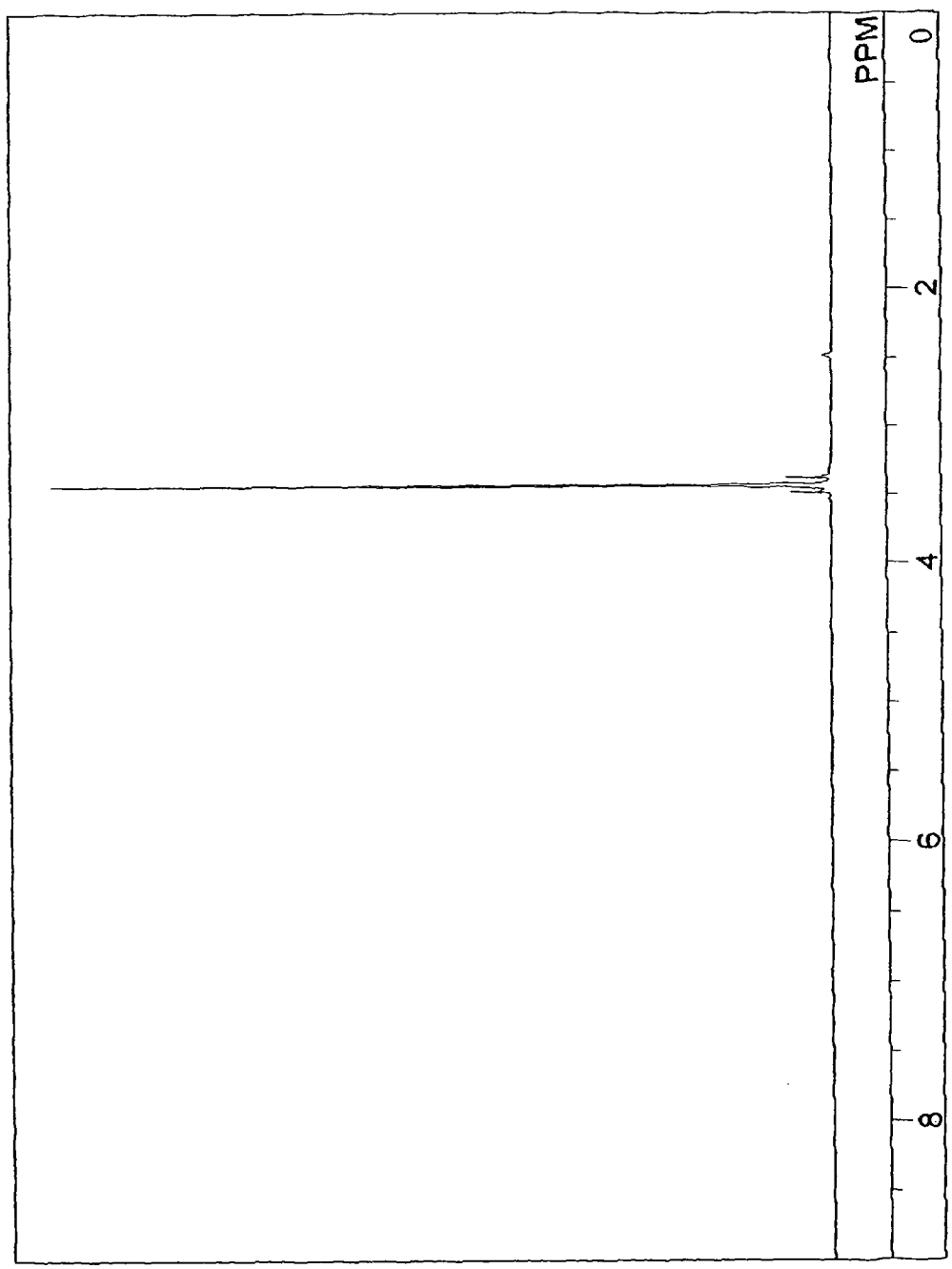
FIG. 15 shows a $^1$H-NMR chart of 3,6-bis[N-(4-diphenylaminophenyl)-N-phenylamino]-9-phenylcarbazole that is a carbazole derivative of the present invention.
Figure 16:
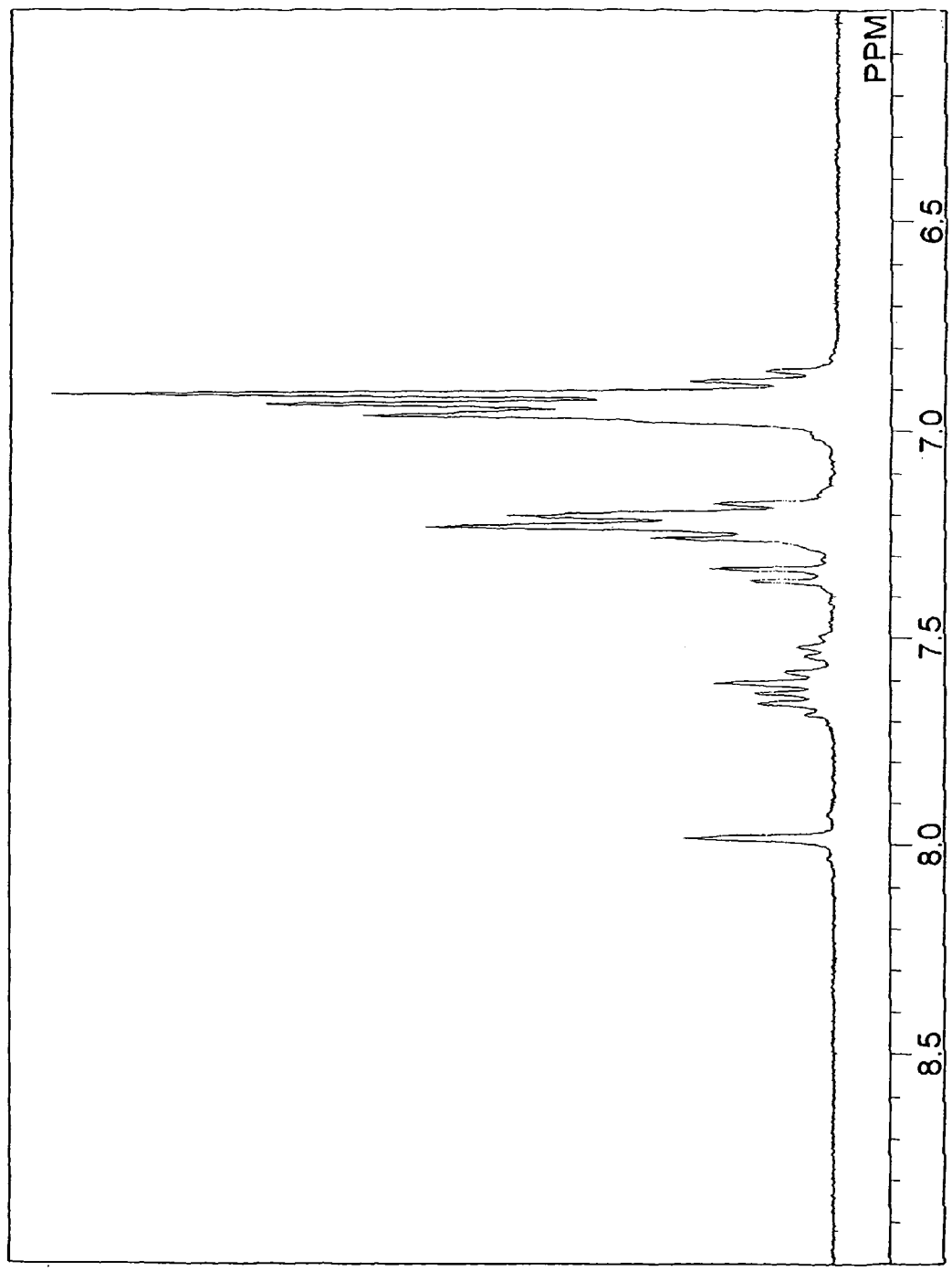
FIG. 16 shows a $^1$H-NMR chart of 3,6-bis[N-(4-diphenylaminophenyl)-N-phenylamino]-9-phenylcarbazole that is a carbazole derivative of the present invention.

Specifically, 5.44 g (11 mmol) of 3,6-diiodo-9-phenylcarbazole, 9 g (27 mmol) of N-(4-diphenylaminophenyl)-N-phenylamine, 500 mg (0.87 mmol) of bis(dibenzylidene acetone) palladium and 3.35 mg (35 mmol) of sodium tert-butoxide were mixed in a three-neck flask. Nitrogen was substituted for air inside of the three-neck flask. Subsequently, 100 ml of dehydrated toluene was added to the mixture in the three-neck flask. The mixture added with the dehydrated toluene was degassed for about 3 minutes. Then, 4 ml of tri-tert-butyl phosphine (a 10 wt % hexane solution) was added to the mixture and then this mixture was stirred, while heating at 80° C., for 16 hours under nitrogen atmosphere. After the reaction, saturated saline was added and a product was extracted with 200 ml of ethyl acetate. Further, magnesium sulfate was added to the product to remove moisture, and then the magnesium sulfate was filtered to be removed. The filtrate was concentrated, and the concentrated filtrate was dripped in a solvent containing ethyl acetate and hexane with a ratio of 1:10 to be suspended. Afterwards, a supernatant of the suspension was collected. The supernatant was purified by a silica gel column using a solvent containing ethyl acetate and hexane with a ratio of 1:10. The resultant was concentrated to obtain a cream-colored powder. In addition, an insoluble component of the suspension was purified by a silica gel column using a solvent that contains 5:1 toluene and hexane. The resultant was concentrated to obtain a cream-colored powder. The cream-colored powders obtained in the above described manner were target matters. Specifically, 6.5 g of the cream-colored powders in total were obtained and the yield was 75%. The NMR data is shown below. The $^1$H-NMR (300 MHz, DMSO-d); δ=6.86-6.97 (m, 26H), 7.18-7.36 (m, 14H), 7.35 (d, j=9.0, 2H), 7.52-7.66 (m, 5H), 7.99 (s, 2H). Also, a chart of $^1$H-NMR is shown in FIG. 15. Also, a chart of an enlarged portion of FIG. 15 in the range of 6.0 ppm and 9.0 ppm is shown in FIG. 16.

Figure 18:
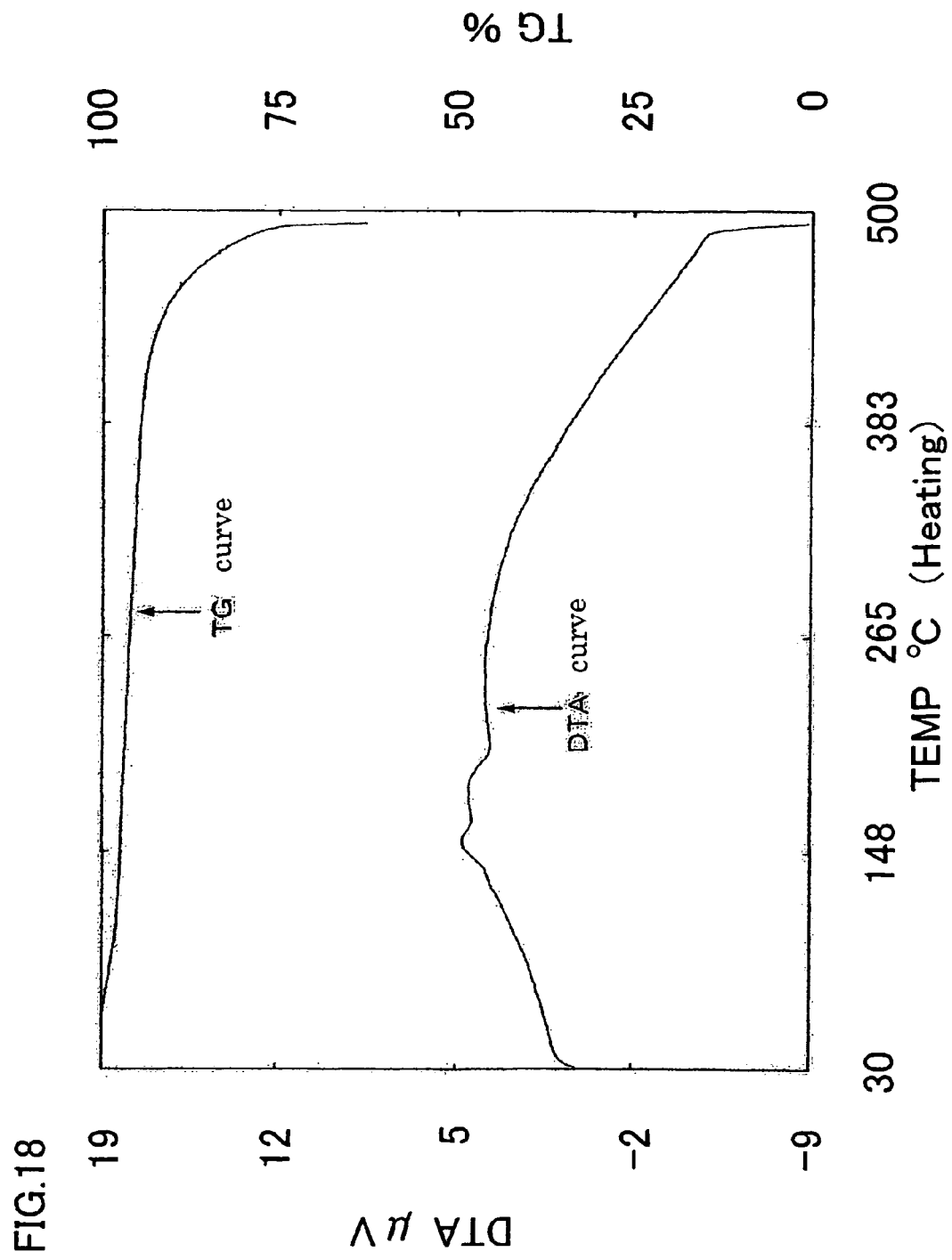
FIG. 18 is a graph showing results of thermogravimetric measurement of 3,6-bis[N-(4-diphenylaminophenyl)-N-phenylamino]-9-phenylcarbazole that is a carbazole derivative of the present invention.

The thermogravimetry-differential thermal analysis (TG-DTA) of the thus-obtained PCzDPA2 was performed. The results are shown in FIG. 18. In FIG. 18, a longitudinal axis on the left side indicates the heat quantity (μV) and a longitudinal axis on the right side indicates the gravity (%; the gravity at the start of measurement is expressed as 100%). Furthermore, a lower horizontal axis represents the temperature (° C.). By utilizing a thermo-gravimetric/differential thermal analyzer (TG/DTA 320, Seiko Instruments Inc.), thermophysical properties were measured at the temperature rising velocity of 10° C./min under nitrogen atmosphere. As a result, because of the gravity-temperature relation (thermogravimetric measurement), the temperature by which the gravity becomes 95% or less of the gravity at the start of the measurement was 460° C. under normal pressure. Also, when the measurement was carried out by using a melting-point apparatus (ATM-01, As One Corporation), a melting point was 173 to 181° C.

[Embodiment 3]

A specific example of a layer that contains a carbazole derivative represented by the general formula (1) and an inorganic compound exhibiting an electron accepting property with respect to the carbazole derivative will be described in Embodiment 3. As the carbazole derivative, 3,6-bis[N-(4-diphenylaminophenyl)-N-phenylamino]-9-phenylcarbazole (abbreviation: PCzDPA2) represented by the structural formula (56), which was synthesized in Embodiment 2, was used. As the inorganic compound, molybdenum oxide was used.

Firstly, a glass substrate was fixed on a substrate holder inside of a vacuum evaporation apparatus. Then, PCzDPA2 and molybdenum oxide (VI) were independently provided in separate evaporation sources of a resistance heating type, and the layer containing PCzDPA2 and molybdenum oxide was formed by co-evaporation of PCzDPA2 and molybdenum oxide while air in the vacuum evaporation apparatus was evacuated. In this case, PCzDPA2 was vaporized at a film formation rate of 0.4 nm/s, whereas molybdenum oxide with 1/4 of the amount of PCzDPA2 (mass ratio) was vaporized. Therefore, the molar ratio between the PCzDPA2 and the molybdenum oxide was 1:1.5. Further, the thickness of the film containing PCzDPA2 and molybdenum oxide was set to be 50 nm.

Figure 11:
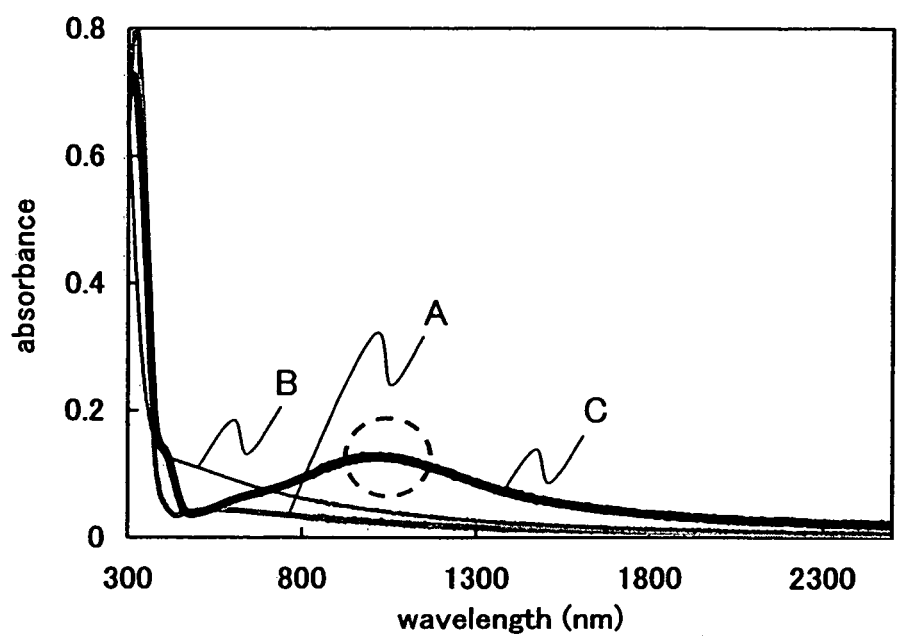
FIG. 11 is a graph showing absorption spectrum of a mixed film containing 3,6-bis[N-(4-diphenylaminophenyl)-N-phenylamino]-9-phenylcarbazole and molybdenum oxide.

A measurement result of the absorption spectrum of the thus obtained mixed film containing PCzDPA2 and molybdenum oxide is shown as a line C in FIG. 11. For comparison, the absorption spectrum of a film only containing PCzDPA2 (a line A) and the absorption spectrum of a film only containing molybdenum oxide (a line B) are also shown in FIG. 11.

As it can be seen in FIG. 11, the mixed film represented by the line C exhibits a new type of absorption (circled by a dashed line in the drawing) that cannot be seen in the film only containing PCzDPA2 or the film only containing molybdenum oxide. This is because electrons are transported between PCzDPA2 and molybdenum oxide, and it is thought that the molybdenum oxide accepts the electrons from the PCzDPA2 and holes are generated in the PCzDPA2.

Consequently, in the mixed film containing PCzDPA2 and molybdenum oxide formed in this embodiment, carriers are internally generated, and hence, the driving voltage of a light emitting element can be reduced.

[Embodiment 4]

Figure 12:
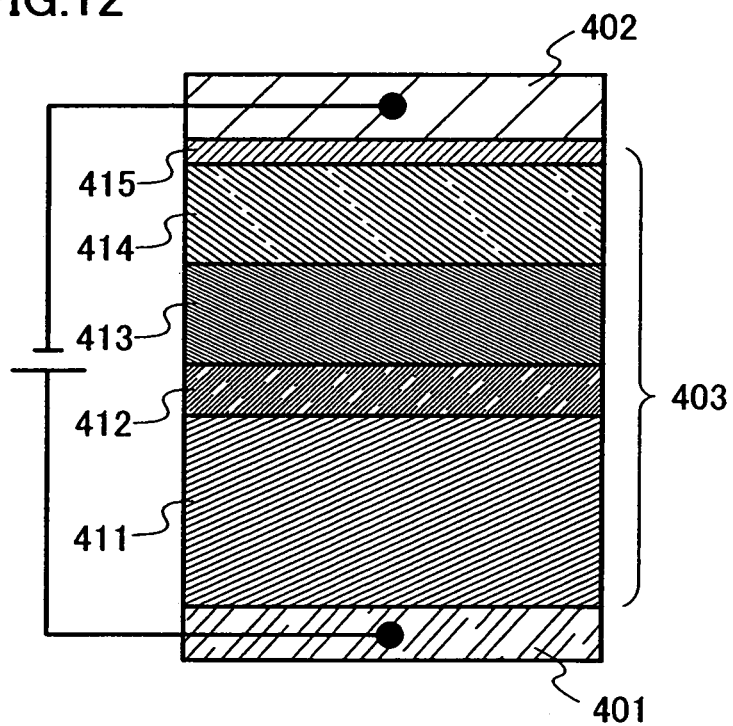
FIG. 12 is a diagram showing an example of a light emitting element of the present invention.

An example of a light emitting element of the present invention will be described in Embodiment 4 with reference to FIG. 12. In Embodiment 4, a light emitting element containing PCzDPA2 represented by the structural formula (56)

and molybdenum oxide that is an inorganic compound exhibiting an electron accepting property with respect to PCzDPA2 will be described.

An indium tin oxide film containing silicon is formed as a first electrode 401 that serves as an anode by sputtering.

Next, a first layer 411 is formed over a first electrode by co-evaporation of PCzDPA2, which is represented by the structural formula (56), and molybdenum oxide exhibiting the electron accepting property with respect to PCzDPA2 such that the molar ratio between the PCzDPA2 and the molybdenum oxide is 1:1. The thickness of the first layer 411 is set to be 120 nm. Further, the co-evaporation is an evaporation method by which evaporation is carried out simultaneously from a plurality of evaporation sources.

Next, a hole transporting layer 412 is formed on the first layer 411 using NPB by vacuum evaporation to have a thickness of 10 nm. Next, a light emitting layer 413 containing tris(8-quinolinolate) aluminum (abbreviation: Alq$_3$) and coumarin 6 is formed by co-evaporation of Alq$_3$ and coumarin 6 to have a thickness of 40 nm. In this embodiment, the Alq$_3$-coumarin 6 mass ratio was adjusted to be 1:0.005. Therefore, the coumarin 6 was dispersed in Alq$_3$. Next, an electron transporting layer 414 including Alq$_3$ was formed on the light emitting layer by vacuum evaporation of Alq$_3$ to have a thickness of 40 nm. Next, an electron injecting layer 415 including LiF was formed on the electron transporting layer by vacuum evaporation of LiF to have a thickness of 1 nm. Subsequently, a second electrode 402 was formed on the electron injecting layer using aluminum by vacuum evaporation to have a thickness of 200 nm.

As described above, the light emitting element that has the layer containing PCzDPA2 and molybdenum oxide, which is an inorganic compound exhibiting the electron accepting property with respect to PCzDPA2, can be formed. Since the light emitting element of Embodiment 4 has the layer containing PCzDPA2 and the molybdenum oxide, which is the inorganic compound exhibiting the electron accepting property with respect to PCzDPA2, carriers are generated internally, and therefore, this light emitting element has excellent carrier injecting and transporting properties. As a consequence, the driving voltage of the light emitting element of this embodiment can be reduced.

Furthermore, since the carriers are internally generated, the light emitting element has a high conducting property. Therefore, when the thickness of the first layer 411 is increased, the increase in driving voltage can be suppressed. Consequently, the short-circuiting can be prevented and the color purity can be improved by an optical design without increasing the driving voltage.

Moreover, a layer 403 containing a light emitting substance of the light emitting element of this embodiment includes not only an organic compound but also an inorganic compound, and hence, the light emitting element has an excellent heat resistance property along with long term durability.

[Embodiment 5]

A method for synthesizing a carbazole derivative used in the present invention will be described. In Embodiment 5, a method for synthesizing 3-[N-(4-diphenylaminophenyl)-N-(1-naphthyl)amino]-9-phenylcarbazole (abbreviation: PCz-TPN1), which is represented by a structural formula 33, will be described.

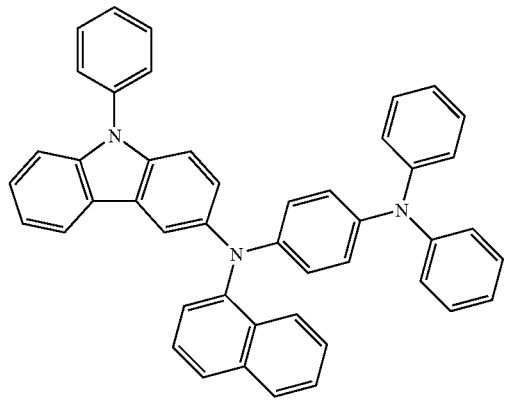

(33)

[Step 1]
Firstly, a method for synthesizing N-(4-diphenylaminophenyl)-N-(1-naphthyl) amine will be described. A synthetic scheme of N-(4-diphenylaminophenyl)-N-(1-naphthyl) amine is shown in (A-8).

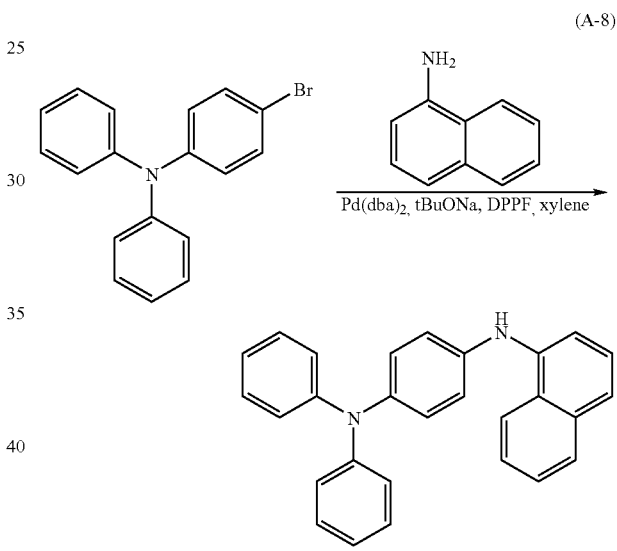

(A-8)

Figure 22:
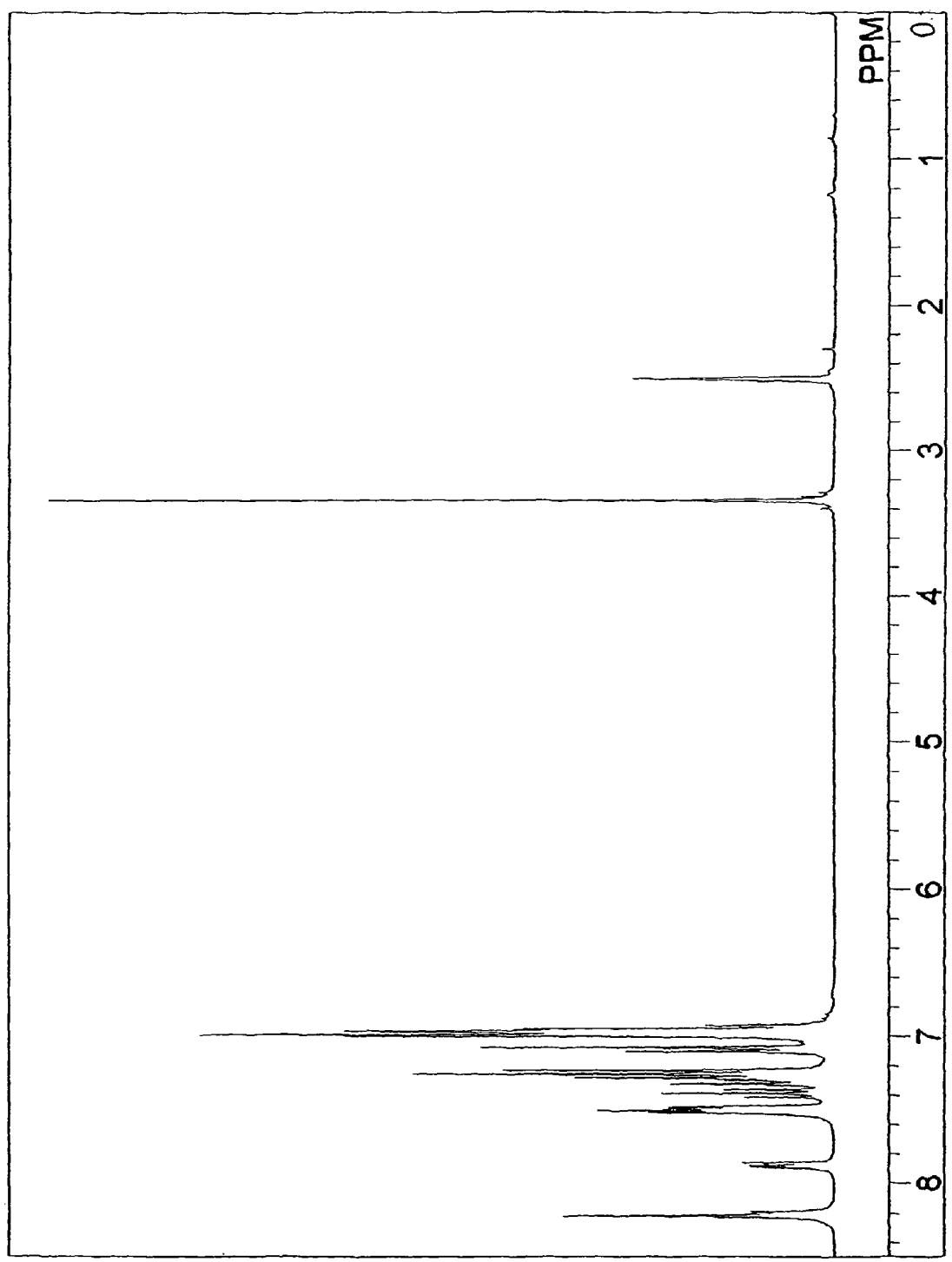
FIG. 22 shows a $^1$H-NMR chart of N-(4-diphenylaminophenyl)-N-(1-naphthyl) amine.
Figure 23:
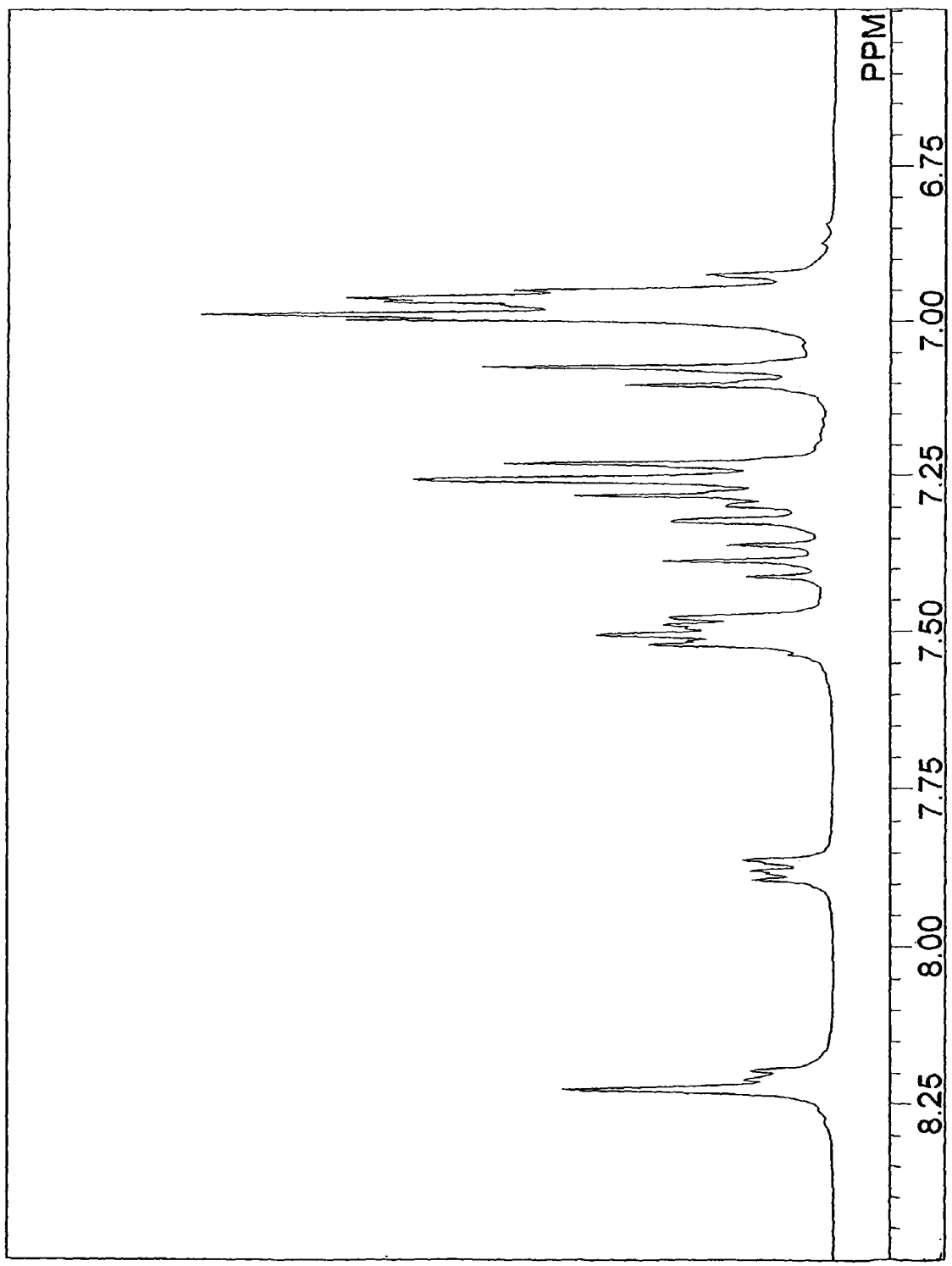
FIG. 23 shows a $^1$H-NMR chart of N-(4-diphenylaminophenyl)-N-(1-naphthyl) amine.
Figure 24:
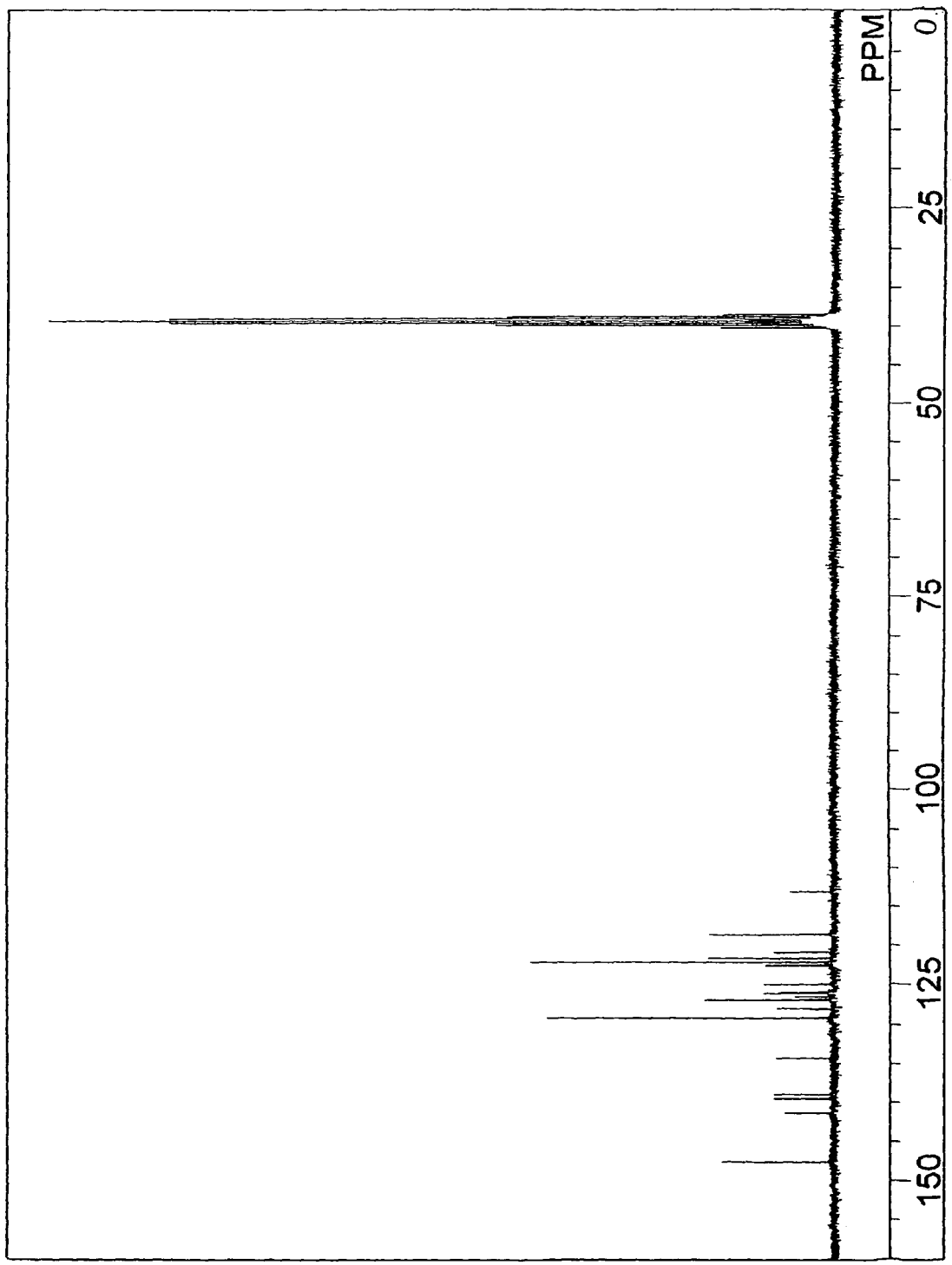
FIG. 24 shows a $^{13}$C-NMR chart of N-(4-diphenylaminophenyl)-N-(1-naphthyl) amine.

Specifically, 4-bromotriphenylamine (3.2 g, 10 mmol), 1-aminonaphthalene (1.4 g, 10 mmol), bis(dibenzylidene acetone) palladium (0) (58 mg, 0.1 mmol), and sodium tert-butoxide (3.0 g, 30 mmol) were mixed in a flask. After nitrogen was substituted for air in the flask, 40 ml of dehydrated xylene was added to the mixture in the flask. The mixture added with the dehydrated xylene was degassed for about 3 minutes until no bubbles remained in the mixture. Then, 1,1-bis(diphenyl phosphino) ferrocene (540 mg, 1.0 mmol) was added to the mixture and the mixture was stirred, while heating at 90° C., for 6.5 hours under nitrogen atmosphere. Then, about 300 ml of toluene was added to the mixture, and the mixture was filtered through florisil, alumina and celite. The thus obtained filtrate was washed with water and saturated saline. Magnesium sulfate was added to these organic layers and then dried. The product was filtered and filtrate was concentrated. A subject solution was taken out from the concentrated filtrate by a silica gel column chromatography (toluene: hexane=3:7). The thus obtained solution was concentrated and added with hexane. The product was applied with supersonic. Subsequently, the product was filtered to obtain a solid that is 1.8 g (the yield: 46%) of a while powder of N-(4-diphenylaminophenyl)-N-(1-naphthyl) amine. The NMR data is shown below. The $^1$H-NMR (300 MHz, DMSO-d); δ=6.93-7.00 (m, 8H), 7.09 (d, j=8.7, 2 H), 7.23-7.32 (m, 5 H), 7.39 (t, j=7.8, 1 H), 7.48-7.52 (m, 3H), 7.86-7.90 (m, 1 H), 8.20-8.23 (m, 2H). $^{13}$C-NMR (60 MHz, DMSO-d); δ=113.2, 118.6, 120.9, 121.7, 122.2, 122.6, 125.0, 126.0, 126.2, 126.6, 127.0, 128.1, 129.3, 134.4, 139.1, 139.6, 141.4, 147.6. Further, a chart of $^1$H-NMR is shown in FIG. 22. Also, a chart of an enlarged portion of FIG. 22 in the range of 6.5 ppm to 8.5 ppm is shown in FIG. 23. A chart of $^1$C-NMR is shown in FIG. 24.

[Step 2]

Next, a method for synthesizing 3-[N-(4-diphenylaminophenyl)-N-(1-naphthyl)amino]-9-phenylcarbazole (abbreviation: PCzTPN1) will be described. A synthetic scheme of 3-[N-(4-diphenylaminophenyl)-N-(1-naphthyl)amino]-9-phenylcarbazole (abbreviation: PCzTPN1) is shown in (A-9).

(A-9)

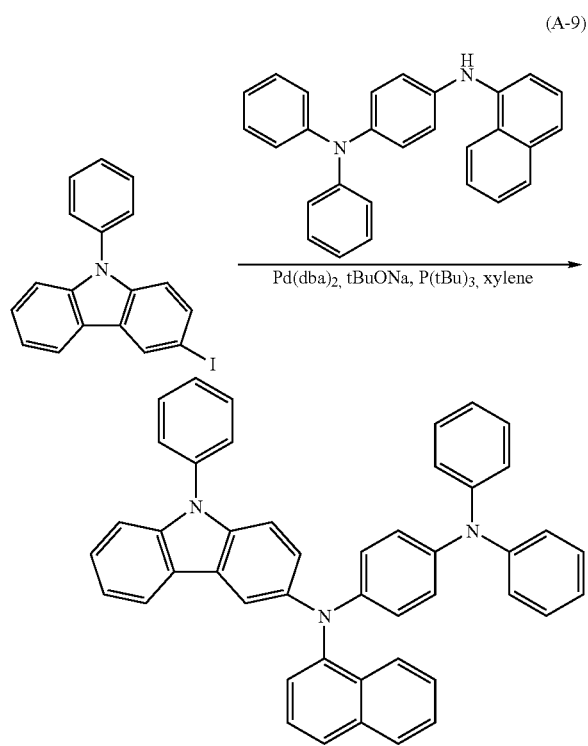

Figure 25:
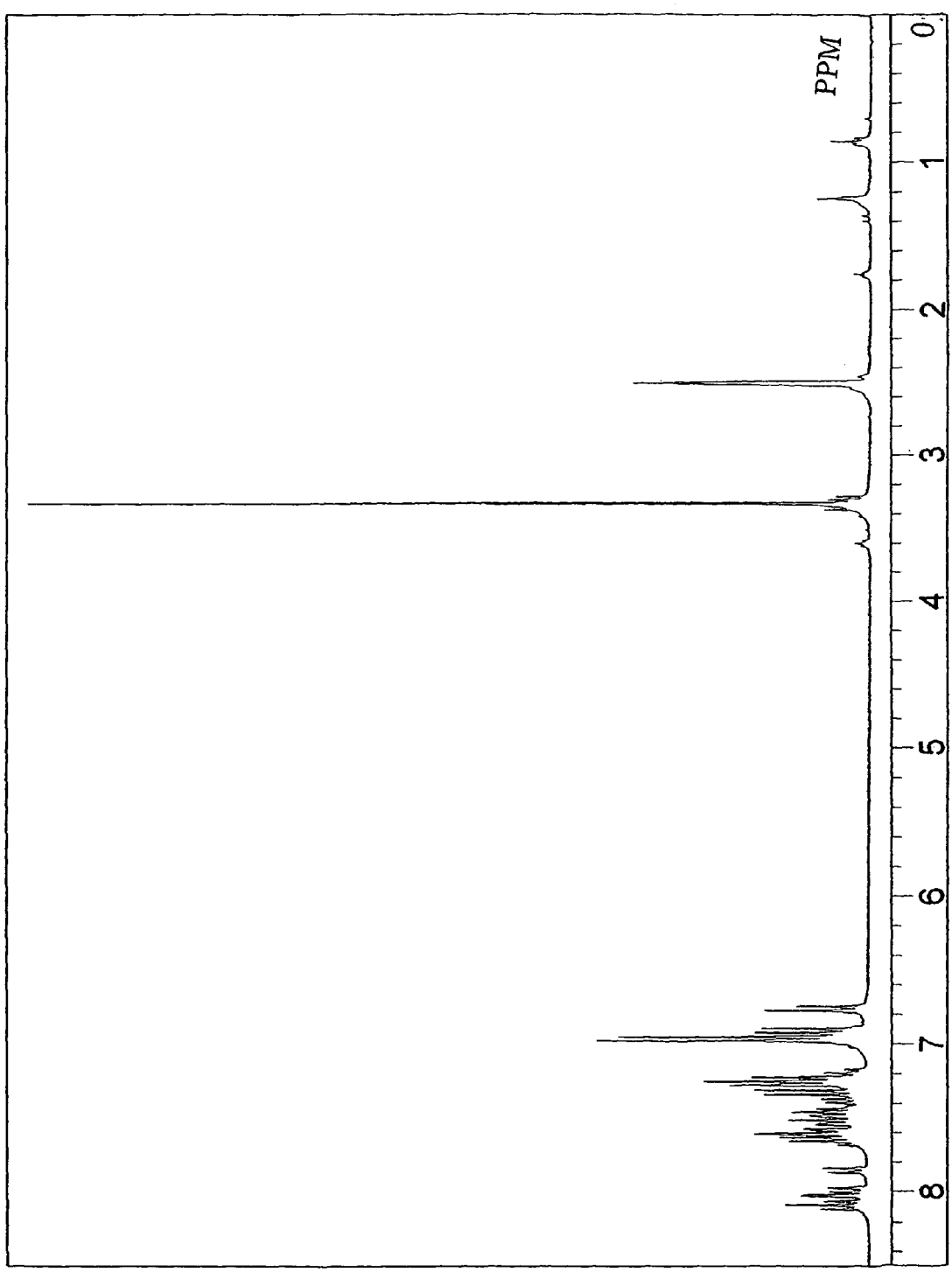
FIG. 25 shows a $^1$H-NMR chart of 3-[N-(4-diphenylaminophenyl)-N-(1-naphthyl)amino]-9-phenylcarbazole.
Figure 26:
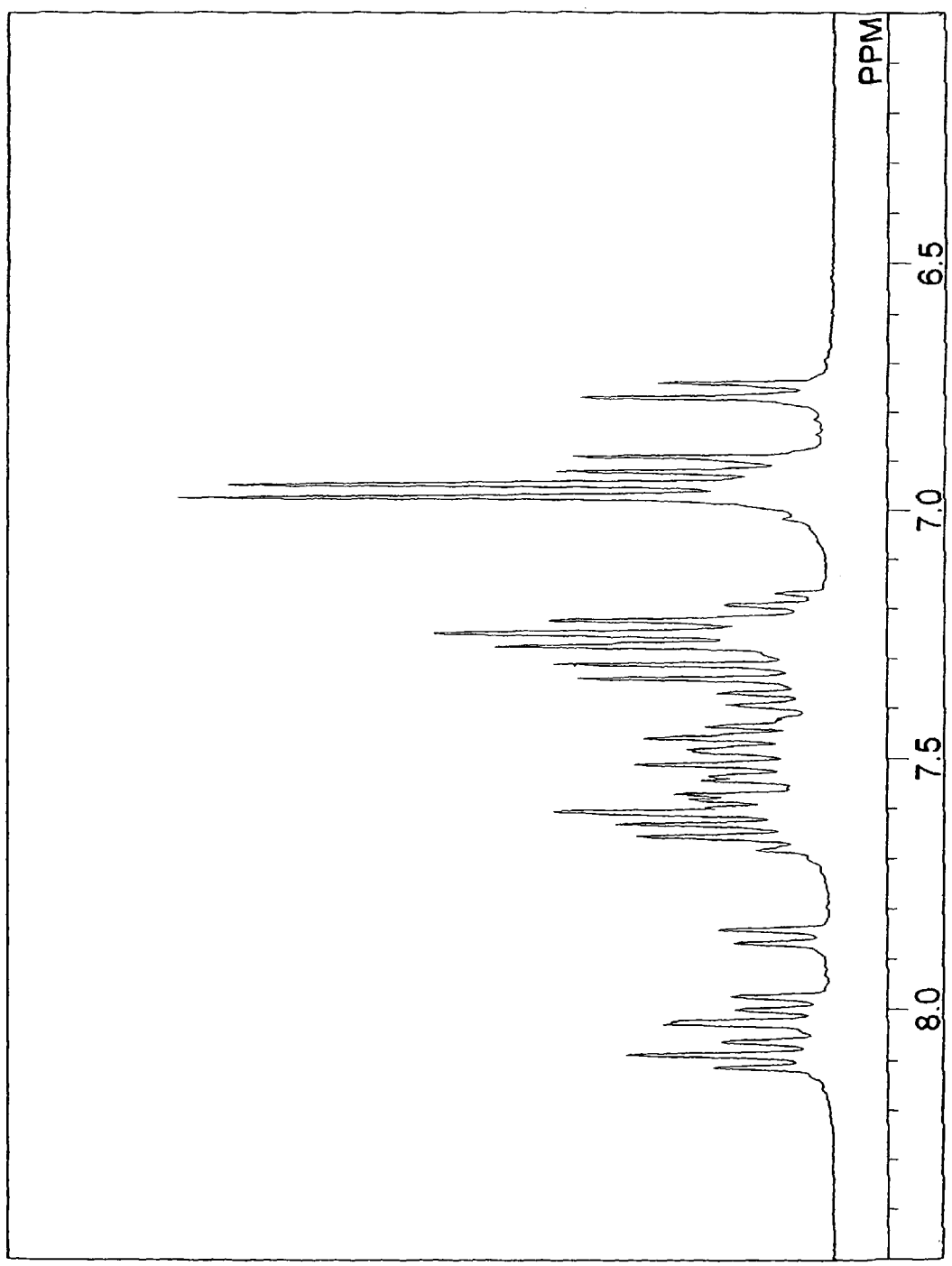
FIG. 26 shows a $^1$H-NMR chart of 3-[N-(4-diphenylaminophenyl)-N-(1-naphthyl)amino]-9-phenylcarbazole.

Specifically, 740 mg (2.0 mmol) of 3-iodine-9-phenylcarbazole, 700 mg (1.8 mmol) of N-(4-diphenylaminophenyl)-N-(1-naphthyl) amine, 12 mg (0.02 mmol) of bis(dibenzylidene acetone) palladium, and 600 mg (6.0 mmol) of sodium tert-butoxide were mixed in a flask. After nitrogen was substituted for air in the flask, 5 ml of dehydrated xylene was added to the mixture and degasification was performed for 3 minutes. Subsequently, 0.1 ml (0.05 mmol) of tri-tert-butyl phosphine (a 10 wt % hexane solution) was added to the mixture. The mixture was stirred, while heating at 90° C., for 5.5 hours under nitrogen atmosphere. Further, about 100 ml of toluene was added to the mixture, and then the mixture was filtered through florisil, alumina and celite. The thus obtained filtrate was washed with water and saturated saline. Magnesium sulfate was added to these organic layers and then dried. The product was filtered and the filtrate was concentrated. A subject solution was taken out from the concentrated filtrate by a silica gel column chromatography (toluene:hexane=3: 7). The thus obtained subject solution was concentrated and added with hexane. The product was applied with supersonic. Afterwards, the resultant was filtered to obtain a solid that was 500 mg of a yellow powder of PCzTPN1. The yield was 44%. The NMR data is shown below. The $^1$H-NMR (300 MHz, DMSO-d); δ=6.74 (d, j=8.7, 2H), 6.88-7.00 (m, 8H), 7.16-7.67 (m, 23H), 7.84 (d, j=8.4, 1H), 7.97 (d, j=8.1, 1H), 8.02 (s, 1H), 8.08 (t, j=7.8, 2H). Further, a chart of $^1$H-NMR is shown in FIG. 25. Also, a chart of an enlarged portion of FIG. 25 in the range of 6.0 ppm to 8.5 ppm is shown in FIG. 26.

The thermogravimetry-differential thermal analysis (TG-DTA) of the thus-obtained PCzTPN1 was performed. Furthermore, by utilizing a thermo-gravimetric/differential thermal analyzer (TG/DTA 320, Seiko Instruments Inc.), thermophysical properties were measured at the temperature rising velocity of 10° C./min under nitrogen atmosphere. As a result, because of the gravity-temperature relation (thermogravimetric measurement), the temperature by which the gravity becomes 95% or less of the gravity at the start of the measurement was 380° C. under normal pressure.

[Embodiment 6]

A method for synthesizing a carbazole derivative used in the present invention will be described in Embodiment 6. In this embodiment, a method for synthesizing 3,6-bis[N-(4-diphenylaminophenyl)-N-(1-naphthyl)amino]-9-phenylcarbazole (abbreviation: PCzTPN2), which is represented by a structural formula (61), will be described.

(61)

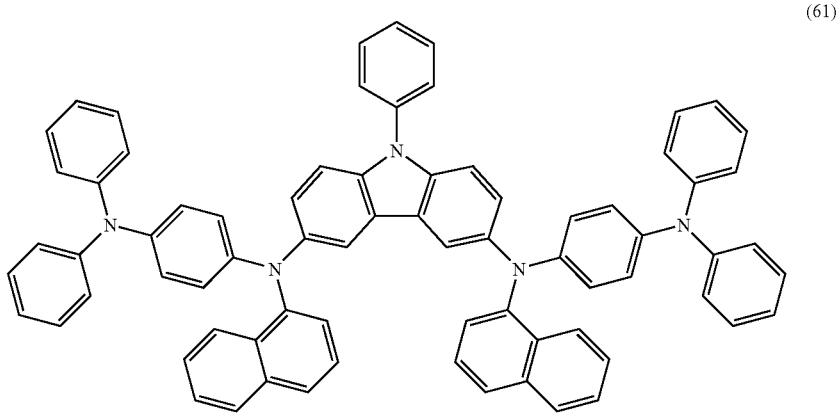 [SMILES: c1ccc(N(c2ccccc2)c2ccc(N(c3ccc4c(c3)c3cc(N(c5ccc(N(c6ccccc6)c6ccccc6)cc5)c5cccc6ccccc56)ccc3n4-c3ccccc3)c3cccc4ccccc34)cc2)cc1]

[Step 1]

A synthetic scheme of 3,6-bis[N-(4-diphenylaminophenyl)-N-(1-naphthyl)amino]-9-phenylcarbazole (abbreviation: PCzTPN2) is shown in (A-10).

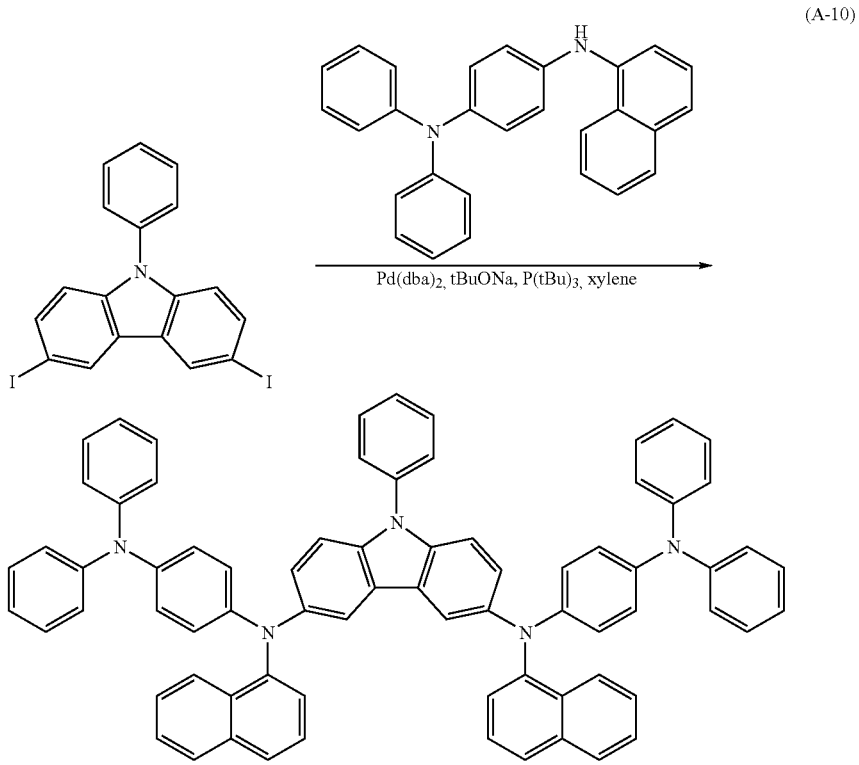

(A-10)

Figure 27:
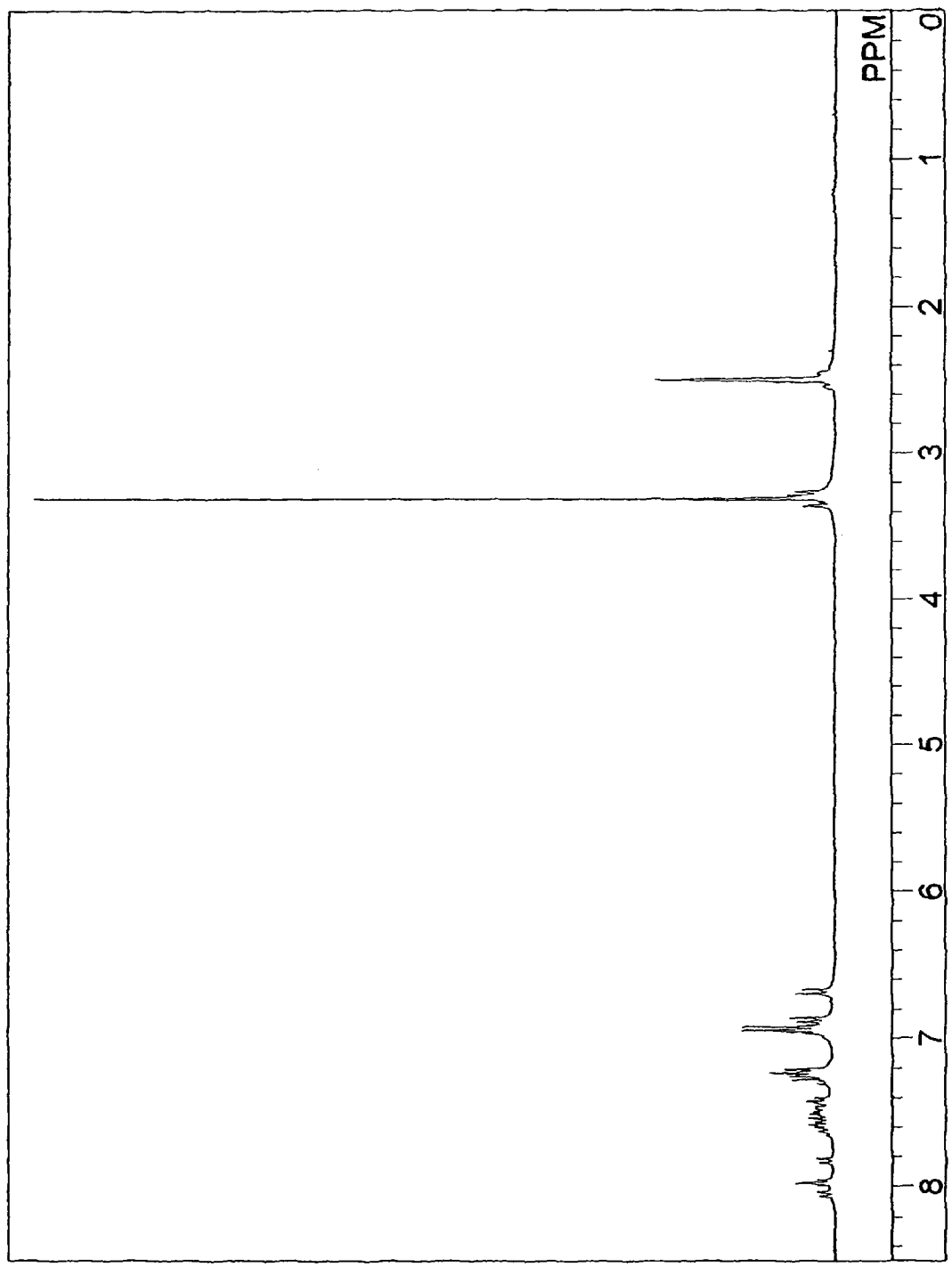
FIG. 27 shows a $^1$H-NMR chart of 3,6-bis[N-(4-diphenylaminophenyl)-N-(1-naphthyl)amino]-9-phenylcarbazole.
Figure 28:
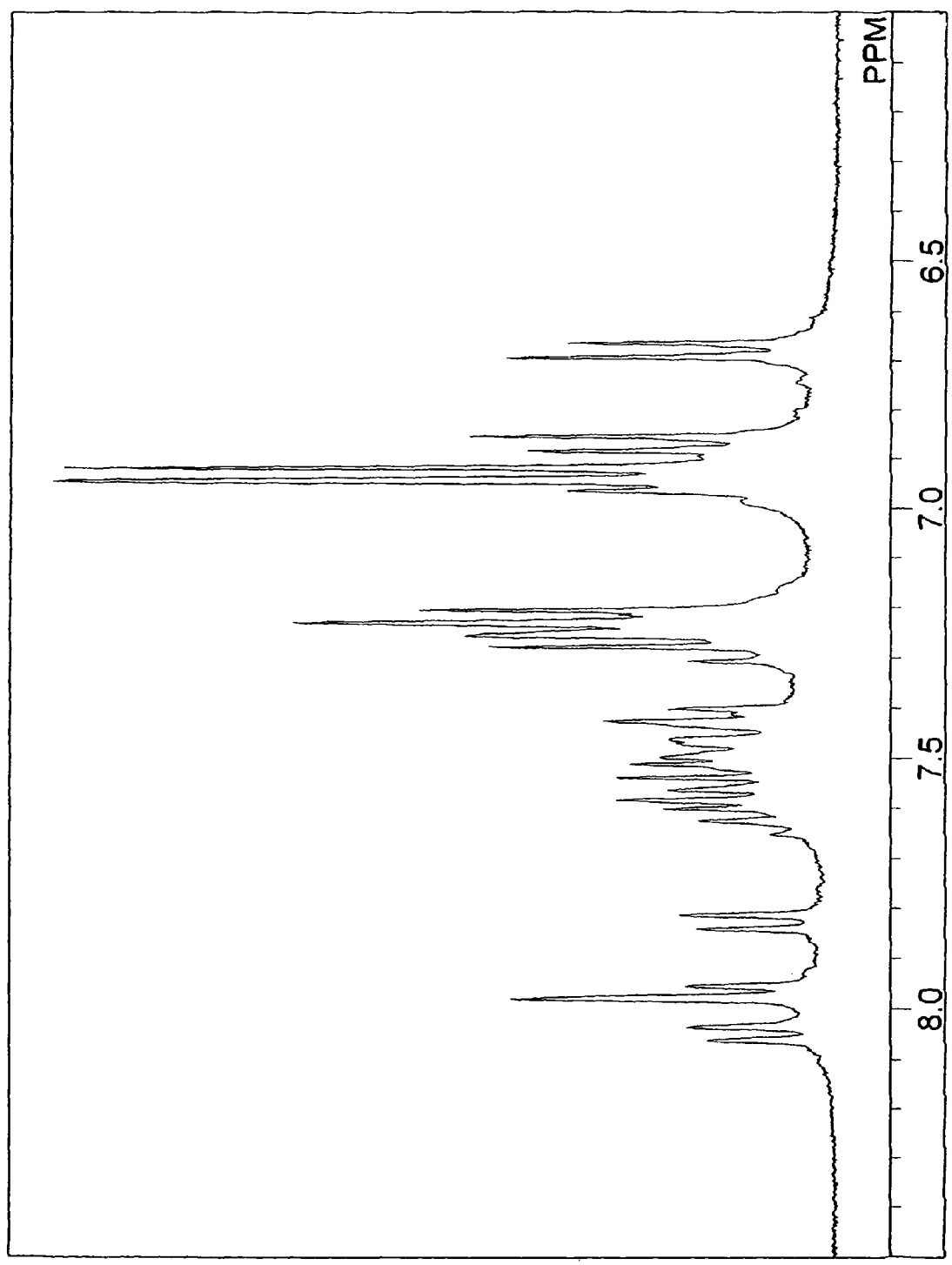
FIG. 28 shows a $^1$H-NMR chart of 3,6-bis[N-(4-diphenylaminophenyl)-N-(1-naphthyl)amino]-9-phenylcarbazole.

Specifically, 740 mg (1.5 mmol) of 3,6-diiodo-9-phenylcarbazole, 1.2 g (3 mmol) of N-(4-diphenylaminophenyl)-N-(1-naphthyl) amine, 18 mg (0.03 mmol) of bis(dibenzylidene acetone) palladium, and 1.0 g (10 mmol) of sodium tert-butoxide were mixed in a flask. After nitrogen was substituted for air in the flask, 7.5 ml of dehydrated xylene was added to the mixture and degasification was performed for 3 minutes. Then, 0.2 ml (0.1 mmol) of tri-tert-butyl phosphine (a 10 wt % hexane solution) was added to the mixture. The mixture was stirred, while heating at 90° C., for 7 hours under nitrogen atmosphere. Further, about 300 ml of toluene was added to the mixture, and then the mixture was filtered through florisil, alumina and celite. The thus obtained filtrate was washed with water and saturated saline. Magnesium sulfate was added to these organic layers and then dried. The product was filtered and the filtrate was concentrated. A subject solution was taken out from the concentrated filtrate by a silica gel column chromatography (toluene:hexane=3:7). The thus obtained subject solution was concentrated and added with hexane. The product was applied with supersonic, and then filtered to obtain a solid of 1.0 mg of a yellow powder of PCzTPN2. The yield was 66%. The NMR data is shown below. The $^1$H-NMR (300 MHz, DMSO-d); δ=6.68 (d, j=9.0, 4H), 6.86-6.97 (m, 16H), 7.20-6.97 (m, 16H), 7.20-7.65 (m, 25H), 7.83 (d, j=8.1, 2H), 7.95-7.98 (m, 4H), 8.05 (d, j=8.4, 2H). Further, a chart of $^1$H-NMR is shown in FIG. 27. Also, a chart of an enlarged portion of FIG. 27 in the range of 6.0 ppm to 8.5 pp is shown in FIG. 28.

The thermogravimetry-differential thermal analysis (TG-DTA) of the thus-obtained PCzTPN2 was performed. Furthermore, by utilizing a thermo-gravimetric/differential thermal analyzer (TG/DTA 320, Seiko Instruments Inc.), thermophysical properties were measured at the temperature rising velocity of 10° C./min under nitrogen atmosphere. As a result, because of the gravity-temperature relation (thermogravimetric measurement), the temperature by which the gravity becomes 95% or less of the gravity at the start of the measurement was 470° C. under normal pressure.

[Embodiment 7]

A specific example of a layer containing a carbazole derivative represented by the general formula (1) and an inorganic compound exhibiting an electron accepting property with respect to the carbazole derivative will be described in Embodiment 7. As the carbazole derivative, 3-[N-(4-diphenylaminophenyl)-N-phenylamino]-9-phenylcarbazole (abbreviation: PCzDPA1) represented by the structural formula (28), which was synthesized in Embodiment 1, was used. As the inorganic compound, molybdenum oxide was used.

A glass substrate was fixed to a substrate holder inside of a vacuum evaporation apparatus. Then, PCzDPA1 and molybdenum oxide (VI) were independently provided in separate evaporation sources of a resistance heating type, and a layer containing PCzDPA1 and molybdenum oxide was formed by co-evaporation of PCzDPA1 and molybdenum oxide while air in the vacuum evaporation apparatus was evacuated. In this case, the co-evaporation of PCzDPA1 and molybdenum oxide was performed such that the PCzDPA1-molybdenum oxide mass ratio was 4:1. Therefore, the molar ratio between the PCzDPA1 and the molybdenum oxide was 1.0:1.0. Further, the thickness of the film containing PCzDPA1 and molybdenum oxide was set to be 90 nm.

Figure 19:
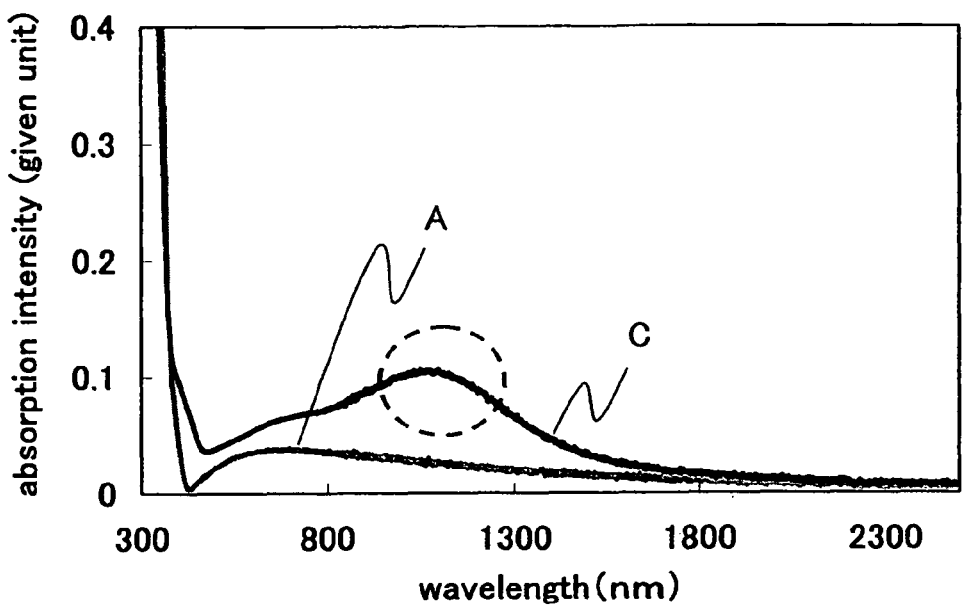
FIG. 19 is a graph showing absorption spectrum of a mixed film containing 3-[N-(4-diphenylaminophenyl)-N-phenylamino]-9-phenylcarbazole and molybdenum oxide.

A measurement result of the absorption spectrum of the thus obtained mixed film containing PCzDPA1 and molybdenum oxide is shown as a line C in FIG. 19. For comparison, the absorption spectrum of a film only containing PCzDPA1 (a line A) is also shown in FIG. 19. In FIG. 19, a perpendicular axis indicates the absorption intensity (given unit) while a horizontal axis indicates the wavelength (nm).

As shown in FIG. 19, the mixed film containing the PCzDPA1 and the molybdenum oxide represented by the line C exhibits a new type of absorption (circled by a dashed line in the drawing) that cannot be seen in the film only containing the PCzDPA1. This is because electrons are transported between PCzDPA1 and molybdenum oxide, and it is thought that the molybdenum oxide accepts the electrons from PCzDPA1 and holes are generated in PCzDPA1.

Consequently, in the mixed film containing PCzDPA1 and molybdenum oxide formed in this embodiment, carriers are internally generated, and hence, the driving voltage of a light emitting element can be reduced.

[Embodiment 8]

A specific example of a layer containing a carbazole derivative represented by the general formula (1) and an inorganic compound exhibiting an electron accepting property with respect to the carbazole derivative will be described in Embodiment 8. As the carbazole derivative, 4-[N-(4-diphenylaminophenyl)-(1-naphthyl)amino]-9-phenylcarbazole (abbreviation: PCzTPN1) represented by the general formula (33), which was synthesized in Embodiment 5, was used. As the inorganic compound, molybdenum oxide was used.

A glass substrate was fixed to a substrate holder inside of a vacuum evaporation apparatus. Then, PCzTPN1 and molybdenum oxide (VI) were independently provided in separate evaporation sources of a resistance heating type, and a layer containing PCzTPN1 and molybdenum oxide was formed by co-evaporation of PCzTPN1 and molybdenum oxide while air in the vacuum evaporation apparatus was evacuated. In this case, the co-evaporation of PCzTPN1 and molybdenum oxide was performed such that the PCzTPN1-molybdenum oxide mass ratio was 4:1. Therefore, the molar ratio between the PCzTPN1 and the molybdenum oxide was 1.0:1.1. Further, the thickness of the film containing PCzTPN1 and molybdenum oxide was set to be 100 nm.

Figure 20:
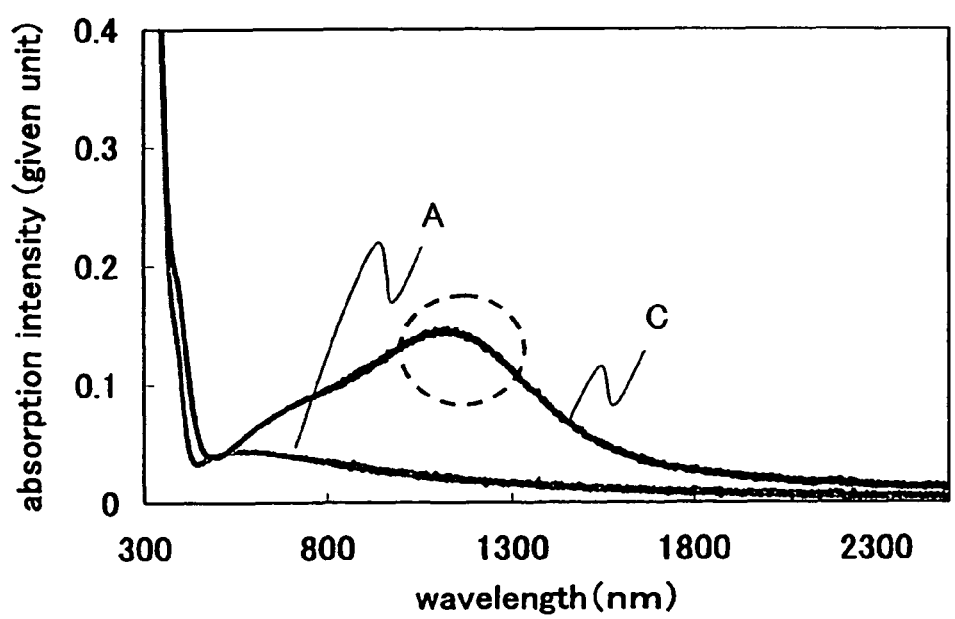
FIG. 20 is a graph showing absorption spectrum of a mixed film containing 3-[N-(4-diphenylaminophenyl)-N-(1-naphthyl)amino]-9-phenylcarbazole and molybdenum oxide.

A measurement result of the absorption spectrum of the thus obtained mixed film containing PCzTPN1 and molybdenum oxide is shown as a line C in FIG. 20. For comparison, the absorption spectrum of a film only containing PCzTPN1 (a line A) is also shown in FIG. 20. In FIG. 20, a perpendicular axis indicates the absorption intensity (given unit) while a horizontal axis indicates the wavelength (nm).

As shown in FIG. 20, the film containing the PCzTPN1 and the molybdenum oxide represented by the line C exhibits a new type of absorption (circled by a dashed line in the drawing) that cannot be seen in the film only containing the PCzTPN1. This is because electrons are transported between PCzTPN1 and molybdenum oxide, and it is thought that the molybdenum oxide accepts the electrons from PCzTPN1 and holes are generated in the PCzTPN1.

As a result, in the mixed film containing PCzTPN1 and molybdenum oxide formed in this embodiment, carriers are internally generated, and hence, the driving voltage of a light emitting element can be reduced.

[Embodiment 9]

A specific example of a layer containing a carbazole derivative represented by the general formula (1) and an inorganic compound exhibiting an electron accepting property with respect to the carbazole derivative will be described in Embodiment 9. As the carbazole derivative, 3,6-bis[N-(4-diphenylaminophenyl)-N-phenylamino]-9-phenylcarbazole (abbreviation: PCzTPN2) represented by the structural formula (61), which was synthesized in Embodiment 6, was used. As the inorganic compound, molybdenum oxide was used.

A glass substrate was fixed to a substrate holder inside of a vacuum evaporation apparatus. Then, PCzTPN2 and molybdenum oxide (VI) were independently provided in separate evaporation sources of a resistance heating type, and a layer containing PCzTPN2 and molybdenum oxide was formed by co-evaporation of PCzTPN2 and molybdenum oxide while air in the vacuum evaporation apparatus was evacuated. In this case, the co-evaporation of PCzTPN2 and molybdenum oxide was performed such that the PCzTPN2-molybdenum oxide mass ratio was 4:1. Therefore, the molar ratio between the PCzTPN2 and the molybdenum oxide was 1.0:1.8. Further, the thickness of the film containing PCzTPN2 and molybdenum oxide was set to be 110 nm.

Figure 21:
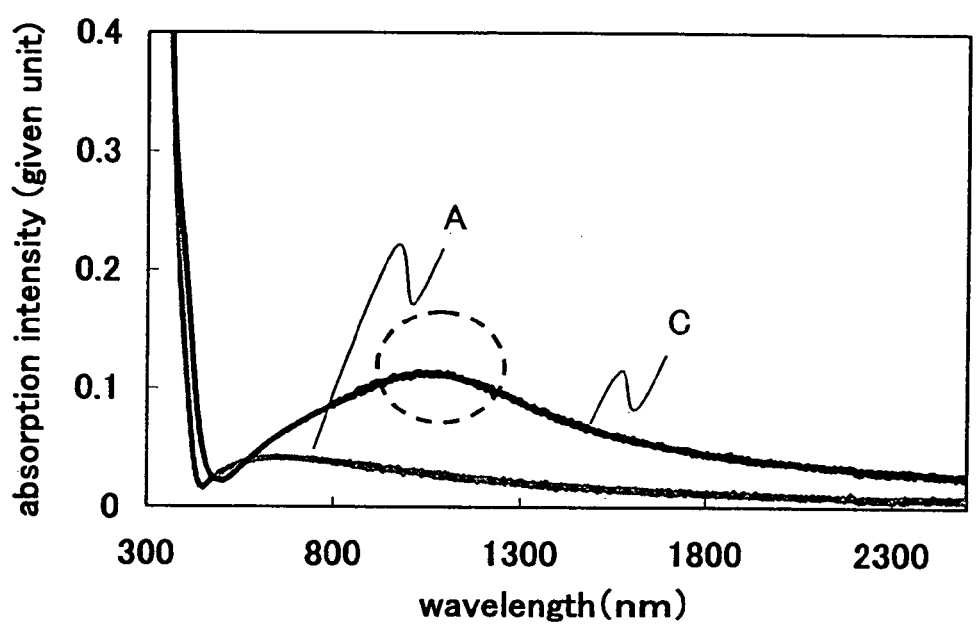
FIG. 21 is a graph showing absorption spectrum of a mixed film containing 3,6-bis[N-(4-diphenylaminophenyl)-N-(1-naphthyl)amino]-9-phenylcarbazole and molybdenum oxide.

A measurement result of the absorption spectrum of the thus obtained mixed film containing PCzTPN2 and molybdenum oxide is shown as a line C in FIG. 21. For comparison, the absorption spectrum of a film only containing PCzTPN2 (a line A) is also shown in FIG. 21. In FIG. 21, a perpendicular axis indicates the absorption intensity (given unit) while a horizontal axis indicates the wavelength (nm).

As shown in FIG. 21, the film containing the PCzTPN2 and the molybdenum oxide represented by the line C exhibits a new type of absorption (circled by a dashed line in the drawing) that cannot be seen in the film only containing the PCzTPN2. This is because the electrons are transported between PCzTPN2 and molybdenum oxide. It is thought that the molybdenum oxide accepts the electrons from PCzTPN2 and the holes are generated in PCzTPN2.

As a consequence, in the mixed film containing PCzTPN2 and molybdenum oxide formed in this embodiment, carriers are internally generated, and hence, the driving voltage of a light emitting element can be reduced.

[Embodiment 10]

Figure 35:
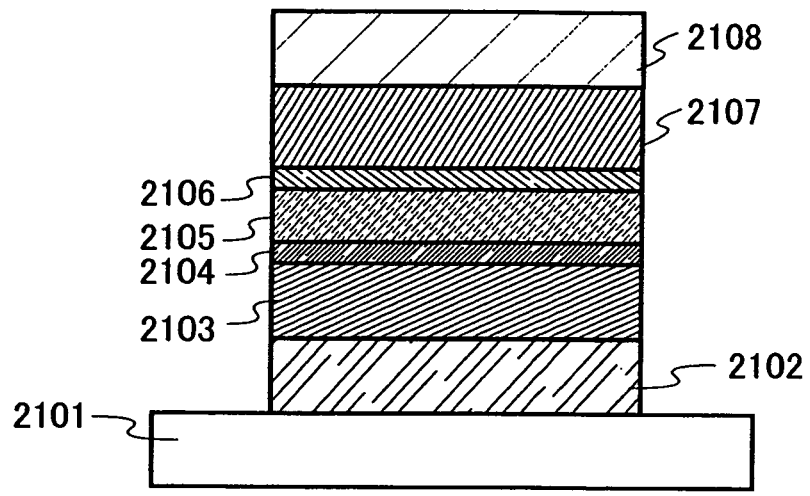
FIG. 35 is a graph explaining the light emitting element of Embodiment 10.

A light emitting element of the present invention will be described in detail with reference to FIG. 35.

A first electrode 2102 was formed over a glass substrate 2101 by sputtering using indium tin oxide containing silicon oxide. The thickness of the first electrode 2102 was set to be 110 nm. The area of the first electrode was set to be 2 mm×2 mm.

Next, the substrate over which the first electrode was provided was fixed to a substrate holder provided in a vacuum evaporation apparatus such that the first electrode was underlying the substrate. Then, the vacuum evaporation apparatus was evacuated and the pressure was reduced to about $10^{-4}$ Pa. Subsequently, a layer 2103 containing a composite material of the present invention was formed on the first electrode 2102 by co-evaporation of PCzPCN1 and molybdenum oxide (VI). The thickness of the layer 2103 containing the composite material of the present invention was set to be 50 nm. The PCzPCN1-molybdenum oxide (VI) mass ratio was adjusted to be 4:2. Further, the co-evaporation is an evaporation method by which evaporation is performed simultaneously from a plurality of evaporation sources in one chamber.

Next, a hole transporting layer 2104 was formed to have a thickness of 10 nm using NPB by evaporation with resistive heating.

Further, a light emitting layer 2105 was formed on the hole transporting layer 2104 to have a thickness of 40 nm by co-evaporation of $Alq_3$ and coumarin 6. The $Alq_3$-coumarin 6 mass ratio was adjusted to be 1:0.01. Consequently, coumarin 6 was dispersed in a layer including $Alq_3$.

Subsequently, an electron transporting layer 2106 was formed on the light emitting layer 2j̈heating.

Further, an electron injecting layer 2107 was formed on the electron transporting layer 2106 to have a thickness of 30 nm by co-evaporation of Alq$_3$ and lithium. The Alq$_3$-lithium mass ratio was adjusted to be 1:0.01. Consequently, lithium was dispersed in a layer including Alq$_3$.

Finally, a second electrode 2108 was formed on the electron injecting layer 2107 using aluminum to have a thickness of 200 nm by evaporation with resistive heating. Thus, the light emitting element of Embodiment 10 was manufactured.

Figure 29:
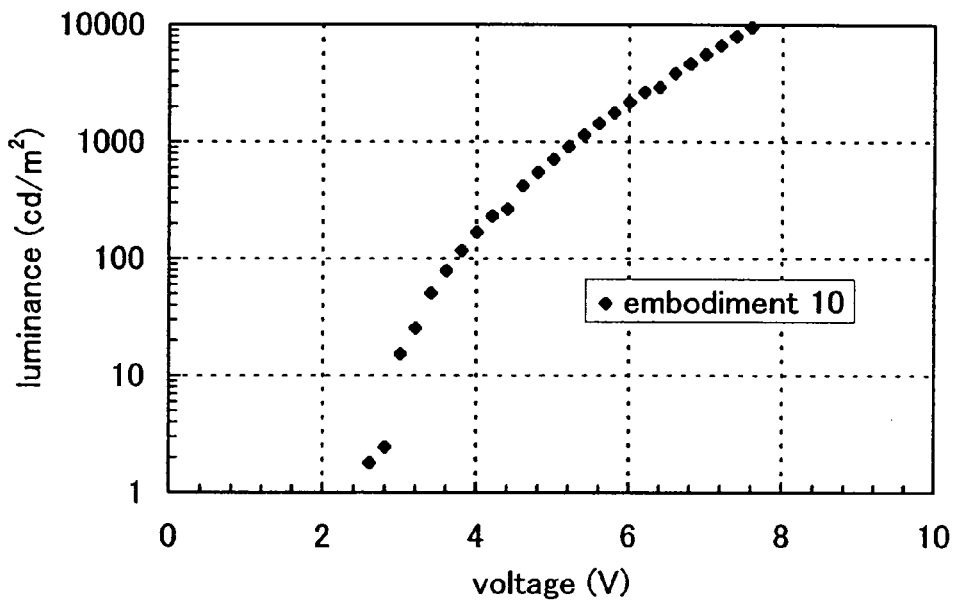
FIG. 29 is a graph showing a luminance-voltage characteristic of a light emitting element of Embodiment 10.
Figure 30:
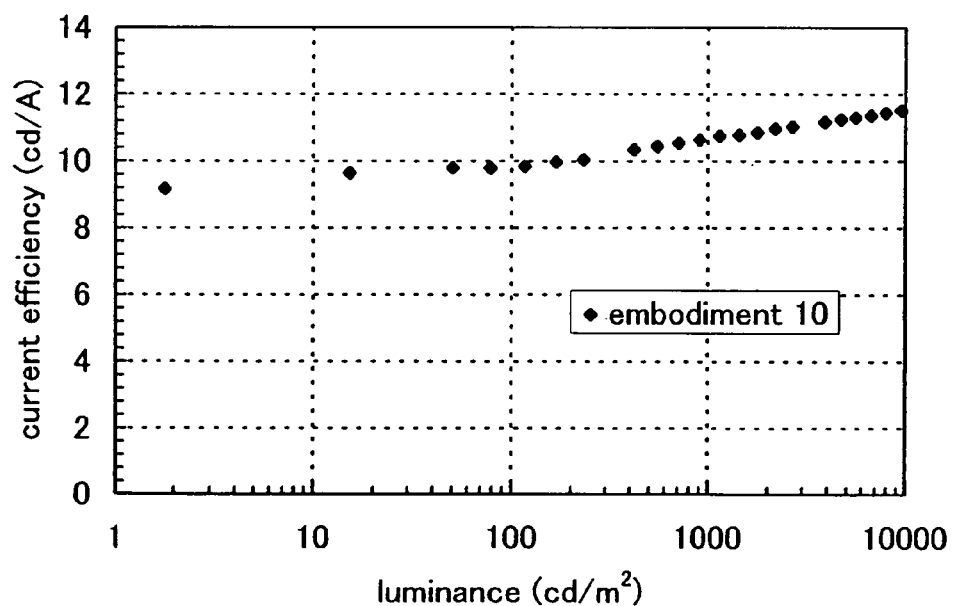
FIG. 30 is a graph showing a luminance-current efficiency characteristic of the light emitting element of Embodiment 10.
Figure 31:
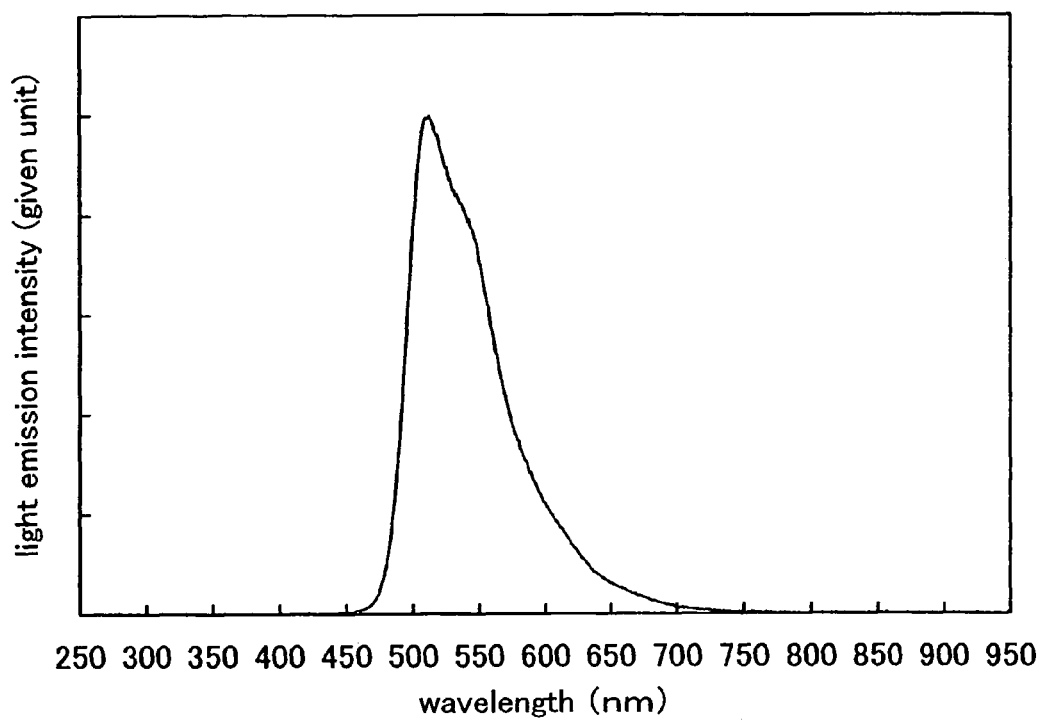
FIG. 31 is a graph showing light emission spectrum of the light emitting element of Embodiment 10.

A luminance-voltage characteristic of the light emitting element of Embodiment 10 is shown in FIG. 29. A current efficiency-luminance characteristic thereof is shown in FIG. 30. Also, a light emission spectrum upon feeding a current with 1 mA through the light emitting element is shown in FIG. 31. In the light emitting element of Embodiment 10, the voltage required for obtaining luminance of 903 cd/m was 5.2 V. The current flowing through the light emitting element in this case was 0.34 mA (the current density is 8.5 mA/cm$^2$). The CIE chromaticity coordinates were x=0.30, y=0.63. In addition, the current efficiency in this case was 10.6 cd/A.

As set forth above, the driving voltage of the light emitting element can be reduced by manufacturing a light emitting element using the composite material of the present invention.

[Embodiment 11]

Figure 36:
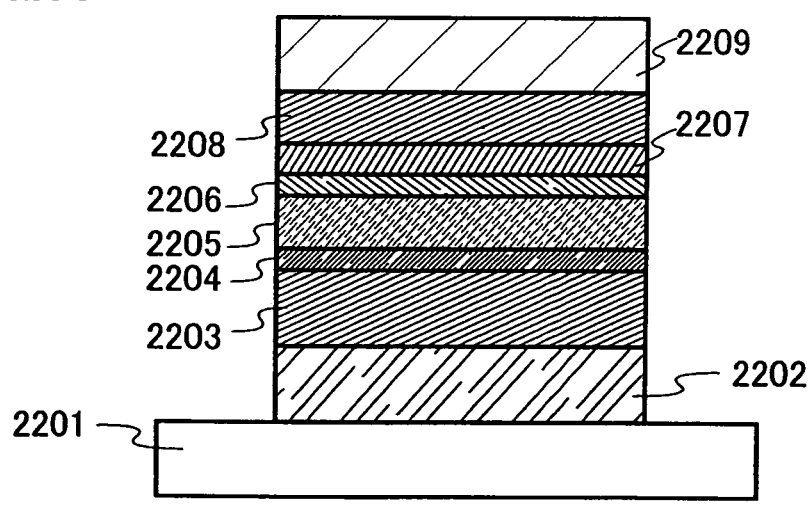
FIG. 36 is a graph explaining the light emitting element of Embodiment 11.

A light emitting element of the present invention will be described in detail with reference to FIG. 36.

A first electrode 2202 was formed over a glass substrate 2201 by sputtering using indium tin oxide containing silicon oxide. The thickness of the first electrode 2202 was set to be 110 nm. The area of the first electrode was set to be 2 mm×2 mm.

Next, the substrate over which the first electrode was provided was fixed to a substrate holder that was provided in a vacuum evaporation apparatus such that the first electrode was underlying the substrate. Then, the vacuum evaporation apparatus is evacuated and the pressure is reduced to about $10^{-4}$ Pa. Subsequently, a layer 2203 containing a composite material of the present invention was formed on the first electrode 2202 by co-evaporation of PCzPCN1 and molybdenum oxide (VI). The thickness of the layer 2203 containing the composite material of the present invention was set to be 50 nm. The PCzPCN1-molybdenum oxide (VI) mass ratio was adjusted to be 4:2. Further, the co-evaporation is an evaporation method by which evaporation is performed simultaneously from a plurality of evaporation sources in one chamber.

Next, a hole transporting layer 2204 was formed using NPB to have a thickness of 10 nm by evaporation with resistive heating.

Further, a light emitting layer 2205 was formed on the hole transporting layer 2204 to have a thickness of 40 nm by co-evaporation of Alq$_3$ and coumarin 6. The Alq$_3$-coumarin 6 mass ratio was adjusted to be 1:0.01. Therefore, coumarin 6 was, dispersed in the layer including Alq$_3$.

Subsequently, an electron transporting layer 2206 was formed on the light emitting layer 2205 using Alq$_3$ to have a thickness of 10 nm by evaporation with resistive heating.

Further, a layer 2207 containing a material with a donor level that generates electrons was formed on the electron transporting layer 2206 to have a thickness of 10 nm by co-evaporation of Alq$_3$ and lithium. The Alq$_3$-lithium mass ratio was adjusted to be 1:0.01. Therefore, lithium was dispersed in the layer including Alq$_3$.

A layer 2208 containing a composite material of the present invention was formed on the layer 2207 containing the material with the donor level that generates electrons by co-evaporation of PCzPCN1 and molybdenum oxide (VI). The thickness of the layer 2208 containing the composite material of the present invention was set to be 20 nm. The PCzPCN1-molybdenum oxide (VI) mass ratio was adjusted to be 4:2.

Finally, a second electrode 2209 was formed using aluminum on the layer 2208 containing the composite material of the present invention to have a thickness of 200 nm by evaporation with resistive heating. Thus, the light emitting element of Embodiment 11 was manufactured.

Figure 32:
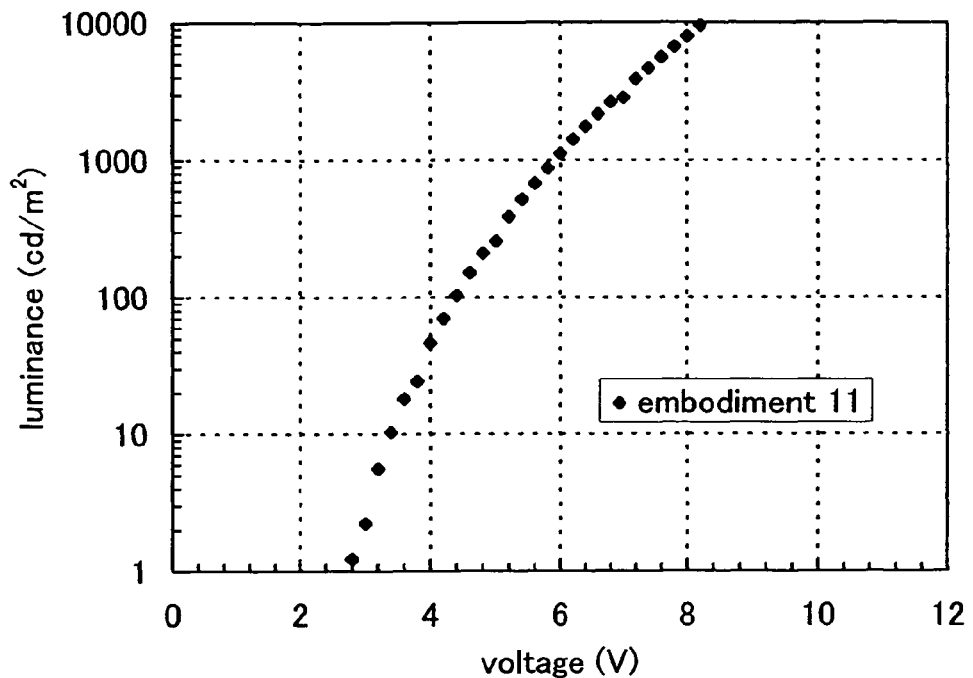
FIG. 32 is a graph showing a luminance-voltage characteristic of a light emitting element of Embodiment 11.
Figure 33:
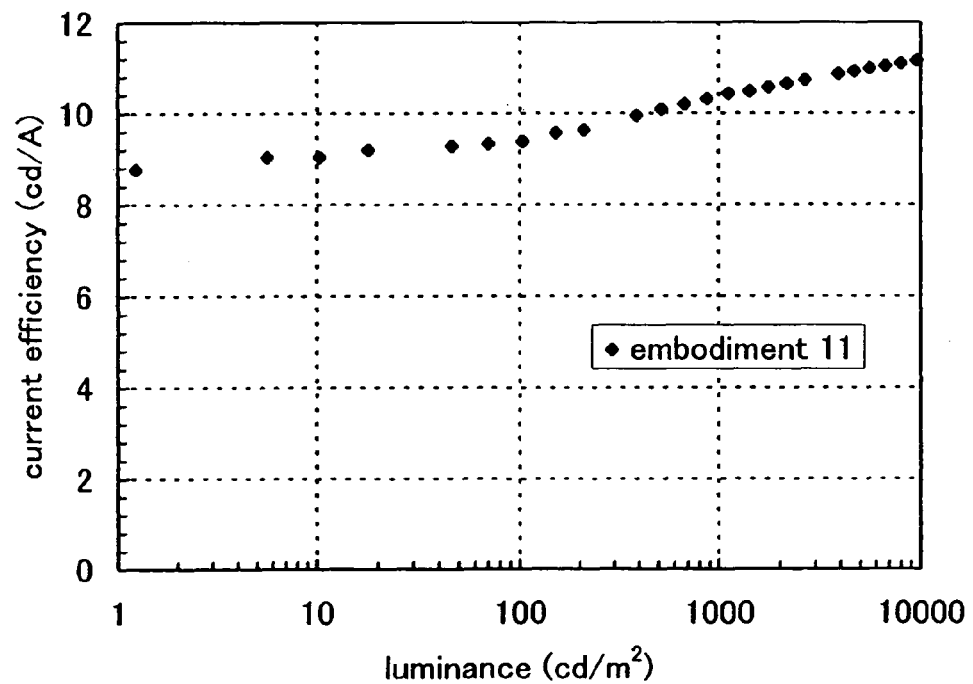
FIG. 33 is a graph showing a luminance-current efficiency characteristic of the light emitting element of Embodiment 11.
Figure 34:
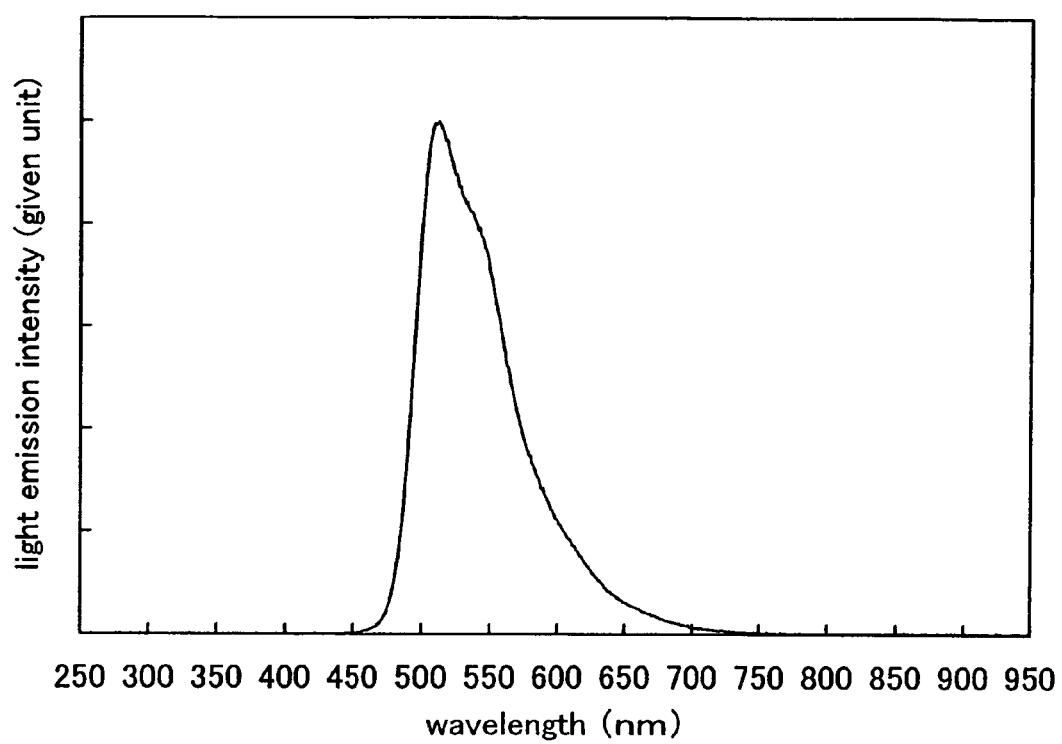
FIG. 34 is a graph showing light emission spectrum of the light emitting element of Embodiment 11.

A luminance-voltage characteristic of the light emitting element of Embodiment 11 is shown in FIG. 32. A current efficiency-luminance characteristic thereof is shown in FIG. 33. Also, a light emission spectrum upon feeding a current with 1 mA through the light emitting element is shown in FIG. 34. In the light emitting element of Embodiment 11, the voltage required for obtaining luminance of 1,112 cd/m$^2$ was 6.0 V. The current flowing through the light emitting element in this case was 0.42 mA (the current density is 10.7 mA/cm$^2$). The CIE chromaticity coordinate were x=0.30, y=0.63. In addition, the current efficiency in this case was 10.4 cd/A.

As set forth above, by manufacturing a light emitting element using a composite material of the present invention, the driving voltage of the light emitting element can be reduced.

DESCRIPTION OF REFERENCE NUMERALS

100: substrate, 101: first electrode, 102: second electrode, 103: layer containing a light emitting substance, 111: first layer, 112: second layer, 200: substrate, 201: first electrode, 202: second electrode, 203: layer containing a light emitting substance, 211: first layer, 212: second layer, 213: third layer, 214: fourth layer, 301: first electrode, 302: second electrode, 303: layer containing a light emitting substance, 311: first layer, 312: second layer, 313: third layer, 401: first electrode, 402: second electrode, 403: layer containing a light emitting substance, 411: first layer, 412: hole transporting layer, 413: light emitting layer, 414: electron transporting layer, 415: electron injecting layer, 601: source signal line driver circuit, 602: pixel portion, 603: gate signal line driver circuit, 604: sealing substrate, 605: sealing material, 607: space, 608: wiring, 609: FPC (flexible printed circuit), 610: element substrate, 611: switching TFT, 612: current controlling TFT, 613: first electrode, 614: insulator, 616: layer containing a light emitting substance, 617: second electrode, 618: light emitting element, 623: n-channel TFT, 624: p-channel TFT, 951: substrate, 952: electrode, 953: insulating layer, 953: lower side (insulating layer), 953: upper side (insulating layer), 954: partition wall layer, 955: layer containing a light emitting substance, 956: electrode, 2101: glass substrate, 2102: first electrode, 2103: layer containing a composite material, 2104: hole transporting layer, 2105: light emitting layer, 2106: electron transporting layer, 2107: electron injecting layer, 2108: second electrode, 2201: glass substrate, 2202: first electrode, 2203: layer containing a composite material, 2204: hole transporting layer, 2205: light emitting layer, 2206: electron transporting layer, 2207: layer containing a material having a donor level that generates electron, 2208: layer containing a composite material, 2209: second electrode, 9101: housing, 9102: supporting base, 9103: display portion, 9104: speaker portion, 9105: video input terminal, 9201: main body, 9202: housing, 9203: display portion, 9204: keyboard, 9205: external connection port, 9206: pointing mouse, 9301: main body, 9302: display portion, 9303: arm portion, 9401: main body, 9402:

housing, 9403: display portion, 9404: audio input portion, 9405: audio output portion, 9406: operation key, 9407: external connection port, 9408: antenna, 9501: main body, 9502: display portion, 9503: housing, 9504: external connection port, 9505: remote-control receiver, 9506: receiver, 9507: buttery, 9508: audio input portion, 9509: operation key, 9510: eyepiece portion

The invention claimed is:

1. A light emitting element comprising:
a layer between a pair of electrodes,
wherein the layer contains a carbazole derivative represented by a formula (1) and an inorganic compound exhibiting an electron accepting property with respect to the carbazole derivative:

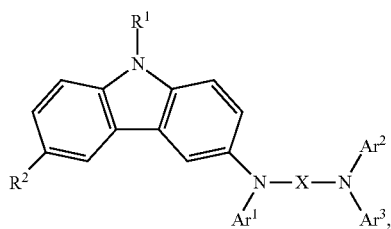

(1)

wherein $R^1$ represents any one of hydrogen, an alkyl group having 1 to 6 carbon atoms, an unsubstituted aryl group, a heteroaryl group having 5 to 9 carbon atoms, an arylalkyl group and an acyl group having 1 to 7 carbon atoms,
wherein $R^2$ is represented by a formula (2):

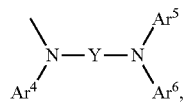

(2)

wherein $Ar^1$ to $Ar^6$ independently represent either an aryl group having 6 to 25 carbon atoms or a heteroaryl group having 5 to 9 carbon atoms,
wherein X and Y independently represent either a bivalent aromatic hydrocarbon group having 6 to 25 carbon atoms or a bivalent heterocyclic ring group having 5 to 10 carbon atoms,
wherein $Ar^1$, $Ar^2$, $Ar^3$ and X are the same as $Ar^4$, $Ar^5$, $Ar^6$, and Y, respectively, and
wherein the unsubstituted aryl group is selected from a phenyl group, a 4-biphenyl group, a 1-naphthyl group, a 2-naphthyl group, a 9-phenanthryl group, a 1-pyrenyl group, and a spiro-9,9'-bifluorene-2-yl group.

2. The light emitting element according to claim 1,
wherein the layer is in contact with one of the electrodes.

3. The light emitting element according to claim 1, further comprising:
a second layer on the layer, a third layer on the second layer, and a fourth layer on the third layer between the pair of electrodes,
wherein the second layer contains a light emitting substance,
wherein the third layer contains a material having a donor level that can generate an electron, and
wherein the fourth layer contains the carbazole derivative.

4. The light emitting element according to claim 1, wherein $R^1$ is any one of the phenyl group, the 4-biphenyl group, and the 1-naphthyl group.

5. A light emitting element comprising:
a layer between a pair of electrodes,
wherein the layer contains a carbazole derivative represented by a formula (3) and an inorganic compound exhibiting an electron accepting property with respect to the carbazole derivative:

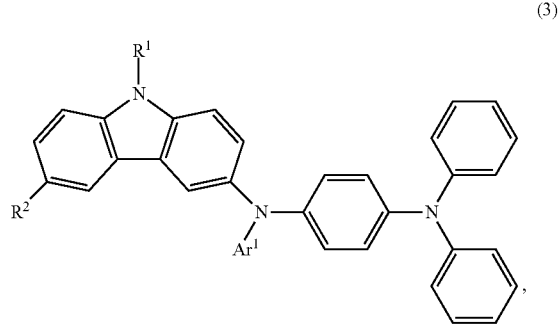

(3)

wherein $R^1$ represents any one of hydrogen, an alkyl group having 1 to 6 carbon atoms, an unsubstituted aryl group, a heteroaryl group having 5 to 9 carbon atoms, an arylalkyl group, and an acyl group having 1 to 7 carbon atoms,
wherein $R^2$ is represented by a formula (4):

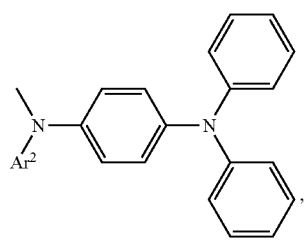

(4)

wherein $Ar^1$ and $Ar^2$ are the same as each other and represent an aryl group having 6 to 25 carbon atoms or a heteroaryl group having 5 to 9 carbon atoms, and
wherein the unsubstituted aryl group is selected from a phenyl group, a 4-biphenyl group, a 1-naphthyl group, a 2-naphthyl group, a 9-phenanthryl group, a 1-pyrenyl group, and a spiro-9,9'-bifluorene-2-yl group.

6. The light emitting element according to claim 5,
wherein the layer is in contact with one of the electrodes.

7. The light emitting element according to claim 5, further comprising:
a second layer on the layer, a third layer on the second layer and a fourth layer on the third layer between the pair of electrodes,
wherein the second layer contains a light emitting substance,
wherein the third layer contains a material having a donor level that can generate an electron, and
wherein the fourth layer contains the carbazole derivative.

8. The light emitting element according to claim 5, wherein $R^1$ is any one of the phenyl group, the 4-biphenyl group and the 1-naphthyl group.

9. A light emitting element comprising:
a layer between a pair of electrodes,
wherein the layer contains a carbazole derivative represented by a formula (5) and an inorganic compound exhibiting an electron accepting property with respect to the carbazole derivative:

(5)

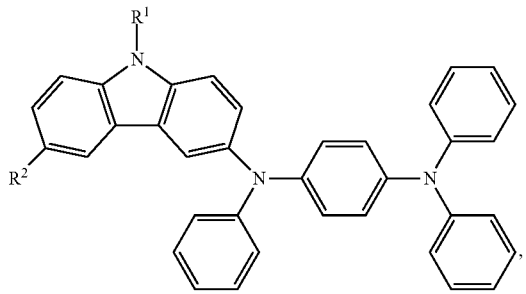

wherein $R^1$ represents any one of hydrogen, an alkyl group having 1 to 6 carbon atoms, an unsubstituted aryl group, a heteroaryl group having 5 to 9 carbon atoms, an arylalkyl group, and an acyl group having 1 to 7 carbon atoms,
wherein $R^2$ is represented by a formula (6):

(6)

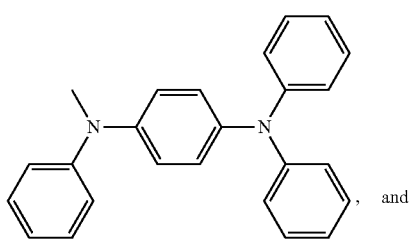, and wherein the unsubstituted aryl group is selected from a phenyl group, a 4-biphenyl group, a 1-naphthyl group, a 2-naphthyl group, a 9-phenanthryl group, a 1-pyrenyl group, and a spiro-9,9'-bifluorene-2-yl group.

10. The light emitting element according to claim 9, wherein the layer is in contact with one of the electrodes.

11. The light emitting element according to claim 9, further comprising:
a second layer on the layer, a third layer on the second layer, and a fourth layer on the third layer between the pair of electrodes,
wherein the second layer contains a light emitting substance,
wherein the third layer contains a material having a donor level that can generate an electron, and
wherein the fourth layer contains the carbazole derivative.

12. The light emitting element according to claim 9, wherein $R^1$ is any one of the phenyl group, the 4-biphenyl group, and the 1-naphthyl group.

13. A light emitting element comprising:
a layer between a pair of electrodes,
wherein the layer contains a carbazole derivative represented by a formula (103) and an inorganic compound exhibiting an electron accepting property with respect to the carbazole derivative:

(103)

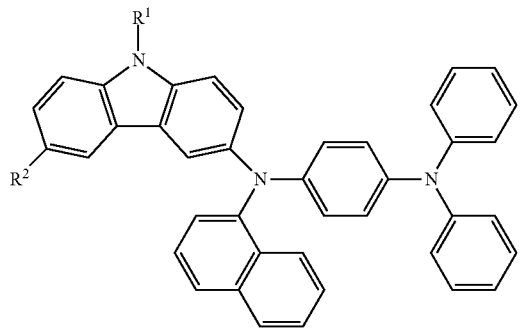

wherein $R^1$ represents any one of hydrogen, an alkyl group having 1 to 6 carbon atoms, an unsubstituted aryl group, a heteroaryl group having 5 to 9 carbon atoms, an arylalkyl group, and an acyl group having 1 to 7 carbon atoms,
wherein $R^2$ represents any one of hydrogen, an alkyl group having 1 to 6 carbon atoms, and a substituent represented by a structural formula (104):

(104)

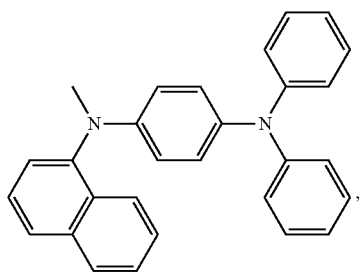

wherein the unsubstituted aryl group is selected from a phenyl group, a 4-biphenyl group, a 1-naphthyl group, a 2-naphthyl group, a 9-phenanthryl group, a 1-pyrenyl group, and a spiro-9,9'-bifluorene-2-yl group, and
wherein the carbazole derivative and the inorganic compound are mixed in the layer.

14. The light emitting element according to claim 13, wherein the layer is in contact with one of the electrodes.

15. The light emitting element according to claim 13, further comprising:
a second layer on the layer, a third layer on the second layer, and a fourth layer on the third layer between the pair of electrodes,
wherein the second layer contains a light emitting substance,
wherein the third layer contains a material having a donor level that can generate an electron, and
wherein the fourth layer contains the carbazole derivative.

16. The light emitting element according to claim 13, wherein $R^1$ is any one of the phenyl group, the 4-biphenyl group, and the 1-naphthyl group.

17. The light emitting element according to claim 13, wherein $R^2$ is hydrogen or a tert-butyl group.

18. The light emitting element according to claim 13, wherein $R^2$ represents the structural formula (104).

19. The light emitting element according to any one of claims 1, 5, 9, and 13, wherein the inorganic compound is oxide of transition metal.

20. The light emitting element according to any one of claims 1, 5, 9, and 13, wherein the inorganic compound is one or more kinds of titanium oxide, vanadium oxide, molybdenum oxide, tungsten oxide, rhenium oxide, ruthenium oxide, chromium oxide, zirconium oxide, hafnium oxide, tantalum oxide, and silver oxide.

21. A light emitting device comprising the light emitting element according to any one of claims 1, 5, 9, and 13.

* * * * *